(12) United States Patent
Shimomura et al.

(10) Patent No.: US 7,867,907 B2
(45) Date of Patent: Jan. 11, 2011

(54) METHOD FOR MANUFACTURING SEMICONDUCTOR DEVICE

(75) Inventors: Akihisa Shimomura, Kanagawa (JP); Hidekazu Miyairi, Kanagawa (JP); Yasuhiro Jinbo, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 611 days.

(21) Appl. No.: 11/869,951

(22) Filed: Oct. 10, 2007

(65) Prior Publication Data
US 2008/0087629 A1 Apr. 17, 2008

(30) Foreign Application Priority Data
Oct. 17, 2006 (JP) ............... 2006-282684

(51) Int. Cl.
*H01L 21/302* (2006.01)
*H01L 21/461* (2006.01)

(52) U.S. Cl. .......... 438/689; 216/94
(58) Field of Classification Search .......... 216/41, 216/43, 94; 438/689, 691; 430/5; 219/121.69
See application file for complete search history.

(56) References Cited

U.S. PATENT DOCUMENTS

| 4,842,677 | A | 6/1989 | Wojnarowski et al. |
| 4,861,964 | A | 8/1989 | Sinohara |
| 4,865,686 | A | 9/1989 | Sinohara |
| RE33,947 | E | 6/1992 | Shinohara |
| 5,708,252 | A | 1/1998 | Shinohara et al. |
| 6,149,988 | A | 11/2000 | Shinohara et al. |
| 6,261,856 | B1 | 7/2001 | Shinohara et al. |

FOREIGN PATENT DOCUMENTS

| JP | 63-84789 | | 4/1988 |
| JP | 9-152618 | | 6/1997 |
| JP | 11099582 A | * | 4/1999 |
| WO | WO 0028604 A1 | * | 5/2000 |

OTHER PUBLICATIONS

Office Action re Chinese application No. CN 200710185774.6, dated Mar. 1, 2010 (with English translation).

* cited by examiner

*Primary Examiner*—Roberts Culbert
(74) *Attorney, Agent, or Firm*—Husch Blackwell LLP Welsh Katz

(57) ABSTRACT

The present invention provides a method by which a thin film process can be conducted simply and accurately without using resist. Further, the present invention provides a method of manufacturing semiconductor devices at low cost. A first layer is formed over a substrate, a peeling layer is formed over the first layer, the peeling layer is selectively irradiated with a laser beam from the peeling layer side to reduce adhesiveness of a part of the peeling layer. Next, the peeling layer in the part with reduced adhesiveness is removed, and the left portion of the peeling layer is used as a mask to selectively etch the first layer.

14 Claims, 26 Drawing Sheets

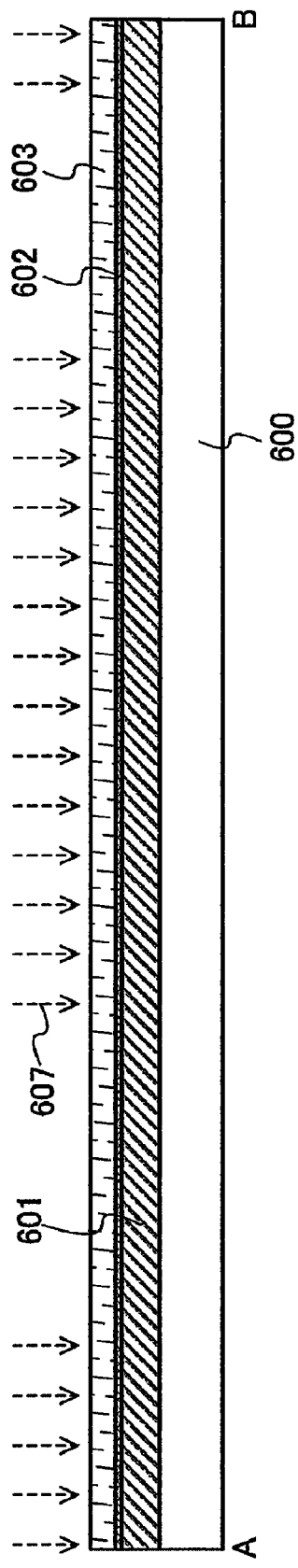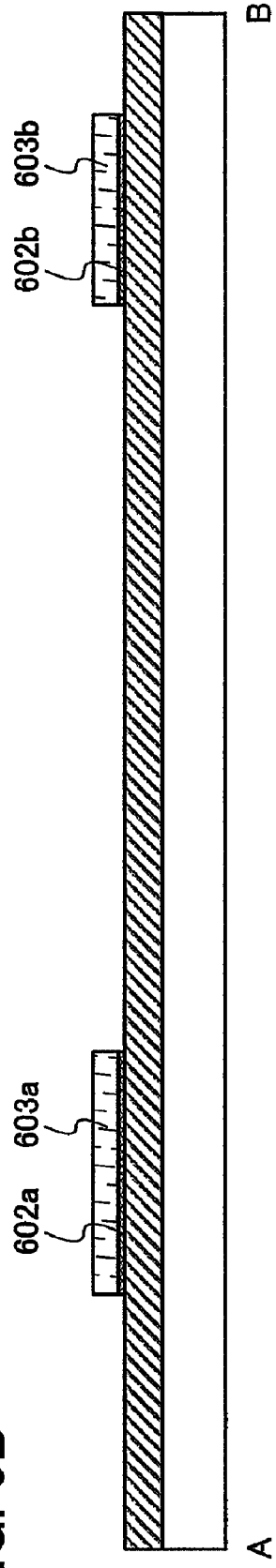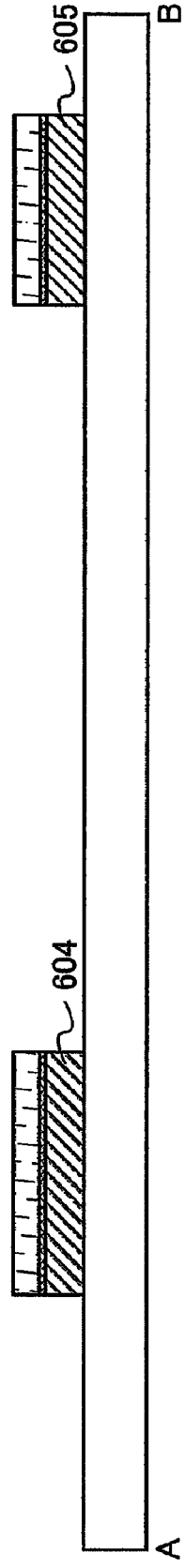

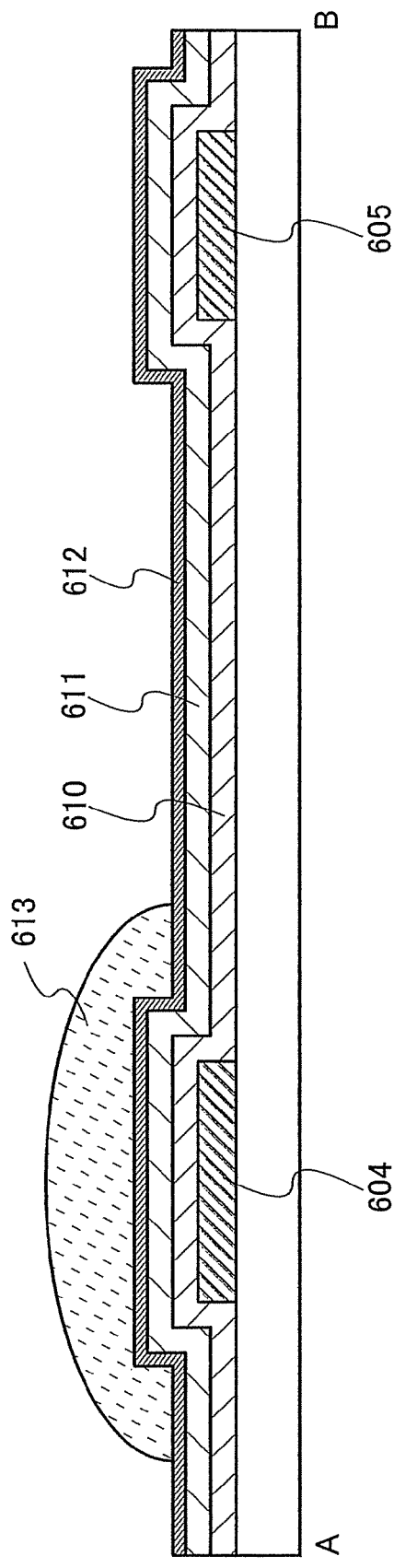
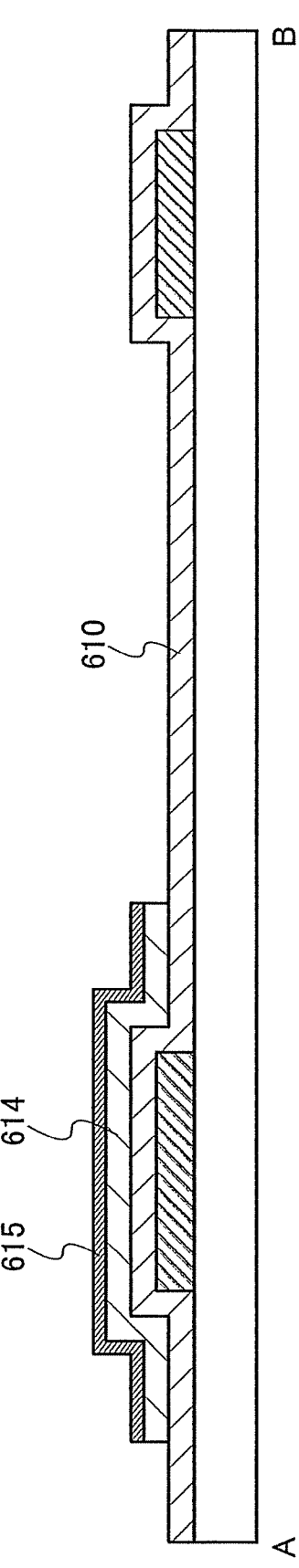

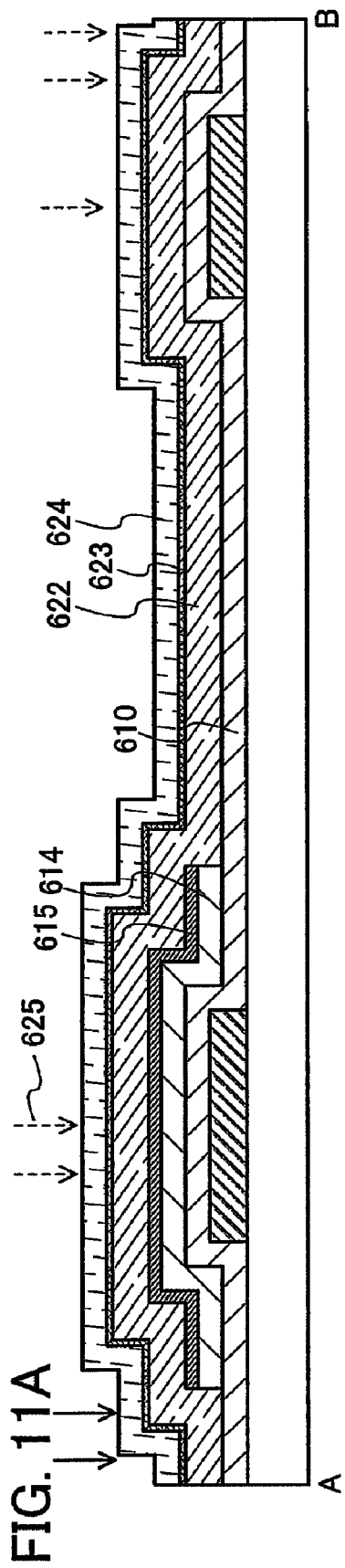
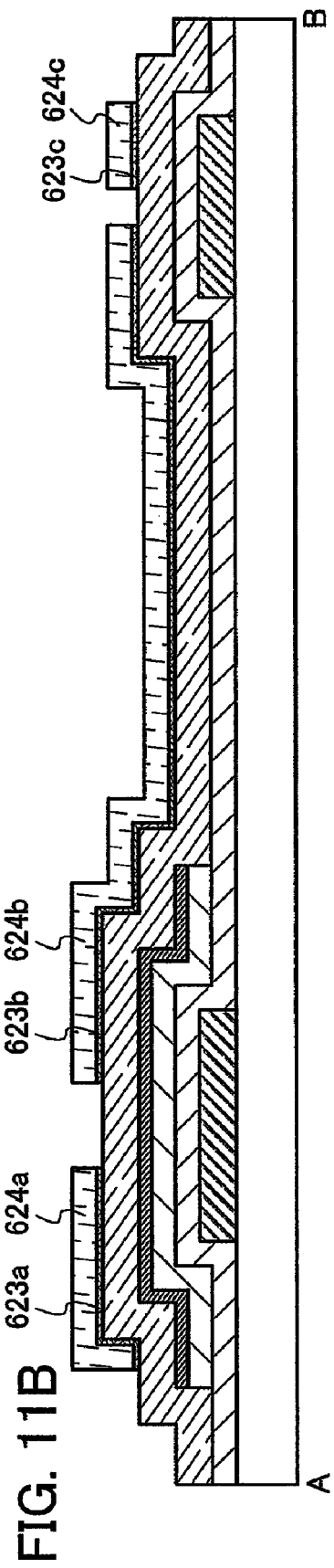
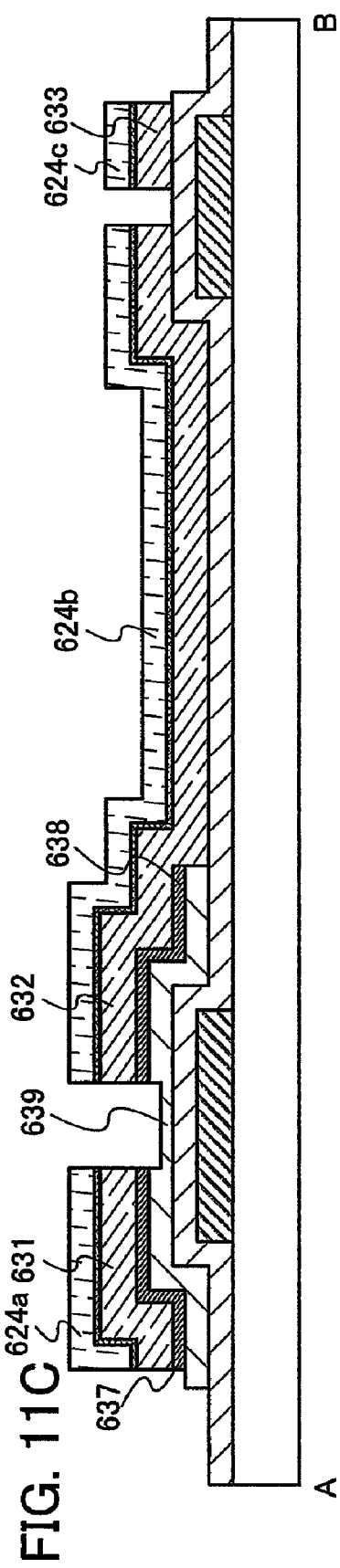

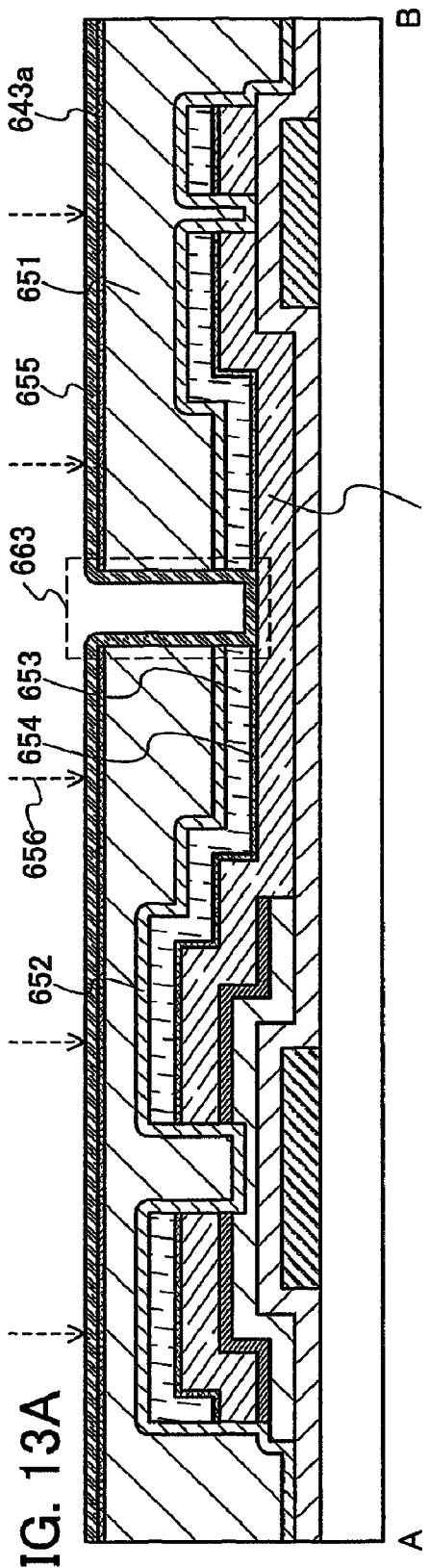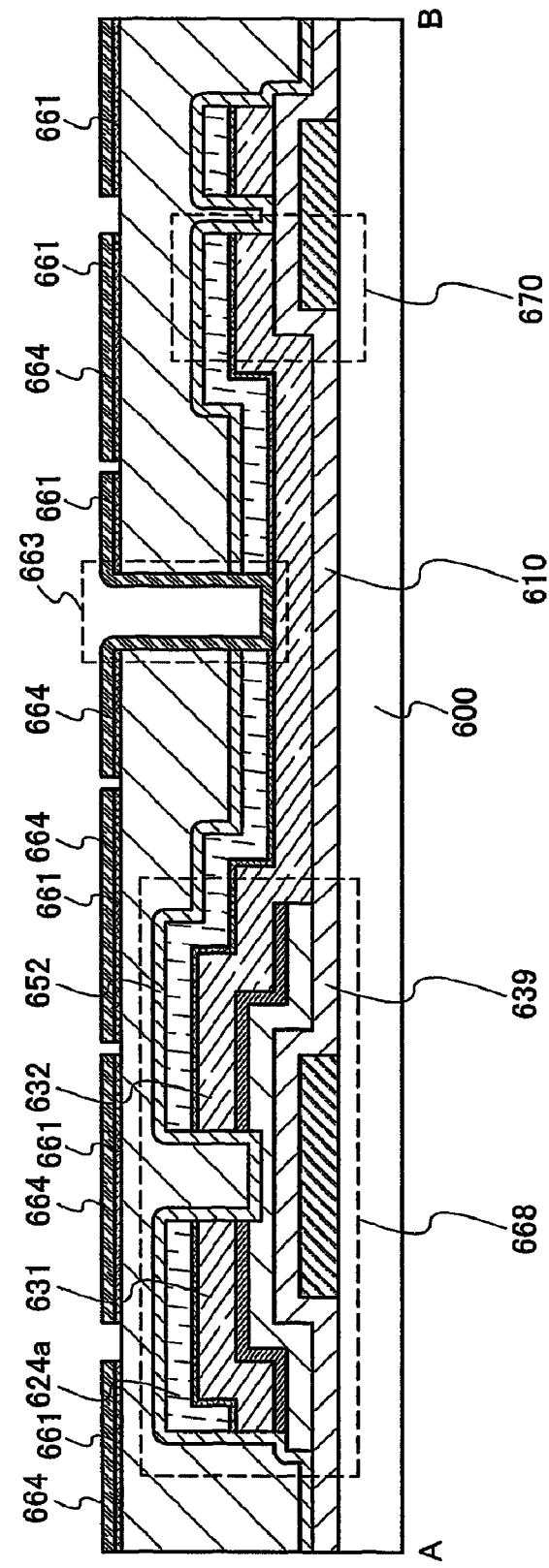

METHOD FOR MANUFACTURING SEMICONDUCTOR DEVICE

BACKGROUND OF THE INVENTION

1. Field of the Invention

The present invention relates to methods for manufacturing semiconductor devices having semiconductor elements.

2. Description of the Related Art

In a conventional manner, so-called active matrix driving type display panels or semiconductor integrated circuits which are constituted by semiconductor elements such as thin film transistors (hereinafter also referred to as TFTs) or MOS thin film transistors are manufactured by formation of a resist mask by a photolithography process using a photomask and a selective etching process of each thin film.

In the photolithography process, resist is applied to the entire surface of a substrate, pre-baked, and subjected to ultraviolet rays or the like through a photomask to expose a pattern of the photomask to light. The pattern is developed and washed with pure water to form a resist mask. Then, a thin film (a thin film formed of a semiconductor material, an insulator material, or a conductor material) except for portions which are to be serve as a semiconductor layer or wirings is etched using the resist mask as a mask to form the semiconductor layer or the wirings.

The applicant discloses a technique in Japanese Patent Application No. S63-84789. The technique is a thin film processing method in which a light-transmitting conductive film is irradiated with a linear laser beam having a wavelength of 400 nm or less to form grooves.

Japanese Published Patent Application No. H 9-152618 discloses a thin film processing technique in which a light-transmitting film is irradiated with a linear laser beam so that the light-transmitting film is ablated and removed (ablation) instantaneously to be patterned.

SUMMARY OF THE INVENTION

However, since resist used in the photolithography technique contains an organic solvent, the cost for effluent in development or disposing a solution of peeling a resist mask is high. When a thin film is etched by dry etching using a resist mask, a toxic substance such as $CF_3$ gas as an etching gas is used in many cases, and thus great expense is needed to dispose the etching gas.

In addition, patterning a thin film by selective ablation using a laser beam greatly depends on a stack structure of thin films. Thus, it is difficult to apply laser ablation to a complicated stack structure as in a process of manufacturing thin film transistors.

The present invention provides a method by which a thin film process can be conducted simply and accurately without using resist. Further, the present invention provides a method of manufacturing semiconductor devices at low cost.

In an aspect of the present invention, a first layer is formed over a substrate, a peeling layer is formed over the first layer, the peeling layer is selectively irradiated with a laser beam from the peeling layer side (through the peeling layer) to reduce adhesiveness of a part of the peeling layer. Next, the peeling layer in the part with reduced adhesiveness is removed, and the left portion of the peeling layer is used as a mask to selectively etch the first layer.

In an aspect of the present invention, a first layer having a light-transmitting property is formed over a substrate having a light-transmitting property, a peeling layer is formed over the first layer, at least the peeling layer is selectively irradiated with a laser beam from the substrate side having a light-transmitting property to reduce adhesiveness of a part of the peeling layer. Next, the peeling layer in the part with reduced adhesiveness is removed, and the left portion of the peeling layer is used as a mask to selectively etch the first layer having a light-transmitting property.

In an aspect of the present invention, a peeling layer is formed over a substrate, at least the peeling layer is selectively irradiated with a first laser beam to reduce adhesiveness of a part of the peeling layer. Next, the peeling layer in the part with reduced adhesiveness is removed. Then, a first layer is formed over the left portion of the peeling layer, the left portion of the peeling layer is irradiated with a second laser beam to reduce adhesiveness of the left portion of the peeling layer, and the left portion of the peeling layer and the first layer in contact with the peeling layer are removed. Note that when the first layer has a light-shielding property, the substrate has a light-transmitting property and the second layer beam is emitted from the substrate side. In addition, when the first layer and the substrate have light-transmitting properties, irradiation of the second laser beam can be conducted either from the substrate side or the first layer side.

The stress of the peeling layer or a layer in contact with the peeling layer is changed by laser irradiation, so that distortion may be caused in the peeling layer or at the interface between the peeling layer and the layer in contact with the peeling layer. Thus, peeling occurs at the interface between the peeling layer and a base film of the peeling layer (the first layer described above). Thus, the peeling layer is selectively irradiated with a laser beam, the peeling layer whose adhesive is reduced is removed, and thus the peeling layer can selectively formed as a mask.

In addition, when the layer in contact with the peeling layer is irradiated with a laser beam, the layer in contact with the peeling layer absorbs energy of the laser beam to be heated. The heat is transmitted to the peeing layer, so that the properties of the peeling layer may be changed. As a result, the adhesiveness of the peeling layer to the base film is decreased. Thus, after the layer in contact with the peeling layer is selectively irradiated with the laser beam, the peeling layer whose adhesiveness is reduced is removed to selectively form the peeling layer as a mask.

When the peeling layer is irradiated with the laser beam, the peeling layer may absorbs the energy of the laser beam to be heated. By the heat, the properties of the peeling layer are changed. As a result, the adhesiveness of the peeling layer to the base film is decreased. Thus, since the peeling layer is selectively irradiated with the laser beam, the peeling layer can be removed selectively and further, a left portion of the peeling layer can be used as a mask.

In addition, a layer having a light-transmitting property (hereinafter, also referred to as a light-transmitting layer) may be formed over the peeling layer. By forming the light-transmitting layer over the peeling layer, at least the peeling layer can be irradiated with a laser beam. The peeling layer irradiated with the laser beam and further the layer in contact with the peeling layer absorb the energy of the laser beam, and the adhesiveness of the peeling layer is reduced due to the stress change in the peeling layer and at the interface with the layer in contact with the peeling layer, the property changed of the peeling layer, or the like. The peeling layer having reduced adhesiveness is removed, and thus the peeling layer and the light-transmitting layer can be selectively processed. Even if a material has a small etching selectivity with respect to the peeling layer and the layer in contact with the peeling layer, by forming the light-transmitting layer, i.e., a material having a small difference in etching rates therebetween, the first layer can be etched using the processed light-transmitting layer and further the peeling layer as masks. Thus, by forming the light-transmitting layer over the peeling layer, the options of materials for the peeling layer and the layer in contact with the peeling layer can be broadened.

In addition, since the energy of the laser beam is transmitted in the depth direction of peeling layer, the thickness of a light-absorption layer is preferably thin. However, in the case where the layer having an transmitting property is not formed over a peeling layer, and the peeling layer processed by laser irradiation is used as a mask, if the thickness of the peeling layer is thin, in etching a layer in contact with the peeling layer, the peeling layer serving as a mask is also etched. Thus, it is difficult to form the layer in contact with the peeling layer into a desired shape. As a result, reduction of yield and defects of a semiconductor device may be caused. However, formation of the light-transmitting layer over the peeling layer allows a light-transmitting layer processed by a laser beam and further the peeling layer to be used as masks. The thickness of the light-transmitting layer can be optionally set, and thus the light-transmitting layer can be function as a mask for processing the layer in contact with the peeling layer. Thus, the light-transmitting layer processed by laser irradiation is used as a mask to increase the yield.

As a laser irradiation method, at least the peeling layer can be irradiated with a laser beam by using a photomask in which a pattern is formed.

Further, a laser irradiation apparatus having an electrooptic element may be used to selectively irradiate at least the peeling layer with a laser beam. The electrooptic element can control the location and the area which the laser beam selectively irradiates in accordance with data designed using a CAD (computer-aided design) device. Therefore, at least the peeling layer can be selectively irradiated with a laser beam without using a photomask.

Note that in the present invention, a display device refers to a device which employs a display element; that is, to an image display device. Further, a module in which a connector, for example an FPC (flexible printed circuit), TAB (tape automated bonding) tape, or a TCP (tape carrier package), is fitted to a display panel; a module in which a printed wiring board is provided at an end of TAB tape or a TCP; and a module in which an IC (integrated circuit) or a CPU is directly mounted on a display element by a COG (chip on glass) method, are all covered by the term 'display device'.

The adhesiveness of a peeling layer is selectively reduced by laser irradiation, the peeling layer having reduced adhesiveness is removed, and a left portion of the peeling layer can be used as a mask. In addition, a thin film is etched using the mask so that the thin film can be processed to have a desired shape in a desired position.

Further, the peeling layer can selectively processed by utilizing change in the adhesiveness of the peeling layer, without laser ablation. Vaporization and an explosive process by a sudden cubical expansion of an ablation layer, as in laser ablation, are not needed, and thus a peeling layer can be irradiated with much fewer shots of laser beams having small energy density, so that a thin film can be processed into a desired shape. Therefore, damages to the thin film and a base film for the thin film can be suppressed. As a result, a thin film as a part of a stack structure can also selectively processed. Moreover, the increase of throughput and cost reduction are possible.

A peeling layer is selectively irradiated with a laser beam to form a mask, and a thin film can be processed by using the mask. Thus, the control of the size of a laser beam in forming a mask allows the mask to be easily processed into a minute shape. Therefore, the options for a shape of a thin film to be processed can be increased, and miniaturization can also be conducted.

In addition, when a light-transmitting layer having tensile stress is formed over the peeling layer, the stress concentration increases at the interface between an irradiated region and a non-irradiated region with the laser beam in the peeling layer, and cracks easily occur at the interface. That is, a crack occurs in the thickness direction of the light-transmitting layer. Thus, the adhesiveness of the peeling layer is reduced and the light-transmitting layer 104 becomes weak. The peeling layer and the light-transmitting layer which have been irradiated with a laser beam can be easily removed. The peeling layer and the light-transmitting layer over the peeling layer can be removed without almost leaving residue. The adhesiveness of the peeling layer can be reduced by the lower energy and smaller number of shots of a laser beam.

As described above, a thin film can be processed into a desired shape without using resist used in a conventional lithography technology. Since resist and a developing solution of resist are not used, a large amount of medicinal solution or water is not needed. For the above reasons, a process can be simplified greatly and cost can be reduced more than a process using a conventional photolithography technique.

By the present invention, a thin film process in manufacturing semiconductor devices can be conducted simply and accurately. Further, semiconductor devices can be manufactured at low cost and with high throughput and yield.

BRIEF DESCRIPTION OF THE DRAWINGS

In the accompanying drawings:

FIGS. 9A to 9C are cross-sectional views illustrating a manufacturing method of a semiconductor device according to an aspect of the present invention;

FIGS. 10A and 10B are cross-sectional views illustrating a manufacturing method of a semiconductor device according to an aspect of the present invention;

FIGS. 11A to 11C are cross-sectional views illustrating a manufacturing method of a semiconductor device according to an aspect of the present invention;

FIGS. 13A and 13B are cross-sectional views illustrating a manufacturing method of a semiconductor device according to an aspect of the present invention;

DETAILED DESCRIPTION OF THE INVENTION

Embodiment Modes

Figure 1A:
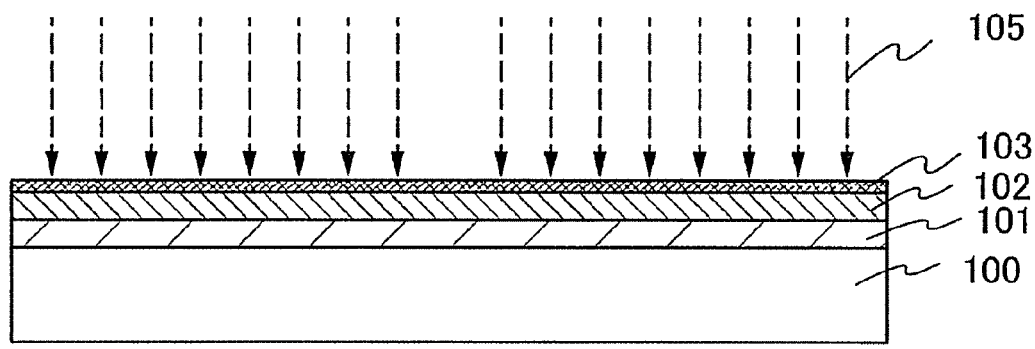
FIGS. 1A to 1D are cross-sectional views illustrating a manufacturing method of a semiconductor device according to an aspect of the present invention.

Embodiment Modes of the present invention, will now be described with reference to the drawings. Note that it is easily understood by those skilled in the art that the present invention can be carried out in many different modes, and various changes may be made in modes and details without departing from the spirit and the scope of the present invention. Therefore, the present invention should not be limited to the descriptions of the embodiment modes below. In addition, in the drawings, the same reference numerals are commonly given to the same components or components having the same function and the description therefor is not repeated.

Embodiment Mode 1

Embodiment Mode 1 will describe a thin film process using a laser beam, without a photolithography process. FIGS. 1A to 1D are cross-sectional views of a process for selectively forming a layer with a desired shape over a substrate.

As illustrated in FIG. 1A, a layer serving as a base film (hereinafter referred to as a base layer 101) is formed on one side of a substrate 100, a first layer 102 is formed over the base layer 101, and a peeling layer 103 is formed over the first layer 102.

As the substrate 100, a glass substrate, a plastic substrate, a metal substrate, a ceramic substrate, or the like can be used, as appropriate. Further, a printed wiring board or an FPC can be used. In a case where the substrate 100 is a glass substrate or a plastic substrate, a large-area substrate such as a substrate that is 320×400 mm, 370×470 mm, 550×650 mm, 600×720 mm, 680×880 mm, 1000×1200 mm, 1100×1250 mm, or 1150×1300 mm can be used. In this embodiment mode, a glass substrate is used as the substrate 100.

The base layer 101 which serves as a base film does not necessarily have to be provided. However, it is preferable to provide the base layer 101, because it has a function of preventing the substrate 100 from being etched when the first layer 102 is etched subsequently. The base layer 101 may be formed by using a suitable material as appropriate. Representative examples of materials that may be used for the base layer 101 are silicon oxide, silicon nitride, silicon oxynitride, silicon nitride oxide, aluminum nitride, and the like. In this embodiment mode, a silicon oxynitride layer having a thickness of 50 to 200 nm is formed as the base layer 101 by a CVD method.

The first layer 102 may be formed to suit the location of an electrode, a pixel electrode, a wiring, an antenna, a semiconductor layer, an insulating layer, a partition wall (or bank) or a phosphor of a plasma display, or the like which will be manufactured, using a conductive material, a semiconductor material, or an insulating material as appropriate. Note that the first layer 102 may be a single layer or a stacked layer.

When the first layer 102 is formed of a semiconductor material, silicon, germanium, or the like can be used as a semiconductor material. Further, a film which has any one of the following states can be used: an amorphous semiconductor, a semi-amorphous semiconductor in which an amorphous state and a crystalline state are mixed (also referred to as an SAS), a microcrystalline semiconductor in which crystal grains of 0.5 to 20 nm can be observed in an amorphous semiconductor, and a crystalline semiconductor. Further, an acceptor element or a donor element, such as phosphorus, arsenic, or boron, may be included in the semiconductor material. The first layer 102 can be formed of any semiconductor material, without being limited to the above described semiconductor materials.

When the first layer 102 is formed of a conductive material, as a conductive material, any one of the elements titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), and barium (Ba) can be used. Further, the first layer 102 can be formed as a single layer or a stacked layer which includes an alloy material, a nitrogen compound, or the like which has one of the above-mentioned elements as its main constituent. Further, a conductive material having a light-transmitting property, such as indium oxide which contains tungsten oxide (IWO), indium zinc oxide which contains tungsten oxide (IWZO), indium oxide which contains titanium oxide (ITiO), indium tin oxide which contains titanium oxide (ITTiO), indium tin oxide (ITO), indium zinc oxide (IZO), or indium tin oxide to which silicon oxide has been added (ITSO) can be used. Any conductive material can be used, without limitations to the above conductive materials.

As an insulating material, a single layer of an oxygen compound, a nitrogen compound, a carbon compound, or a halogen compound of one of the above-mentioned conductive elements can be used. Further, a stacked layer including such a compound can be used. Representatively, aluminum nitride, silicon nitride, silicon oxide, silicon carbide, carbon nitride, aluminum chloride, or the like may be used. Further, an organic resin such as polyimide, polyamide, BCB (benzocyclobutene), or an acrylic can be used. Further, siloxane, polysilazane, or the like can be used. Any insulating material can be used, without limitations to the above insulating materials.

In this embodiment mode, a tungsten layer having a thickness of 50 to 300 nm is formed as the first layer 102 by a sputtering method.

The peeling layer 103 is formed of a material whose adhesiveness is reduced by absorbing a laser beam. A typical example of the peeling layer 103 is a metal oxide, and as specific examples, there are titanium oxide, zirconium oxide, hafnium oxide, vanadium oxide, tantalum oxide, niobium oxide, tungsten oxide, molybdenum oxide, chromium oxide, technetium oxide, rhenium oxide, iron oxide, ruthenium oxide, osmium oxide, cobalt oxide, rhodium oxide, iridium oxide, nickel oxide, palladium oxide and the like. Metal oxides have different bond numbers of oxygen depending on valence of a metal element, and have different wavelengths of light to be absorbed. Thus, a wavelength of a laser beam with which the peeling layer 103 is irradiated later is selected appropriately in accordance with the peeling layer.

The peeling layer 103 can be formed by a coating method, an evaporation method, a vacuum evaporation method, a sputtering method, or a chemical vapor deposition (CVD) method. A thin conductive layer can be formed, and then heated to form an oxide layer as the peeling layer 103. In addition, when the first layer 102 is metal, the surface of the first layer is oxidized to from the peeling layer. As the oxidation method of the surface of the first layer, there are such treatments as heating in an oxygen atmosphere (heating by using an electric furnace or a lamp), a plasma treatment such as oxygen plasma, nitrous oxide plasma, or ozone plasma, ashing using oxygen, an oxidation treatment by a liquid having oxidizability such as ozone water or water. Here, as the peeling layer 103, the surface of the tungsten layer of the first layer 102 is subjected to a nitrous oxide plasma treatment, so that a tungsten oxide layer having a thickness of 5 to 50 nm, preferably 10 to 30 nm is formed.

Then, the peeling layer 103 and the first layer 102 are irradiated with a laser beam 105. Here, an overlapping portion of the peeling layer 103 with a region in which the first layer 102 is to be removed is irradiated with the laser beam.

As the laser beam 105, a beam having energy absorbed by at least the peeling layer 103 is selected. Alternatively, a beam having energy absorbed by the peeling layer 103 and the first layer 102 is selected as appropriate. In this case, the absorption amount of the laser beam absorbed by the peeling layer 103 is not 100%, and a part of the laser beam transmits the peeling layer 103 and the laser beam which have transmitted the peeling layer 103 is absorbed by the first layer 102. Typically, a laser beam in an ultraviolet region, a visible region or an infrared region is selected as appropriate.

A laser irradiation apparatus which can be used in the present invention is described hereinafter.

Figure 7:
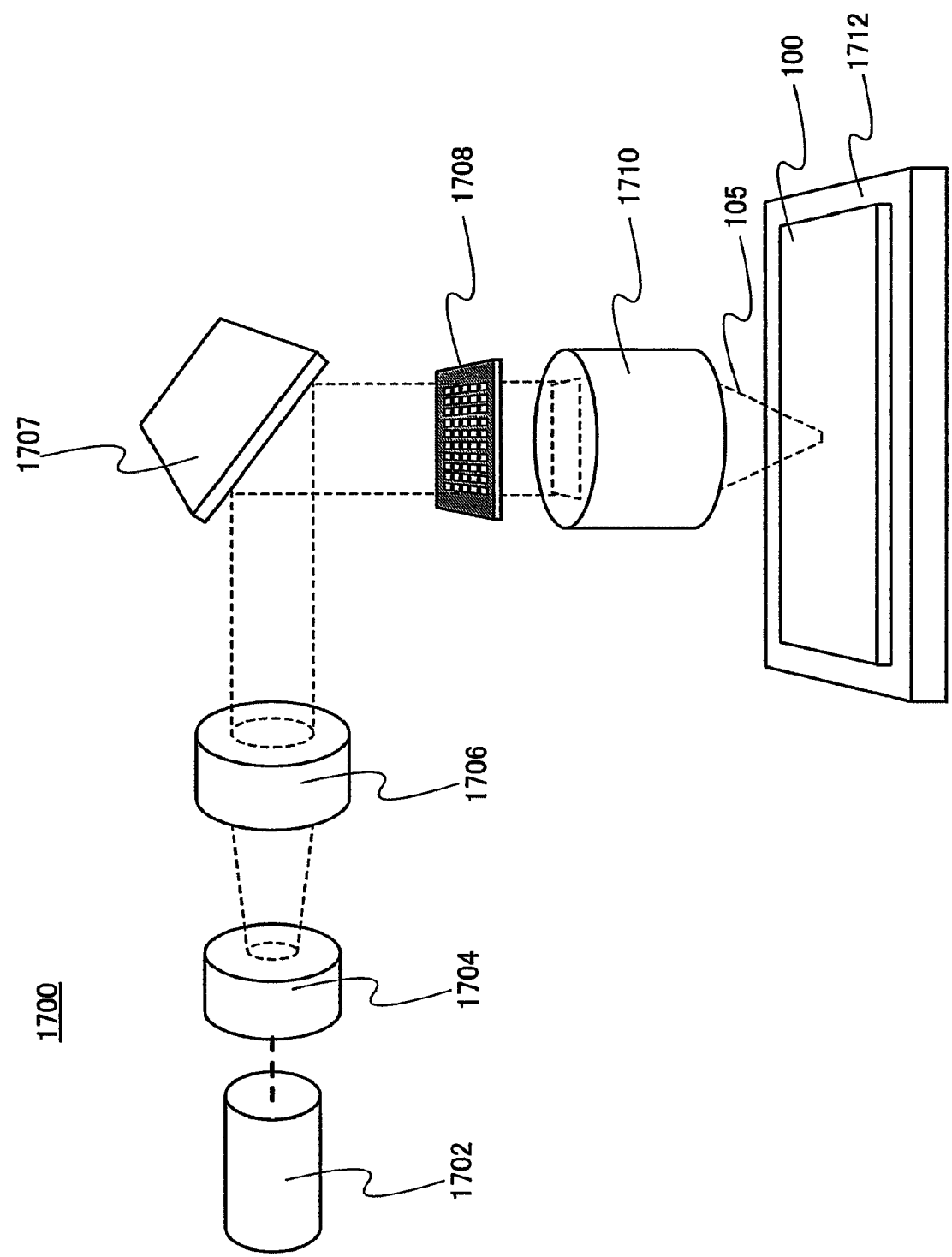
FIG. 7 is a perspective view of a laser irradiation apparatus which can be applied to the present invention.

FIG. 7 schematically illustrates a laser irradiation apparatus by which at least the peeling layer over the substrate 100 is irradiated with a laser beam, using a photomask.

In FIG. 7, a laser irradiation apparatus 1700 includes a laser oscillator 1702, a first optical system 1704 which shapes a laser beam, a second optical system 1706 which homogenizes the laser beam, a photomask 1708, a third optical system 1710, and a stage 1712. A photomask 1708 is set in a mask holder 1720. The substrate 100 is put on the stage 1712.

A laser beam oscillated from the laser oscillator 1702 passes through the first optical system 1704 to be shaped. The shaped laser beam passes through the second optical system 1706 to be homogenized. The shaped and homogenized laser beam passes through the photomask 1708, is reduced to a desired magnification in the third optical system 1710 and forms a pattern on the substrate 100 held on the stage 1712.

As the laser oscillator 1702, one or a plurality of lasers selected from among the following can be used: a gas laser, such as an Ar laser, a Kr laser, or an excimer laser (KrF, ArF, XeCl); a laser whose medium is single-crystalline YAG, $YVO_4$, forsterite ($Mg_2SiO_4$), $YAlO_3$, or $GdVO_4$, doped with one or a plurality of Nd, Yb, Cr, Ti, Ho, Er, Tm, and Ta; a laser whose medium is polycrystalline (ceramic) YAG, $Y_2O_3$, $YVO_4$, $YAlO_3$, or $GdVO_4$, doped with one or a plurality of Nd, Yb, Cr, Ti, Ho, Er, Tm, and Ta; a semiconductor laser oscillator, such as GaN, GaAs, GaAlAs, or InGaAsP; a glass laser, a ruby laser, an alexandrite laser, a Ti:sapphire laser, a copper vapor laser, and a gold vapor laser. When a solid-state laser, whose laser medium is a solid, is used, there are advantages in that maintenance-free conditions can be maintained for a long time, and output is comparatively stable.

Further, for the laser beam 105, a continuous wave laser beam or a pulsed laser beam can be applied as appropriate. For the pulsed laser beam, generally a frequency band of several tens of Hz to several kHz is used. However, a pulsed laser having a repetition rate which is much higher than that, of 10 MHz or more, may also be used.

The first optical system 1704 is an optical system for shaping a laser beam obtained from the laser oscillator 1702 into a desired shape. Specifically, a cross-sectional shape of the laser beam is formed into a planar shape such as a circular shape, an elliptic shape, or a rectangular shape; a linear shape (in a strict sense, a narrow rectangular shape); or the like. For example, the beam diameter of the laser beam may be adjusted using an expander or the like for the first optical system 1704. Further, a polarizer, which aligns a polarization direction of a laser beam; an attenuator, which adjusts energy of a laser beam; a spectrometer; or the like may be used.

The second optical system 1706 is an optical system for homogenizing energy distributions of the laser beam shaped by the first optical system 1704. Specifically, the second optical system 1706 homogenizes energy distributions of the laser beam, with which the photomask 1708 is irradiated. For example, using a homogenizer or the like, energy distributions of the laser beam may be homogenized. Further, in order to efficiently irradiate the photomask 1708 with the laser beam, a field lens or the like may be provided between a homogenizer and the photomask 1708 so that the laser beam may be condensed.

A mirror 1707 is provided to control the optical path of the laser beam whose energy distribution is homogenized by the second optical system 1706. Here, the laser beam emitted toward the mirror 1707 is bent perpendicularly by the mirror 1707.

The photomask 1708 can be a binary mask. The binary mask is a light-shielding layer of chromium or chromium oxide which absorbs light and is selectively formed over a light-transmitting substrate such as quartz. Light can pass through a region where the light-shielding layer is not formed.

When the energy of the laser beam hit the light-absorption layer is high, a reflection layer is preferably formed between the light-transmitting substrate and the light-shielding layer. By provision of the reflection layer, the absorption amount of the laser beam by the light-shielding layer can be reduced. Thus, heat conversion of energy by light absorption of a laser beam and deformation of the pattern of the light-shielding layer due to the heat can be prevented.

As the reflection layer, a dielectric mirror or a reflective layer can be used. The dielectric mirror is a mirror in which two transparent insulating layers having different refractive indexes are stacked alternately. In this case, as the refractive indexes of the two transparent insulating layers are higher or as the number of stacked layers is larger, the reflection efficiency becomes higher. Note that, for the dielectric mirror, a material to be stacked is appropriately selected in accordance with a wavelength of a laser beam to be emitted. For example, as a stacked-layer structure of a dielectric mirror reflecting visible light, a stacked-layer structure of titanium dioxide and silicon dioxide, a stacked-layer structure of zinc sulfide and magnesium fluoride, a stacked-layer structure of amorphous silicon and silicon nitride, or the like can be employed.

Alternatively, as the reflective layer, a layer formed of aluminum, gold, silver, nickel, or the like may be used. Further, the dielectric mirror and the reflective layer may be stacked.

As the photomask 1708, a phase shift mask may be used. By the phase shift mask, a minute shape, typically, a layer with a narrow width or a layer with a narrow width and a short length can be formed.

The third optical system 1710 is an optical system for reducing the laser beam in size which is patterned by passing through the photomask 1708. Since the laser beam is transmitted through only the light-transmitting region of the photomask 1708, the laser beam transmitted through the photomask 1708 corresponds to a pattern formed by the light-transmitting region. The third optical system 1710 is an optical system which reduces the laser beam in size while maintaining the pattern shape of the laser beam formed by the photomask 1708 and forms a pattern on the substrate 100. For example, a reducing glass, which reduces a laser beam to ⅕, ⅒, etc., the original size may be used. Typically, a projection lens may be used.

The substrate 100 is held by the stage 1712 and can move in XYZθ directions.

Instead of using the stage 1712 holding the substrate 100, the substrate may be moved by a method in which a gas is blown to the substrate 100 so as to float the substrate 100. As the size of a large-area substrate, sizes of 590×670 mm, 600×720 mm, 650×830 mm are adopted in production lines, and further 680×880 mm, 730×920 mm, and a larger size substrate will adopted in production lines. In a case where a glass substrate with a side exceeding one meter is used, preferably a conveying method which can relieve a warp caused by the substrate's own weight, for example, a method in which gas is blown so that the substrate is floated, is preferably used to move the substrate.

Further, instead of a stage which holds a substrate lying on its side, a holder which holds a substrate which is standing upright may be used. When irradiation with a laser beam is performed on a substrate that is standing upright, scattered matters can be removed from the substrate.

The laser irradiation apparatus 1700 may be provided with a light receiving element for monitoring and controlling whether the photomask 1708 is uniformly irradiated with a laser beam. Further, a light receiving element may be provided as an autofocus mechanism for focusing the laser beam on the substrate. As the light receiving element, a CCD camera or the like may be used.

Further, when a laser beam is processed into a linear laser beam or a planar laser beam having a large area such as a rectangular laser beam or a circular laser beam using an optical system, a plurality of regions can be irradiated with a laser beam in a short time. Accordingly, a lot of patterns can be formed over a large substrate in a short time, and thereby mass productivity can be improved.

Figure 8:
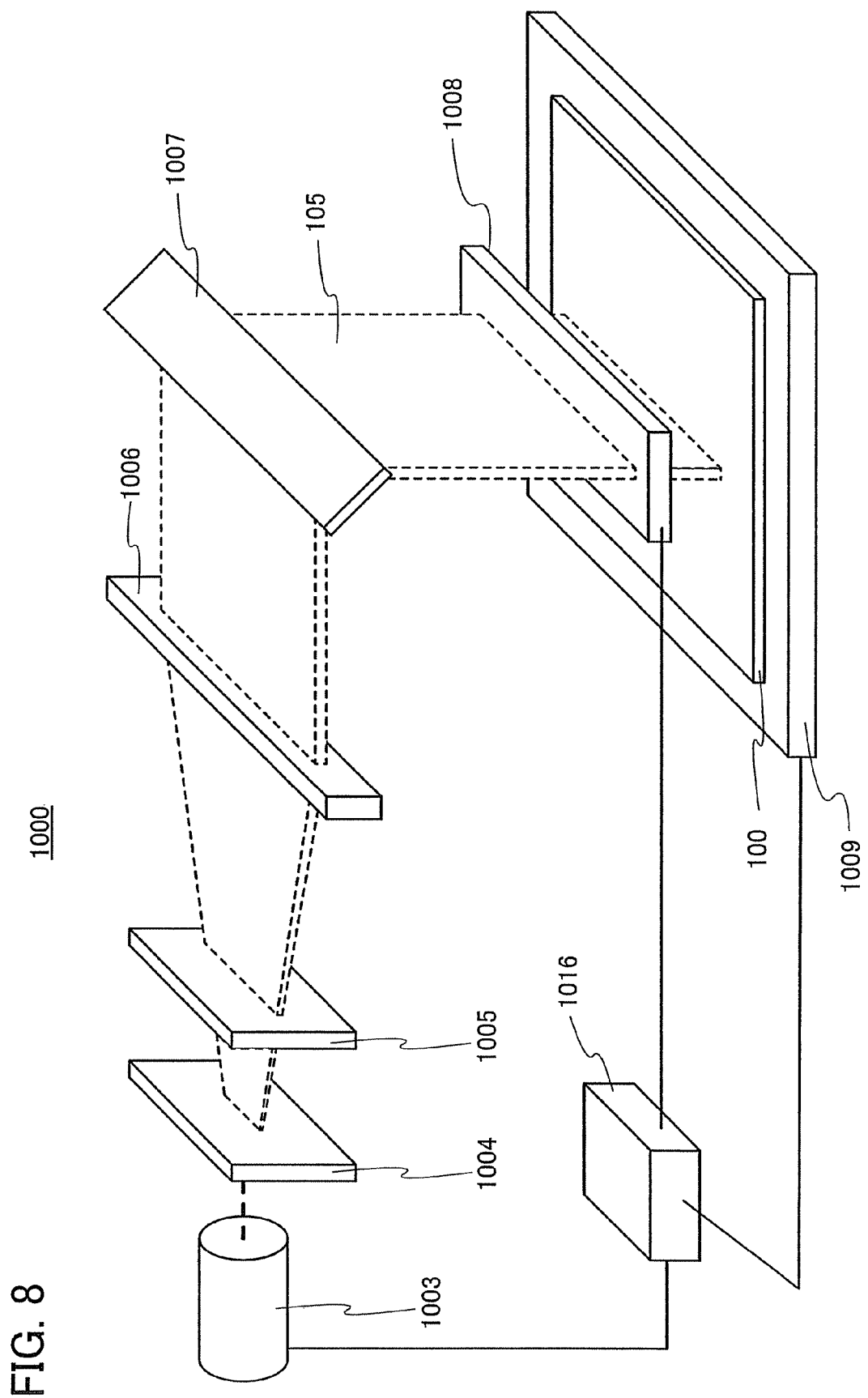
FIG. 8 is a perspective view of a laser irradiation apparatus which can be applied to the present invention.

A laser irradiation apparatus illustrated in FIG. 8 can control the area that is irradiated with the laser beam and the location that is irradiated with the laser beam, using data designed by a CAD device. When such a laser irradiation apparatus is used, irradiation with a laser beam can be performed selectively without using a photomask.

FIG. 8 is a perspective view illustrating an example of a laser irradiation apparatus 1000. A laser beam to be emitted is output from a laser oscillator 1003 (a YAG laser device, an excimer laser device, or the like), and passes through a first optical system 1004 for making the beam shape rectangular, a second optical system 1005 for shaping of the laser beam, and a third optical system 1006 for homogenizing the laser beam. The optical path of the laser beam is then bent in a vertical direction by a reflecting mirror 1007. Subsequently, the laser beam is transmitted through an electrooptic element 1008 which selectively adjusts the area and location of the laser beam which the peeling layer 103 is irradiated with, so that an irradiation surface is irradiated.

As the laser oscillator 1003, the laser oscillator 1702 illustrated in FIG. 7 can be used as appropriate. As a first optical system 1004, a slit or the like can be used. The first optical system 1704, the second optical system 1706 and the substrate stage 1712 illustrated in FIG. 7 can be used for the second optical system 1005, the third optical system 1006 and the stage 1009, respectively as appropriate.

A representative example of a control device 1016 is a computer, which includes a memory portion (a RAM, a ROM, or the like) which stores design data of a semiconductor device and a microprocessor which includes a CPU and the like. When an electric signal based on CAD data for designing the semiconductor device is input from the control device 1016 to the laser irradiation apparatus, the location and area of a laser beam with which the substrate is irradiated is controlled by the electrooptic element. Further, in a case where a stage, on which a substrate to be processed is fixed, is moved, by synchronizing the emission timing of the laser oscillator, the electric signal that is input to the electrooptic element, and the speed of movement of the stage, the irradiation location of the laser beam and area of the laser beam can be controlled.

When the electric signal based on CAD data for designing the semiconductor device is input to the electrooptic element 1008, the electrooptic element 1008 functions as an optical shutter or an optical reflector and as an adjustable mask. By using the control device 1016 to change the electric signal which is input to the electrooptic element which functions as an optical shutter, the area and location of the laser beam can be changed. That is, the area and location for processing the thin film can be selectively changed. Therefore, the shape of the laser beam can be linear, rectangular, or another desired shape, and irradiation with a laser beam with a complex shape can also be performed.

As the electrooptic element 1008, an element which can selectively adjust an area which light can pass through may be used. For example, an element having a liquid crystal material or an electrochromic material may be used. Further, an element which can selectively adjust optical reflection may be used. For example, a digital micromirror device (also referred to as a DMD) may be used. A DMD is a kind of spatial light modulator. It is a device in which a plurality of small mirrors, referred to as micromirrors, which rotate about a fixed axis in accordance with an electrostatic field effect, are disposed in matrix form on a semiconductor substrate formed of Si or the like. Alternatively, a PLZT element, which is an optical element which modulates light transmission by using an electrooptic effect, can be used as an electrooptic element. Note that a PLZT element is a device that is an oxide ceramic which contains lead, lanthanum, zircon, and titanium, and the name PLZT is an acronym consisting of the initial letters of the chemical symbols of those chemicals. A PLZT element is a transparent ceramic which can transmit light. When a voltage is applied to a PLZT element, the polarization of the light can be changed, and by combining a PLZT element with a light polarizer, an optical shutter is formed. Note that the electrooptic element 1008 is a device that can withstand having a laser beam being passed through it.

Regarding the electrooptic element 1008, the region which a laser beam can pass through can have the same size as the substrate which is to be processed. In a case where a region of the electrooptic element 1008, through which a laser beam can pass, can have the same size as the substrate which is to be processed, the substrate to be processed and the electrooptic element are aligned with each other, and the laser beam is scanned with both of their positions fixed. Note that in such a case, in processing a thin film one time, an electric signal is input to the electrooptic element once.

In order to achieve a reduction in size of the laser irradiation apparatus, the electrooptic element may have a long, narrow rectangular shape such that at least a rectangular beam can pass through the electrooptic element or be reflected by it. For example, in a case where a long and narrow DMD is used, the number of micromirrors which control an angle of reflection can be reduced. Therefore, modulating speed can be increased. Further, in a case where a long and thin electrooptic element which employs liquid crystals is used, the number of scanning lines and signal lines is reduced and driving speed can be increased. Therefore, a similar effect can be obtained. Further, when an electrooptic element with a long, narrow rectangular shape is used, in processing a thin film one time, an electric signal which is input to the electrooptic element is changed a plurality of times. When the electric signal which is input to the electrooptic element sequentially is changed so that it is synchronized with scanning of the rectangular beam, a thin film is processed in succession.

Further, the shape of a spot of the laser beam which is irradiated onto the irradiation surface is preferably rectangular or linear. Specifically, a rectangular shape with a short side of 1 to 5 mm and a long side of 10 to 50 mm is preferable. In a case where a laser beam spot which has little aberration is desired, the shape of the spot may be a square which is 5×5 mm to 50×50 mm. Further, in a case where a substrate with a large area is used, in order to reduce processing time, a long side of the laser beam spot is preferably 20 to 100 cm. Furthermore, the electrooptic element may be controlled such that the area per shot is the aforementioned size, and inside that area, irradiation is performed with a laser beam having a spot with a complex shape. For example, irradiation can be performed with a laser beam having a spot which has a shape similar to that of a wiring.

Further, laser beams with rectangular shapes and linear shapes may be overlapped and a laser beam with a complex spot shape may be used.

Further, a plurality of the laser oscillators and the optical systems illustrated in FIG. 7 or FIG. 8 may be provided so that a substrate with a large area is processed in a short time. Specifically, a plurality of electrooptic elements may be provided over the substrate stage, and laser beams may be emitted from laser oscillators which correspond to each of electrooptic elements, and the processing area of a single substrate may be divided among the laser beams.

Further, a plurality of optical systems may be provided in the optical path between the laser oscillator 1003 and the substrate 100, and more minute processing may be performed. Representatively, when projection is reduced using a stepper system which includes an electrooptic element which is larger than the substrate and an optical system for reduction, the area and position of the laser beam can be processed minutely. Further, same-size projection using a mirror projection system may be performed.

Further, it is preferable to provide a means of position alignment which is electrically connected to the control device. Irradiation position alignment can be performed with high precision by providing an image pickup device such as a CCD camera and by being based on data obtained from the image pickup device. Further, the irradiation apparatus of the present invention, a laser beam can be irradiated onto a desired position to form a position marker.

Further, in a case where dust is caused by the laser beam irradiation, preferably the laser irradiation apparatus 1700, 1000 is further provided with a blowing means for ensuring that dust does not adhere to a substrate surface which is to be processed, or a dust vacuuming means. Dust can be prevented from adhering to the substrate surface by blowing or vacuuming dust while performing laser beam irradiation.

Note that FIG. 7 or FIG. 8 is an example, and there is no particular limitation on the positional relationship of the optical systems and the electrooptic element disposed in the optical path of the laser beam. For example, when the laser oscillator 1003 is disposed over the substrate 100 and the laser beam emitted from the laser oscillator 1003 is disposed such that it is emitted in a direction perpendicular to the substrate surface, it is not necessary to use a reflecting mirror. Further, each optical system may employ a condenser lens, a beam expander, a homogenizer, a polarizer, or the like, and these may be combined. Further, as each optical system, a slit may be used in combination.

By scanning the laser beam or moving the substrate, as appropriate, the irradiation region of the laser beam can be moved two-dimensionally over the surface to be irradiated, and thereby a wide area of the substrate can be irradiated. Here, scanning is performed by a moving means (not illustrated) which moves the substrate stage 1009, which is holding the substrate, in XYZθ directions.

The control device 1016 is preferably interlocked such that it can also control the moving means which moves the substrate stage 1009 in the XYZθ directions. Further, the control device 1016 is preferably interlocked such that it can also control the laser oscillator 1003. Furthermore, the control device 1016 is preferably interlocked to a position alignment system for recognizing position markers.

Figure 1B:
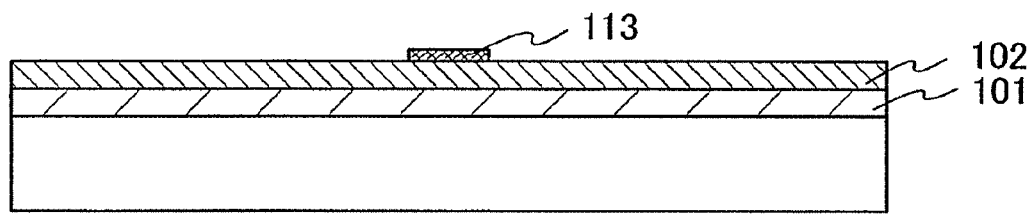

The laser beam 105 can have energy density sufficient for reducing the adhesiveness of the peeling layer 103, typically 50 mJ/cm² to 500 mJ/cm². When an excimer laser beam (wavelength: 308 nm) is used as the laser beam 105, the energy density sufficient for reducing the adhesiveness of the peeling layer 103 is preferably 200 mJ/cm² to 300 mJ/cm². When at least the peeling layer 103 is irradiated with the laser beam 105, the adhesiveness of the peeling layer irradiated with the laser beam is reduced. The peeling layer with the reduced adhesiveness is removed, and the peeling layer 113 can be formed over the first layer 102 as illustrated in FIG. 1B.

The apparatus illustrated in FIG. 7 is used as the laser irradiation apparatus. The laser oscillator 1702 employs YAG, and the second harmonic of YAG (wavelength: 532 nm) is used as the laser beam 105.

The irradiation of the laser beam 105 can be conducted in the atmospheric pressure or reduced pressure. Scattered matters, which are parts of the peeling layer 103, can be easily collected by laser irradiation to the peeling layer 103 in the reduced pressure.

Further, while the substrate 100 is being heated, the peeling layer 103 may be irradiated with the laser beam.

After that, the peeling layer whose adhesiveness is reduced by laser irradiation is removed. As the removal method, chemical removing such as washing treatment using a solution in which the peeling layer can be dissolved may be employed. Alternatively, physical removal such as removing by water washing, attachment of the peeling layer with reduced adhesiveness to an adhesive material, suction by reduced pressure or the like can be employed. Further, chemical removal and physical removal can be combined. Here, the substrate is washed with water and the peeling layer with reduced adhesiveness is removed.

Through the above steps, a photolithography process is not employed, and at least a peeling layer is irradiated with a laser beam to selectively form a mask by using a part of the peeling layer formed over a substrate.

Figure 1C:
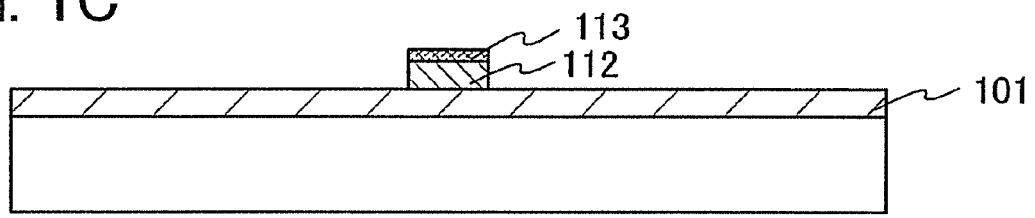

As illustrated in FIG. 1C, the left portion of the peeling layer 113 is used as a mask to etch the first layer 102, so that the second layer 112 is formed. As the etching method of the first layer 102, dry etching, wet etching or the like can be adopted as appropriate. Here, a tungsten layer is etched using fluorocarbon gas as an etching gas. Typically, a mixed gas of $CF_4$ and $Cl_2$, or a mixed gas of $CHF_3$ and He can be used as an etching gas.

When the difference in the etching rate between the first layer 102 and the peeling layer 113 is large, specifically, the etching rate of the first layer 102 is higher than that of the peeling layer 113, the thicknesses of the first layer 102 and the peeling layer 113 may be set as appropriate.

On the other hand, when the difference in the etching rate between the first layer 102 and the peeling layer 113 is small, the thickness of the first layer 102 is preferably smaller than that of the peeling layer 113. As a result, when the first layer 102 is etched, the peeling layer 113 can be prevented from finishing being etched earlier than the first layer 102.

Figure 1D:
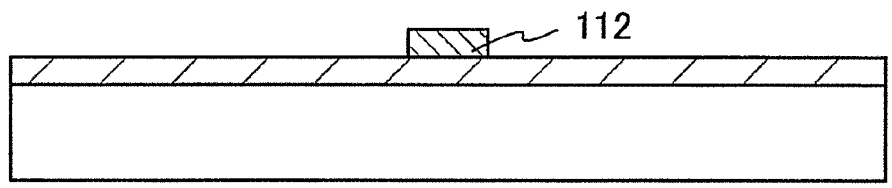

Next, as illustrated in FIG. 1D, the peeling layer 113 serving as a mask is removed. As the removal method of the peeling layer 113, dry etching, wet etching or the like may be adopted. Alternatively, after the peeling layer 113 serving as a mask is irradiated with a laser beam again, the peeling layer with reduced adhesiveness may be removed as appropriate as illustrated in FIG. 1B.

When dry etching or wet etching is adopted as the removal method of the peeling layer 113 serving as a mask, the difference in the etching rate between the base layer 101 and the peeling layer 113 is large, specifically, when the etching rate of the base layer 101 is lower than that of the peeling layer 113, the thicknesses of the base layer 101 and the peeling layer may be set as appropriate.

On the other hand, when the etching rates in the base layer 101 and the peeling layer are small, the thickness of the base layer 101 is preferably thicker than that of the peeling layer. As a result, when the peeling layer 113 is etched, the substrate 100 can be prevented from being etched together with the base layer 101.

Through the above steps, the second layer 112 having a desired shape can be formed in a desired position. In other words, without employing a photolithography process, a layer with a desired shape can be selectively formed over a substrate.

Embodiment Mode 2

Embodiment Mode 2 will describe a process of forming a layer with a desired shape with reference to FIGS. 2A to 2D, which is different from Embodiment Mode 1. Embodiment Mode 2 is different from Embodiment Mode 1 in the direction of laser irradiation to a peeling layer.

Figure 2A:
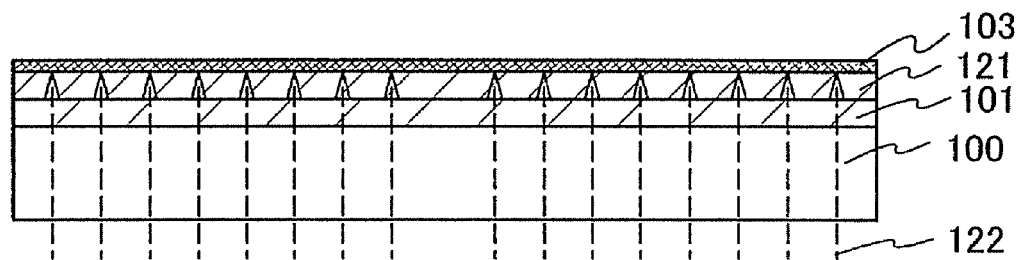
FIGS. 2A to 2D are cross-sectional views illustrating a manufacturing method of a semiconductor device according to an aspect of the present invention.

As illustrated in FIG. 2A, similarly to Embodiment Mode 1, the base layer 101 is formed over the substrate 100, the first layer 121 is formed over the baser layer 101, and the peeling layer 103 is formed over the first layer 121.

In this embodiment mode, the substrate 100, the base layer 101 and the first layer 121 are preferably formed materials which can transmit a laser beam with which the peeling layer is irradiated later. In other words, materials having larger band gap than energy of a laser beam to be emitted are preferably used for formation of the layers. When a wavelength of the laser beam is in the visible region, a glass substrate, a quartz substrate, a plastic substrate which transmits visible light, or the like can be given as typical examples of the substrate 100. However, the substrate 100 is not limited to the above examples.

When the wavelength of the laser beam is in the visible region, an organic resin layer which transmits visible light, such as a silicon oxide layer, a silicon nitride layer, or a silicon oxynitride layer is given as a typical example of the base layer 101. However, the base layer 101 is not limited to the above examples.

When the wavelength of the laser beam is in the visible region, as typical examples of the first layer 121, light-transmitting conductive materials such as IWO, IWZO, ITiO, ITTiO, ITO, IZO, ITSO, organic resin which transmits visible light, and the like are given. However, the first layer 121 is not limited to the above examples.

In this embodiment mode, a glass substrate is used as the substrate 100. A silicon oxynitride layer is formed as the base layer 101 by a CVD method, ITO having a thickness of 50 to 200 nm is formed as the first layer 121 by a sputtering method, and a molybdenum oxide layer having a thickness of 5 to 50 nm, preferably 10 to 30 nm is formed as the peeling layer 103 by an evaporation method.

Then, the peeling layer 103 is irradiated with a laser beam 122, from the substrate 100 side, by using the laser irradiation apparatus illustrated in Embodiment Mode 1. Specifically, the peeling layer 103 is irradiated with the laser beam 122 through the substrate 100, the base layer 101 and the first layer 121. At this moment, the peeling layer 103 is irradiated with the laser beam through a region in which the first layer 121 is not left later. As the laser beam 122, a second harmonic of YAG which is visible light is employed.

Figure 2B:
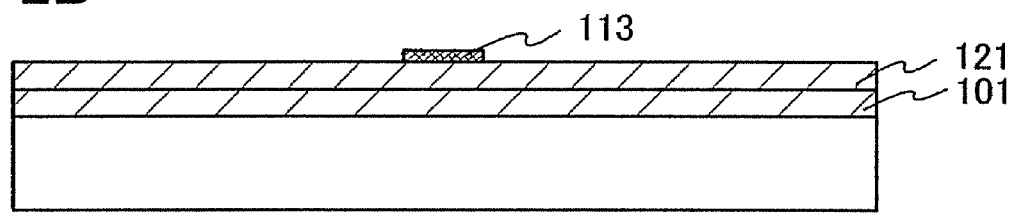

As a result, as illustrated in FIG. 2B, adhesiveness of a part of the peeling layer irradiated with the laser beam is reduced.

Then, by the removal method described in Embodiment Mode 1, the peeling layer with reduced adhesiveness is removed.

Figure 2C:
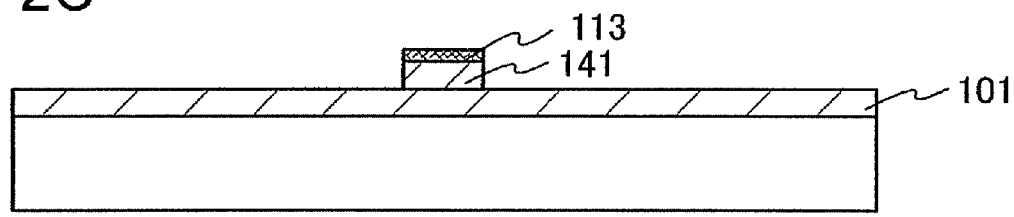

Next, as illustrated in FIG. 2C, similarly to Embodiment Mode 1, the first layer 121 is etched with a left portion of the peeling layer 113 as a mask. Here, the first layer 121 is etched by a wet etching method using a solution including oxalic acid. In this manner, the second layer 141 is formed.

Figure 2D:
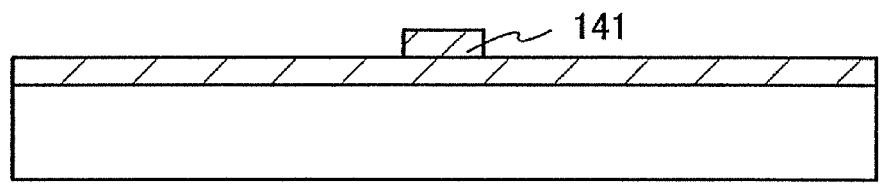

Then, as illustrated in FIG. 2D, the peeling layer 113 is etched to expose the second layer 141.

Through the above steps, without employing a photolithography process, a layer with a desired shape can be selectively formed over a substrate.

Embodiment Mode 3

Embodiment Mode 3 will describe a process of forming a layer with a desired shape with reference to FIGS. 3A to 3D, which is different from Embodiment Mode 1. Embodiment Mode 2 is different from Embodiment Mode 1 in the order of the forming the peeling layer serving as a mask.

Figure 3A:
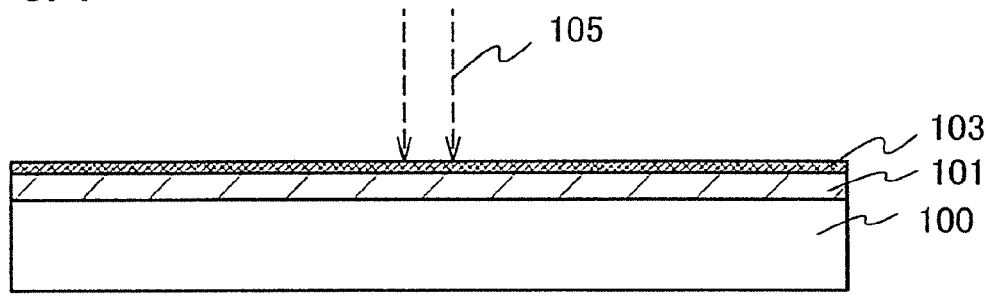
FIGS. 3A to 3D are cross-sectional views illustrating a manufacturing method of a semiconductor device according to an aspect of the present invention.

As illustrated in FIG. 3A, similarly to Embodiment Mode 1, the base layer 101 is formed over the substrate 100, and the peeling layer 103 is formed over the base layer 101.

In this embodiment mode, the substrate 100 and the base layer 101 are preferably formed using materials which can transmit a laser beam with which the peeling layer is irradiated later. The typical examples of the substrate 100 and the base layer 101 used in this embodiment mode may be the typical examples of the substrate 100 and the base layer 101 described in Embodiment Mode 2 as appropriate.

Then, the peeling layer 103 is irradiated with the laser beam 105, from the peeling layer 103 side, using the laser irradiation apparatus illustrated in Embodiment Mode 1 to reduce the adhesiveness of a part of the peeling layer 103. Here, the peeling layer 103 is irradiated with the laser beam in such a way that the peeling layer is not left in a region in which a first layer 133 to be formed later is to be left. In other words, the peeling layer 103 which overlaps a region in which a second layer 151 is formed later is irradiated with the laser beam. After that, the peeling layer with reduced adhesiveness is removed by the removal method illustrated in Embodiment Mode 1. In addition, when the laser beam 105 has a wavelength capable of transmitting the substrate 100 and the base layer 101, the laser beam 105 can be emitted from the substrate 100 side (through the substrate 100).

Figure 3B:
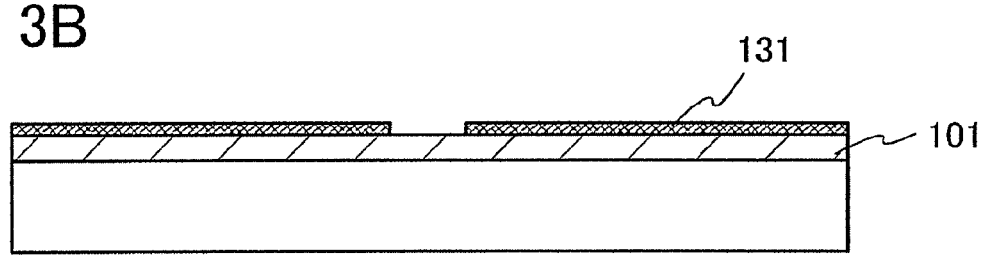

As a result, as illustrated in FIG. 3B, the peeling layer 131 serving as a mask can be formed in the region which is not irradiated with the laser beam 105.

Figure 3C:
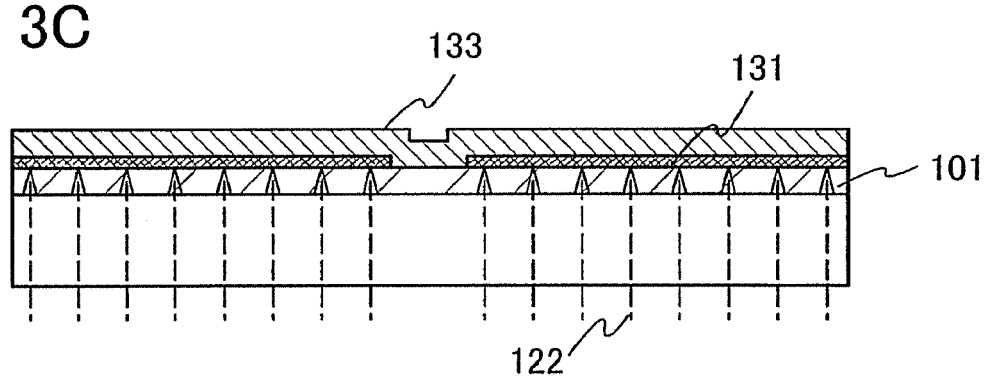

Then, as illustrated in FIG. 3C, a first layer 133 is formed over an exposed portion of the base layer 101 and an exposed portion of the peeling layer 131 serving as a mask. The first layer 133 can be formed using the same material of the first layer 102 described in Embodiment Mode 1.

Figure 3D:
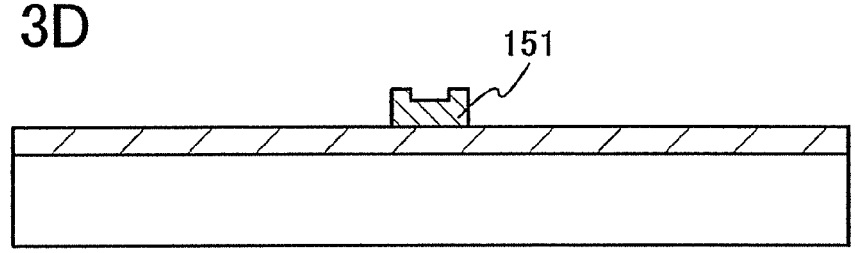

Then, the peeling layer 131 and the first layer 133 are irradiated with a laser beam 122 from the substrate 100 side to reduce the adhesiveness of the peeling layer 131. Then, the peeling layer 131 with reduced adhesiveness is removed by the removal method described in Embodiment Mode 1. In this moment, the first layer 133 in contact with the peeling layer 131 is also removed. In this manner, as illustrated in FIG. 3D, a second layer 151 is formed. In addition, when the laser beam 122 has a wavelength capable of transmitting the first layer 133, the laser beam 122 can be emitted from the surface side of the first layer.

Through the above steps, without employing a photolithography process, a layer with a desired shape can be selectively formed over a substrate.

Embodiment Mode 4

Embodiment Mode 4 will describe a process which can give more options of thicknesses and materials of the peeling layer and the first layer than the processes of Embodiment Modes 1 to 3, with reference to FIGS. 4A to 4D. In this embodiment mode, Embodiment Mode 1 is adopted for description.

Figure 4A:
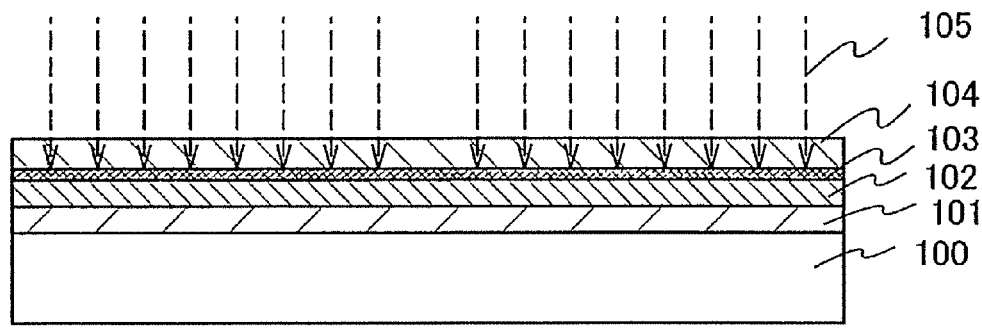
FIGS. 4A to 4D are cross-sectional views illustrating a manufacturing method of a semiconductor device according to an aspect of the present invention.

As illustrated in FIG. 4A, similarly to Embodiment Mode 1, the base layer 101 is formed over the substrate 100, the first layer 102 is formed over the base layer 101, and the peeling layer 103 is formed over the first layer 102. Then, the light-transmitting layer 104 is formed over the peeling layer 103.

The light-transmitting layer 104 may be formed using a material which can transmit a laser beam to be emitted later. The light-transmitting layer 104 is preferably formed using a material having an etching rate lower than that of the first layer 102 to be processed later, as appropriate. Such materials capable of transmitting a laser beam may be materials having a band gap energy larger than the energy of a laser beam to be emitted later.

The thickness of the light-transmitting layer 104 is preferably as thin as possible. This is because when the peeling layer and the first layer are irradiated with a laser beam, part of the laser beam may be absorbed even in the light-transmitting layer. However, when the light-transmitting layer 104 is thin, the energy of the laser beam can be reduced. Thus, damages to the first layer and a layer in contact with the first layer can be reduced. Further, when the light-transmitting layer 104 is thin, the light-transmitting layer 104 is easily weakened in the laser irradiation. Thus, the laser beam with more reduced energy can be used.

In addition, the light-transmitting layer 104 is preferably formed of a layer having tensile stress. When such a layer is formed, more stress concentration occurs at the interface between the irradiated region and the non-irradiated region with the laser beam and a crack easily occurs at the interface. That is, a crack occurs in the thickness direction of the light-transmitting layer. Thus, the adhesiveness of the peeling layer is reduced and also the light-transmitting layer 104 becomes weak locally. Thus, the peeling layer and the light-transmitting layer which have been irradiated with the laser beam can be easily removed without almost leaving residue. The adhesiveness of the peeling layer can be reduced by the lower energy and smaller number of shots of a laser beam.

When the first layer 102 is a conductive layer or a semi-conductor layer, the light-transmitting layer 104 is preferably formed of an insulating layer. Typically, silicon nitride, silicon oxide, silicon oxynitride, aluminum nitride or the like may be used. Here, a silicon nitride layer including oxygen which have a thickness of 10 to 40 nm and tensile stress is formed by a CVD method.

Then, at least the peeling layer 103 is irradiated with the laser beam 105 through the light-transmitting layer 104. Here, the peeling layer 103 overlapping a region in which the first layer 102 is selectively removed later is irradiated with a laser beam. Thus, the adhesiveness of a part of the peeling layer 103 is reduced. After that, the peeling layer with reduced adhesiveness and the light-transmitting layer formed thereover are removed by the removal method described in Embodiment Mode 1. The peeling layer with reduced adhesiveness and the light-transmitting layer formed thereover are removed by a solution including hydrofluoric acid.

Figure 4B:
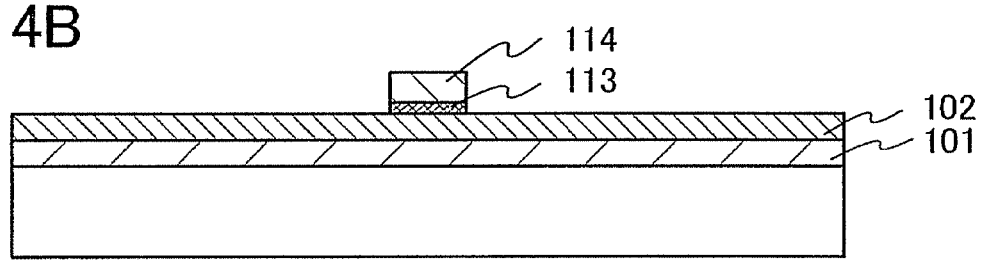

As a result, as illustrated in FIG. 4B, the peeling layer 103 and the light-transmitting layer are partially removed, so that a stack of the peeling layer 113 and the light-transmitting layer 114 is left.

Through the above steps, without employing a photolithography process, the peeling layer is irradiated with the laser beam, and parts of the light-transmitting layer and the peeling layer serving as a mask are selectively formed over the substrate.

Figure 4C:
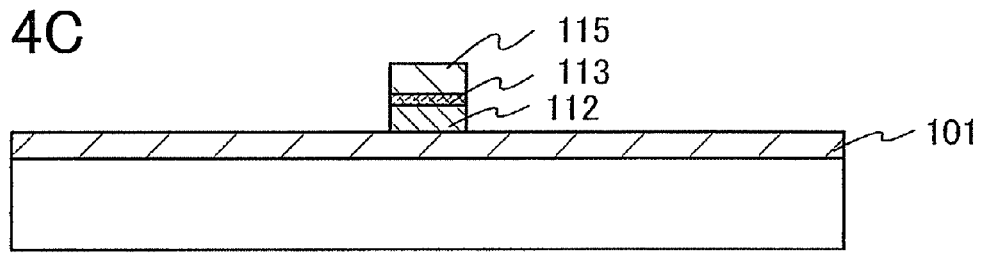

Then as illustrated in FIG. 4C, the peeling layer 113 and the light-transmitting layer 114 which are left are used as a mask to etch the first layer 102, so that the second layer 112 is formed. Note that the light-transmitting layer 114 serving as a mask is also somewhat etched in this moment. The etched light-transmitting layer is denoted by reference numeral 115.

Figure 4D:
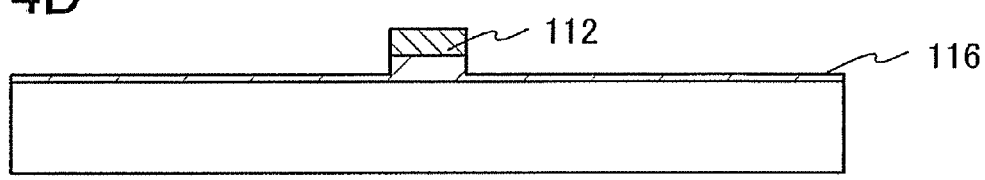

Then, as illustrated in FIG. 4D, the peeling layer 113 and the light-transmitting layer 115 which serve as a mask are removed. The removal method of the light-transmitting layer 115 may be dry etching or wet etching. In this case, when the difference in the etching rate between the base layer 101 and the light-transmitting layer 115 is large, specifically, when the etching rate of the base layer 101 is lower than that of the light-transmitting layer 115, the thicknesses of the base layer 101 and the light-transmitting layer 115 may be set as appropriate.

On the other hand, when the etching rates in the base layer 101 and the light-transmitting layer 115 are small, the thickness of the base layer 101 is preferably thicker than that of the light-transmitting layer 115. As a result, when the light-transmitting layer 115 is etched, the substrate 100 can be prevented from being etched together with the base layer 101. Note that the etched base layer 101 in etching the light-transmitting layer 115 is denoted by a base layer 116.

Through the above steps, the second layer 112 with a desired shape can be formed at a desired position.

Through the above steps, without employing a photolithography process, a layer with a desired shape can be selectively formed over a substrate. Further, since the light-transmitting layer having tensile stress is formed over the peeling layer, the peeling layer and the light-transmitting layer formed over the peeling layer can be removed without residue. The adhesiveness of the peeling layer can be reduced by the lower energy and smaller number of shots of a laser beam.

Embodiment Mode 5

Embodiment Mode 5 will describe a process which can give more options of thicknesses and materials of the peeling layer and the first layer than the processes of Embodiment Modes 1 to 3, with reference to FIGS. 5A to 5D. In this embodiment mode, Embodiment Mode 2 is adopted for description.

Figure 5A:
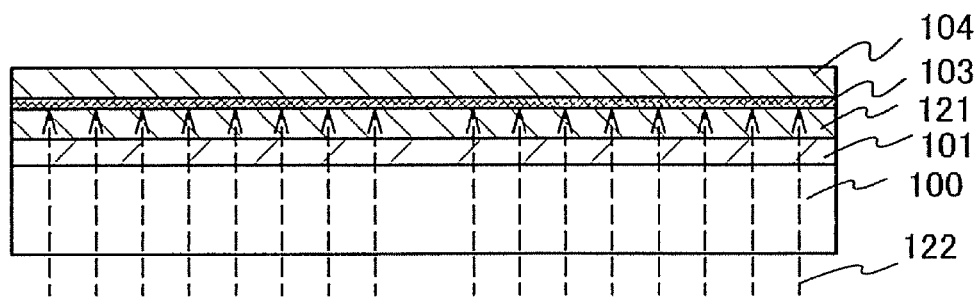
FIGS. 5A to 5D are cross-sectional views illustrating a manufacturing method of a semiconductor device according to an aspect of the present invention.

As illustrated in FIG. 5A, similarly to Embodiment Mode 1, the base layer 101 is formed over the substrate 100, the first layer 121 is formed over the base layer 101, and the peeling layer 103 is formed over the first layer 121. Then, the light-transmitting layer 104 is formed over the peeling layer 103.

In this embodiment mode, the substrate 100, the base layer 101 and the first layer 121 are preferably formed using materials which can transmit a laser beam with which the peeling layer is irradiated later. The typical examples of the substrate 100, the base layer 101 and the first layer 121 used in this embodiment mode may be the typical examples of the substrate 100, the base layer 101 and the first layer 121 described in Embodiment Mode 2 as appropriate.

Then, the peeling layer 103 is irradiated with a laser beam 122, from the substrate 100 side, by using the laser irradiation apparatus illustrated in Embodiment Mode 1. Specifically, the peeling layer 103 is irradiated with the laser beam 122 through the substrate 100, the base layer 101 and the first layer 121. At this moment, the peeling layer 103 is irradiated with the laser beam through the first layer 121 to be selectively removed later.

Figure 5B:
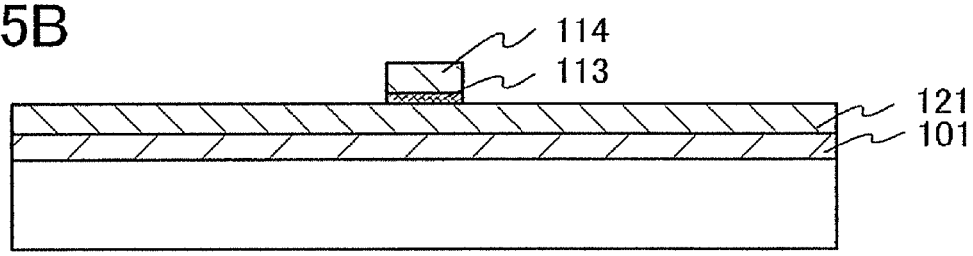

As a result, as illustrated in FIG. 5B, the adhesiveness of the peeling layer which has been irradiated with a laser beam is partially reduced. After that, by the removal method of Embodiment Mode 1, the peeling layer with reduced adhesiveness and the light-transmitting layer in contact with the peeling layer are removed.

Figure 5C:
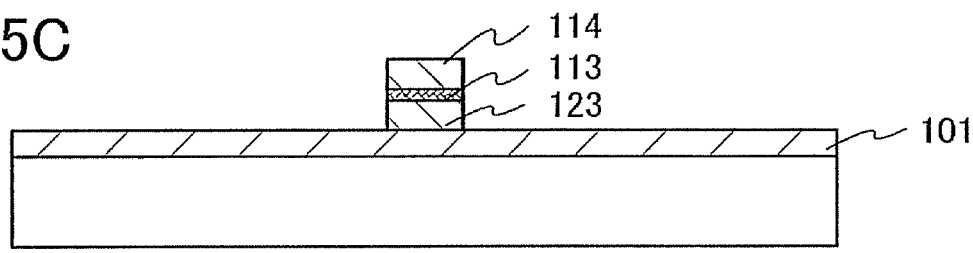

Next, as illustrated in FIG. 5C, similarly to Embodiment Mode 4, the first layer 121 is etched using the peeling layer 113 and the light-transmitting layer 114 which have been left, as a mask. Thus, a second layer 123 can be formed.

Figure 5D:
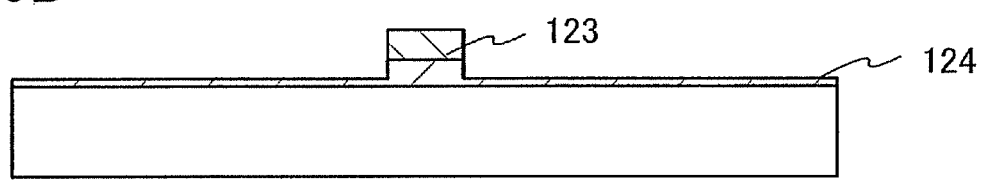

Then, as illustrated in FIG. 5D, the peeling layer 113 and the light-transmitting layer 114 may be etched to expose the second layer 123. The base layer 101 etched in etching the light-transmitting layer 115 is denoted by a base layer 124.

Through the above steps, without employing a photolithography process, a layer with a desired shape can be formed over a substrate. Further, since the light-transmitting layer having tensile stress is formed over the peeling layer, the peeling layer and the light-transmitting layer formed over the peeling layer can be removed without almost leaving residue. The adhesiveness of the peeling layer can be reduced by the lower energy and smaller number of shots of a laser beam.

Embodiment Mode 6

Embodiment Mode 5 will describe a process which can give more options of thicknesses and materials of the peeling layer and the first layer than the processes of Embodiment Modes 1 to 3, with reference to FIGS. 6A to 6D. In this embodiment mode, Embodiment Mode 3 is adopted for description.

Figure 6A:
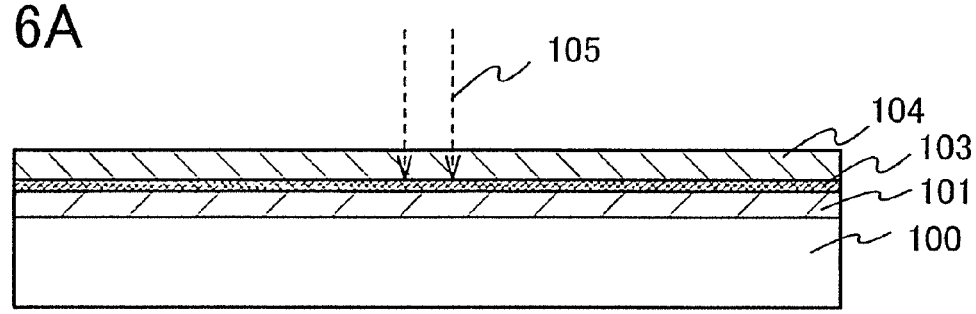
FIGS. 6A to 6D are cross-sectional views illustrating a manufacturing method of a semiconductor device according to an aspect of the present invention.

As illustrated in FIG. 6A, similarly to Embodiment Mode 1, the base layer 101 is formed over the substrate 100, and the peeling layer 103 is formed over the base layer 101. Then, the light-transmitting layer 104 is formed over the peeling layer 103.

In this embodiment mode, the substrate 100 and the base layer 101 are preferably formed using materials which can transmit a laser beam with which the peeling layer is irradiated later. The typical examples of the substrate 100 and the base layer 101 used in this embodiment mode may be the typical examples of the substrate 100 and the base layer 101 described in Embodiment Mode 2 as appropriate.

Then, at least the peeling layer 103 is irradiated with the laser beam 105, from the peeling layer 103 side, using the laser irradiation apparatus illustrated in Embodiment Mode 1 to reduce the adhesiveness of a part of the peeling layer 103. Here, the peeling layer 103 is irradiated with the laser beam in such a way that the peeling layer is not left in a region in which a first layer 133 to be formed later is to be left. In other words, the peeling layer 103 which overlaps a region in which a second layer 135 is formed later is irradiated with the laser beam. After that, the peeling layer with reduced adhesiveness, the light-transmitting layer in contact with the peeling layer, and the first layer 133 in contact with the light-transmitting layer are removed by the removal method illustrated in Embodiment Mode 1.

Figure 6B:
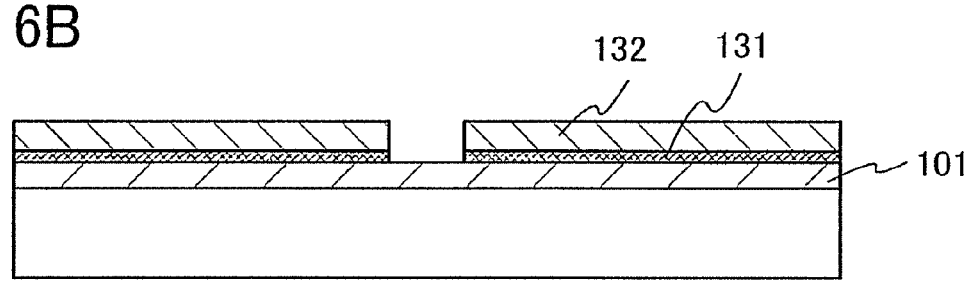

As a result, as illustrated in FIG. 6B, the peeling layer 131 and the light-transmitting layer 132 serving as masks can be formed in the region which is not irradiated with the laser beam 105.

Figure 6C:
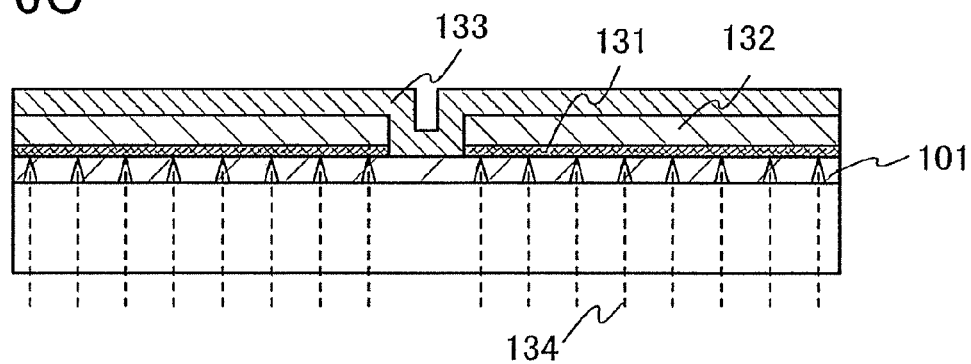
Figure 6D:
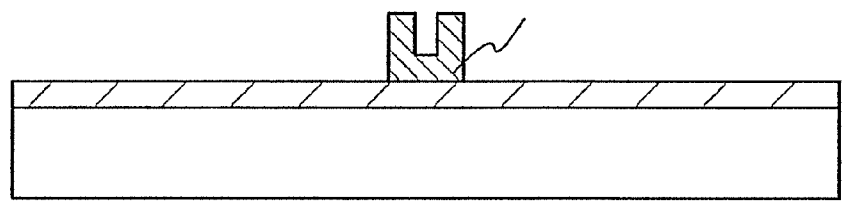

Then, as illustrated in FIG. 6C, a first layer 133 is formed over an exposed portion of the base layer 101, an exposed portion of the peeling layer 131 and the light-transmitting layer 132 serving as masks. The first layer 133 can be formed using the same material of the first layer 102 described in Embodiment Mode 1.

Then, at least the peeling layer 131 is irradiated with a laser beam 134 from the substrate 100 side to reduce the adhesiveness of the peeling layer 131. Then, the peeling layer 131 with reduced adhesiveness is removed by the removal method described in Embodiment Mode 1. In this moment, the first layer 133 in contact with the peeling layer 131 is also removed. In this manner, the second layer 135 can be formed.

Through the above steps, without employing a photolithography process, a layer with a desired shape can be formed over a substrate. Further, since the light-transmitting layer having tensile stress is formed over the peeling layer, the peeling layer and the light-transmitting layer formed over the peeling layer can be removed without almost leaving residue. The adhesiveness of the peeling layer can be reduced by the lower energy and smaller number of shots of a laser beam.

Embodiment 1

Embodiment 1 will describe an example of manufacturing a liquid crystal display device having a pixel electrode and a thin film transistor formed according to the thin film process described in the above embodiment modes, with reference to drawings. In this embodiment, a vertical alignment (VA) type liquid crystal device is shown. The VA-type liquid crystal is a kind of methods for controlling alignment of liquid crystal molecules of a liquid crystal panel. The VA-type liquid crystal is a method in which liquid crystal molecules are aligned in a vertical direction to a panel surface when no voltage is applied. In particular, in this embodiment, it is devised that a pixel is divided into some regions (sub-pixels) so that molecules are aligned in different directions in the respective regions. This is referred to as multi-domain or multi-domain design. In the following description, pixels of a liquid crystal panel which is subjected to the multi-domain design will be described in accordance with a manufacturing process. In addition, an inversely staggered type thin film transistor is employed as a semiconductor element which controlling voltage of a pixel electrode; however, a top gate type thin film transistor can be employed.

Figure 15:
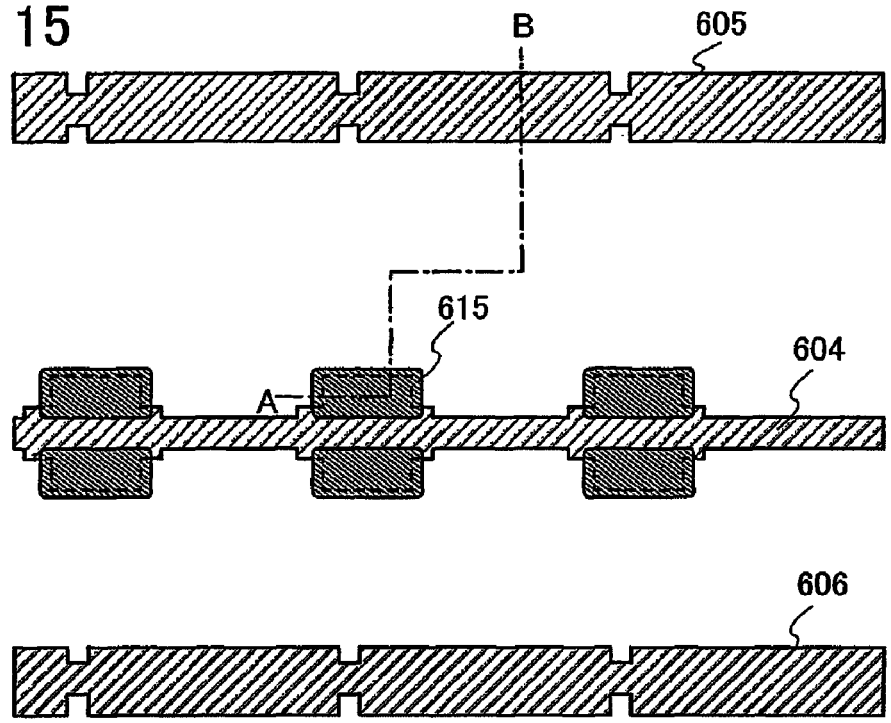
FIG. 15 is a top view illustrating a manufacturing method of a semiconductor device according to an aspect of the present invention.

FIGS. 9A to 9C, 10A, 10B and 15 illustrate steps of forming a gate electrode, a gate insulating layer, and a semiconductor layer. Note that FIG. 15 is a plane view, and FIG. 10B illustrates a cross-sectional structure taken along the line A-B shown in FIG. 15. The following description will be made with reference to these drawings.

A conductive layer 601 is formed over a substrate 600, a peeling layer 602 is formed over the conductive layer 601, and a light-transmitting layer 603 is formed over the peeling layer 602.

As the substrate 600, a non-alkaline glass substrate manufactured by a fusion method or a float method such as barium borosilicate glass, an alumino borosilicate glass, or an aluminosilicate glass, or a ceramic substrate can be used, and further a plastic substrate having heat resistance that can withstand a processing temperature of a manufacturing process, or the like can be used. Alternatively, a metal substrate such as a stainless steel alloy, having a surface provided with an insulating layer, may also be applied. Here, a glass substrate is used as the substrate 600.

The conductive layer 601 is formed with a metal such as titanium, molybdenum, chromium, tantalum, tungsten, or aluminum. Since the conductive layer 601 is used to form a gate electrode of a thin film transistor, a gate wiring, and a capacitor element, the conductive layer 601 is preferably formed using a low-resistant material. Aluminum is preferably used to reduce the resistance of the conductive layer 601; however, in this case, an aluminum layer is preferably sandwiched between layers which are formed of a refractory metal such as titanium, molybdenum, and/or tantalum. This is to prevent corrosion of aluminum and improve heat resistance thereof. In this embodiment, the conductive layer 601 is formed using molybdenum by a sputtering method.

The peeling layer 602 is formed using a material whose adhesiveness is reduced by laser irradiation. Typically, the materials and manufacturing method of the peeling layer 103 described in Embodiment Mode 1 can be employed as appropriate. Here, the surface of the conductive layer 601 is subjected to nitrous oxide plasma to form the peeling layer 602 which is made of molybdenum oxide and has a thickness of 1 to 10 nm.

For the light-transmitting layer 603, the materials and manufacturing method of the light-transmitting layer 104 described in Embodiment Mode 4 can be used as appropriate. Here, as the light-transmitting layer 603, a silicon nitride oxide layer having a thickness of 20 to 40 nm is formed by a plasma CVD method. Here, as the light-transmitting layer 603, the silicon nitride oxide layer having tensile stress is formed, and thus the light-transmitting layer can also be removed easily when the peeling layer is selectively removed later. Thus, yield can be increased. In addition, the energy and the number of shots in a later laser irradiation can be reduced. Further, improvement of throughput and cost reduction can be achieved.

Then, the peeling layer 602 and the conductive layer 601 are irradiated with a laser beam from the light-transmitting layer 603 side (through the light-transmitting layer 603) to partially reduce the adhesiveness of the peeling layer 602. After that, the peeling layer in the part having reduced adhesiveness and the light-transmitting layer formed over the peeling layer are removed. As a result, as illustrated in FIGS. 9A to 9C, light-transmitting layers 603a, 603b and the peeling layers 602a, 602b serving as masks are formed.

An excimer laser beam (wavelength: 308 nm) is used as the laser beam 607. The energy density of the laser beam 607 is 200 to 400 mJ/cm$^2$, the number of shots is 1 to 5, and the scanning speed is 10 to 20 mm/sec to irradiate the peeling layer 602 with the laser beam 607, so that the adhesiveness of the peeling layer can be reduced and also, the light-transmitting layer can be weakened.

By the laser irradiation, the adhesiveness of the peeling layer can be selectively reduced. The peeling layer with reduced adhesiveness is easily reduced. The left peeling layer can be used as a mask. In other words, the mask can be formed without a photolithography process.

Then, the conductive layer 601 is etched by using the light-transmitting layers 603a, 603b and the peeling layers 602a, 602b as masks. A mixture in which phosphoric acid, acetic acid, nitric acid, and pure water were mixed at the ratio by volume % of 85:5:5:5 is used to etch the conductive layer 601 by wet etching. Thus, as illustrated in FIG. 9C, conductive layers 604, 605 are formed. The conductive layer 604 serves as a gate electrode and a gate wiring, and the conductive layer 605 serves as a capacitor wiring 605.

The conductive layer 604 serves as a gate electrode at a position where the conductive layer overlaps the semiconductor layer. In other words, the conductive layer 604 serves as an electrode to apply a gate voltage, of a thin film transistor, which is one kind of field effect type thin film transistors.

Here, the conductive layer 604 is described as the gate wiring 604 for convenience, but includes a function of a gate electrode. In addition, the capacitor wiring 605 is formed from the same conductive layer. The capacitor wiring 605 forms one electrode of the capacitor element provided to hold a voltage applied to a pixel.

Then, the light-transmitting layers 603a, 603b and the peeling layers 602a, 602b are removed. The removal method of the light-transmitting layers 603a, 603b and the peeling layers 602a, 602b can be the removal method of the light-transmitting layer 104 and the peeling layer 103 described in Embodiment Mode 4 as appropriate. The light-transmitting layers 603a, 603b and the peeling layers 602a, 602b are irradiated with an excimer laser beam (wavelength: 308 nm) to reduce the adhesiveness of the peeling layers, and then washed by water to be removed.

Next, as illustrated in FIG. 10A, an insulating layer 610 is formed over the substrate 600, the gate electrode 604 and the capacitor wiring 605. The insulating layer 610 is preferably formed with a single layer of silicon nitride or a stacked layer of silicon nitride and silicon oxide by a sputtering method or a plasma CVD method. The insulating layer 610 serves as a gate insulating layer. In order to form a dense insulating film having less gate leakage current at low temperature, a rare gas such as argon is preferably included in a reactive gas so that the rare gas is mixed in the insulating film. In this embodiment, a stacked layer of silicon nitride and silicon oxide is formed by a CVD method.

Then, a semiconductor layer 611 is formed. The semiconductor layer 611 may be either crystalline or non-crystalline. Alternatively, the semiconductor layer 611 may be semi-amorphous.

Note that the semi-amorphous semiconductor is as follows. A semi-amorphous semiconductor is a semiconductor having an intermediate state between an amorphous structure and a crystalline structure (including single crystal and polycrystal) and a third state which is stable in free energy. Moreover, a semi-amorphous semiconductor includes a crystalline region with a short-range order and lattice distortion. Crystal grains having a diameter of 0.5 to 20 nm can be observed in at least a portion of a semi-amorphous film, and thus the semi-amorphous semiconductor is also referred to as a microcrystalline semiconductor. When the semiconductor layer 611 is semi-amorphous, the semiconductor layer 611 is formed by glow discharge decomposition (plasma CVD) of a gas containing silicon. As the gas containing silicon, $SiH_4$, $Si_2H_6$, $SiH_2Cl_2$, $SiHCl_3$, $SiCl_4$, $SiF_4$, or the like can be used. The gas containing silicon may be diluted with $H_2$, or $H_2$ and one or a plurality of kinds of rare gas elements selected from He, Ar, Kr, and Ne. The dilution ratio is 1:2 to 1:1000, pressure is approximately 0.1 to 133 Pa, and a power source frequency is 1 to 120 MHz, preferably, 13 to 60 MHz. A temperature for heating the substrate is preferably 300° C. or lower, more preferably, 100 to 250° C. It is preferable here that the concentration of impurities of atmospheric components such as oxygen, nitrogen, and carbon as impurity elements taken into the film mainly in deposition be $1\times10^{20}$ $cm^{-3}$ or lower. In particular, an oxygen concentration is preferably $5\times10^{19}/cm^3$ or lower, and more preferably, $1\times10^{19}/cm^3$ or lower. Note that the mobility of a thin film transistor formed using a semi-amorphous semiconductor is about 1 to 10 $m^2/Vsec$. In addition, such semi-amorphous semiconductors may be formed by a sputtering method.

As a specific example of a crystalline semiconductor layer, a layer formed of single-crystal or polycrystalline silicon, silicon germanium, or the like can be given. These may be formed by laser crystallization or may be formed by crystallization through a solid phase growth method using nickel or the like, for example.

In a case where the semiconductor layer of a thin film transistor is formed using an amorphous substance, for example, amorphous silicon, it is preferable that the thin film transistor and other thin film transistors (thin film transistors included in a circuit for driving a light-emitting element) are all n-channel thin film transistors to form a circuit. Other than the case, either n-channel thin film transistors or p-channel thin film transistors may be used to form a circuit, or both types of thin film transistors may be used to form a circuit.

The semiconductor layer 611 is preferably formed with hydrogenated amorphous silicon or hydrogenated microcrystalline silicon. A film of hydrogenated amorphous silicon or hydrogenated microcrystalline silicon is formed with a thickness of 100 to 250 nm by a plasma CVD method, using silane or disilane as a semiconductor material gas. The semiconductor layer 611 is formed to overlap with the gate wiring 604 with the first insulating layer 610 interposed therebetween. Further, a film of n-type hydrogenated amorphous silicon or microcrystalline silicon is formed with a thickness of 20 to 50 nm as an n-type semiconductor layer 612 by a plasma CVD method over the semiconductor layer 611 in order to form source and drain regions of a TFT.

A mask 613 is formed over the n-type semiconductor layer 612. At this time, a composition is selectively discharged by a droplet-discharge method, and baked to form a mask 613. The mask 613 is formed of polyimide.

Then, the semiconductor layer 611 and the n-type semiconductor layer 612 are etched, utilizing the mask 613. At this time, a mixed gas of fluorocarbon and oxygen is used as an etching gas. Through the above steps, as illustrated in FIG. 10B, a semiconductor layer 614 and an n-type semiconductor layer 615 are formed, The semiconductor layer 614 can be formed using an organic semiconductor. As the organic semiconductor, a π-electron conjugated high-molecular material whose skeleton includes conjugated double bonds is preferably used. Typically, a soluble high-molecular material such as polythiophene, polyfluorene, poly(3-alkylthiophene), or a polythiophene derivative can be used.

Figure 16:
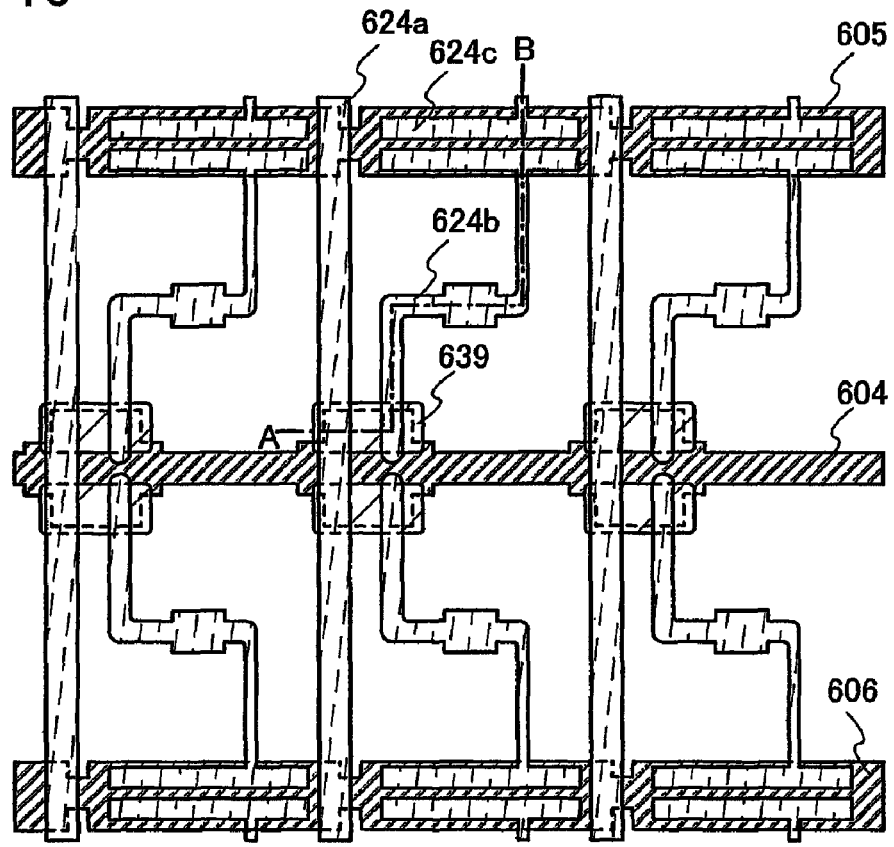
FIG. 16 is a top view illustrating a manufacturing method of a semiconductor device according to an aspect of the present invention.

FIG. 16 and FIGS. 11A to 11C illustrate steps of forming a wiring. Note that FIG. 16 is a plane view, and FIG. 11C illustrates a cross-sectional structure taken along the line A-B shown in FIG. 16. The following description will be made with reference to these figures.

Next, as illustrated in FIG. 11A, a conductive layer 622 is formed over the insulating layer 610, the semiconductor layer 614, and the n-type semiconductor layer 615. The conductive layer 622 is preferably formed using aluminum, or aluminum added with an element to improve heat resistance such as copper, silicon, titanium, neodymium, scandium or molybdenum, or an element to prevent a hillock. In addition, the conductive layer 622 may be formed by a screen printing method, an inkjet method or the like using a conductive nanopaste such as silver or copper. Note that a metal nitride layer or the like may be formed in order to increase the adhesiveness of the conductive layer 622 and to serve as a barrier metal for diffusion to the base layer.

A peeling layer 623 is formed over the conductive layer 622, and a light-transmitting layer 624 is formed over the peeling layer 623. The peeling layer 623 and the light-transmitting layer 624 can be formed using materials and by a formation method of the peeling layer 103 and the light-transmitting layer 104 described in Embodiment Mode 4. In this embodiment, as the conductive layer 622, a molybdenum layer having a thickness of 30 to 200 nm is formed by a sputtering method using a molybdenum target. As the peeling layer 623, the surface of the conductive layer 620 is subjected to nitrous oxide plasma to be oxidized, so that a molybdenum oxide layer having a thickness of 1 to 10 nm is formed. As the light-transmitting layer 624, a silicon nitride oxide layer having a thickness of 20 to 40 nm is formed by a CVD method. Since the silicon nitride oxide layer formed as the light-transmitting layer 624 has tensile stress, the light-transmitting layer 624 can be easily removed together with the peeling layer having reduced adhesiveness by laser irradiation.

Then, after the peeling layer 623 and the conductive layer 622 are irradiated with the laser beam 625 to reduce the adhesiveness of the peeling layer, the peeling layer with reduced adhesiveness is removed.

An excimer laser beam (wavelength: 308 nm) having a frequency of 30 Hz is used as the laser beam. The energy density of the laser beam is 200 to 400 mJ/cm$^2$, the number of shots is 1 to 5, and the scanning speed is 10 to 20 mm/sec to conduct laser irradiation, so that the adhesiveness of the peeling layer can be reduced and the light-transmitting layer can be weakened.

As a result, as illustrated in FIG. 11B, the peeling layers 623a, 623 b and the light-transmitting layers 624a, 624b serving as masks are formed. The irradiation of the laser beam 625 can reduce the adhesiveness of the peeling layers. Then, the peeling layers with reduced adhesiveness and the light-transmitting layers over the peeling layers are removed. At this moment, these layers are removed by washing with water. In this manner, the peeling layers 623a, 623 b and the light-transmitting layers 624a, 624b serving as masks can be formed.

Then the conductive layer 622 is etched with the peeling layers 623a, 623b and the light-transmitting layers 624a, 624b as masks. A mixture in which phosphoric acid, acetic acid, nitric acid, and pure water were mixed at the ratio by volume % of 85:5:5:5 is used to etch the conductive layer 622. Then, conductive layers 631 to 633 are formed, and then the n-type semiconductor layer 615 is etched using the conductive layers 631 to 633 as etching masks by using a mixed gas of fluorocarbon and oxygen.

In this manner, the conductive layers 631 to 633 are formed as illustrated in FIG. 11C. The conductive layer 631 is a data line which makes up matrix of a pixel portion, and the conductive layer 632 is a wiring to connect a TFT 668 and a pixel electrode 664.

The conductive layer 633 includes an overlapping part with a capacitor wiring 606 with the insulating layer 610 interposed therebetween. This overlapping part becomes a capacitor element in a pixel of the liquid crystal panel.

The conductive layer 631 and the conductive layer 632 are formed separately from each other, over the semiconductor layer 614. In etching, the semiconductor layer 614 is partially etched, so that the semiconductor layer becomes a semiconductor layer 639 serving as a channel forming region.

Figure 17:
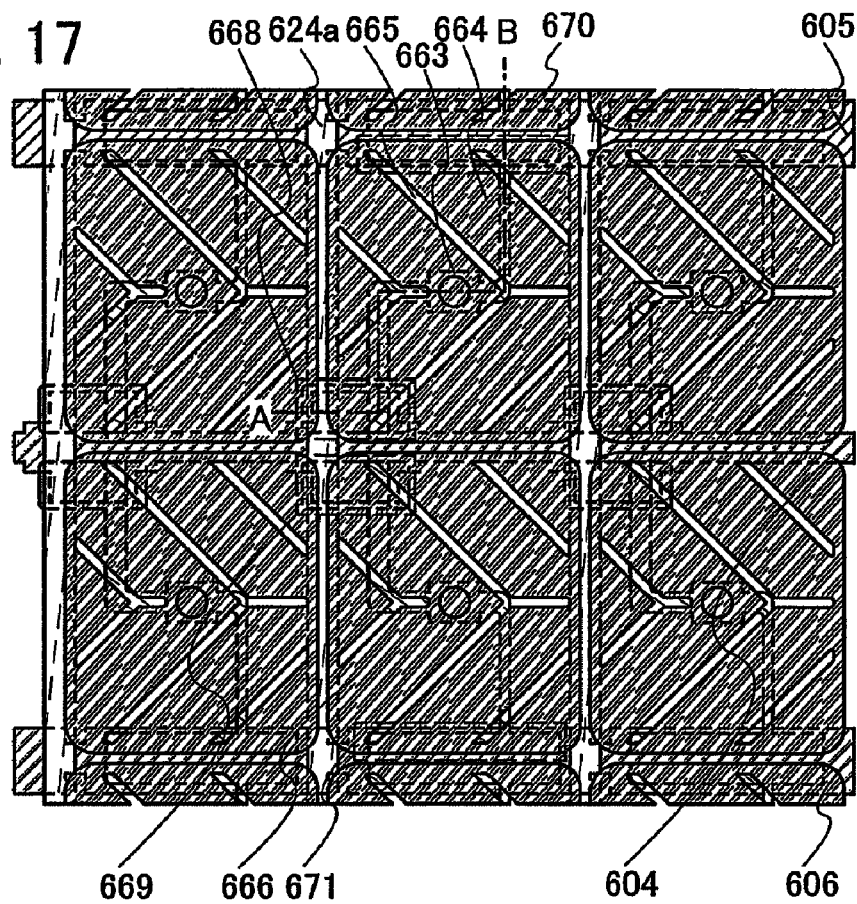
FIG. 17 is a top view illustrating a manufacturing method of a semiconductor device according to an aspect of the present invention.

FIGS. 12A, 12B, FIGS. 13A, 13B and FIG. 17 illustrate steps of forming a pixel electrode. FIG. 17 is a plan view and FIG. 13B illustrates the cross-sectional structure taken along the line A-B in FIG. 17. Description is made with reference to these drawings.

Figure 12A:
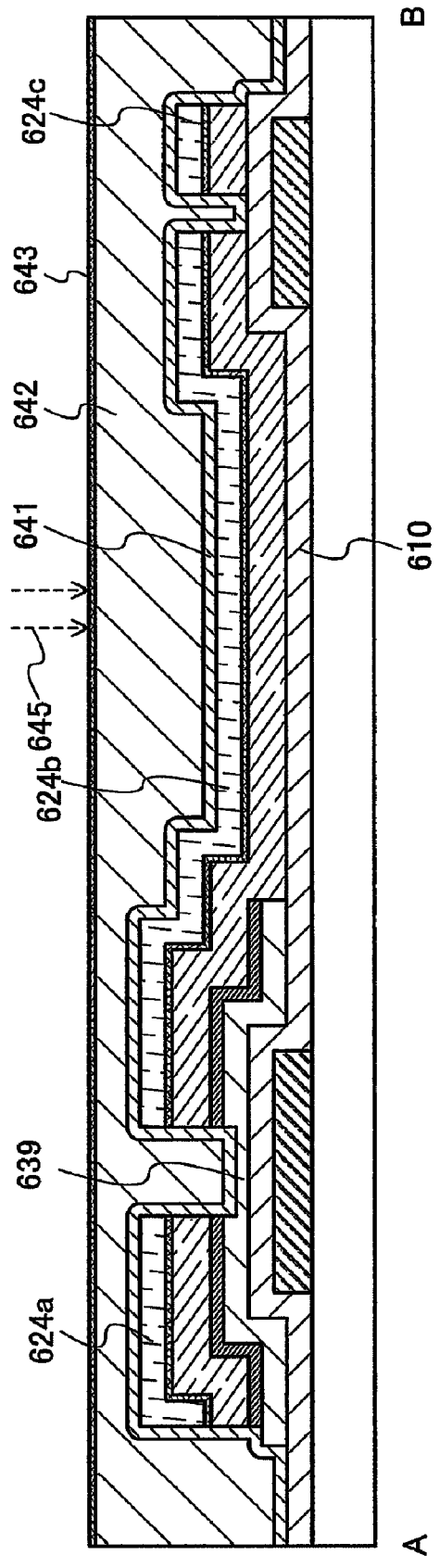
FIGS. 12A and 12B are cross-sectional views illustrating a manufacturing method of a semiconductor device according to an aspect of the present invention.

As illustrated in FIG. 12A, an insulating layer 641 is formed over light-transmitting layers 624a to 624c, the insulating layer 610 and the semiconductor layer 639. Over the insulating layer 641, an insulating layer 642 is preferably formed to planarize the surface. As illustrated in FIG. 12A, the insulating layer 641 and the insulating layer 642 are stacked; however a single layer of either the insulating layer 641 or the insulating layer 642 may be employed.

The insulating layer 641 can be formed using a material selected from a silicon nitride oxide film containing a larger amount of nitrogen than oxygen, a silicon oxynitride film containing a larger amount of oxygen than nitrogen, aluminum nitride, aluminum oxynitride, aluminum nitride oxide containing a larger amount of nitrogen than oxygen, aluminum oxide, diamond-like-carbon (DLC), a carbon film containing nitrogen, a silicon nitride film containing argon, or another substance containing an inorganic insulating material.

The insulating layer 642 is preferably a layer having excellent flatness formed by a coating method. As the insulating layer 642, polyimide, acrylic, polyamide, polyimide amide, resist or benzocyclobutene, polysilazane, or siloxane resin can be used, typically. Note that there are no particular limitations on substances forming the layers, and any material can be used, as well as the above-mentions materials. Further, a layer formed of any substance other the above materials may be combined.

Silicon nitride or silicon nitride oxide having a thickness of 50 to 200 nm is formed by a plasma CVD method as the insulating layer 641. When the insulating layer 641 is formed of such a layer, the insulating layer 641 functions as a protective layer to prevent contamination of the insulating layer 639. In addition, the insulating layer 641 also has a function of insulating the conductive layers 631, 632 from the pixel electrode. The insulating layer 642 is formed of polyimide having a thickness of 200 to 1000 nm by application and baking of a composition. Since the insulating layer 642 is formed as a planarizing film between the pixel electrode 664 and the conductive layers 631, 632, the area of the pixel electrode 664 to be formed later can be increased, so that the aperture can also increased.

Figure 12B:
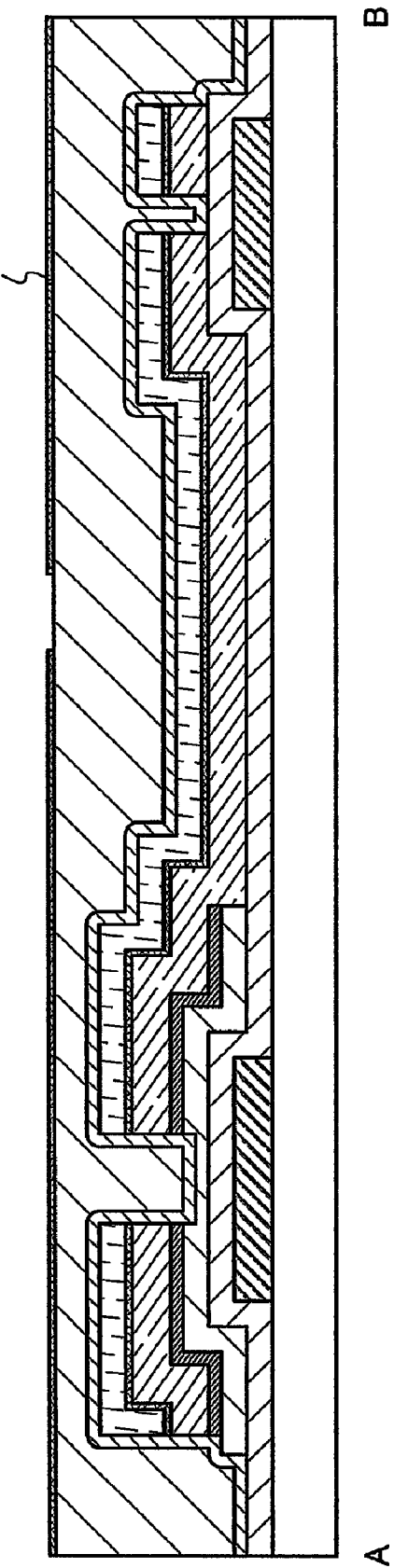

A peeling layer 643 is formed over the insulating layer 642. The peeling layer 643 can be formed in the same way as the peeling layer 103 described in Embodiment Mode 1. A tungsten oxide layer having a thickness of 1 to 10 nm is formed as the peeling layer 643 by a reactive sputtering method in which a tungsten target is sputtered by oxygen plasma. Then, the peeling layer 643 is partially irradiated with the laser beam 645 to reduce the adhesiveness in a part of the peeling layer. As the laser beam, an excimer laser beam (wavelength: 308 nm) is employed. Then, the peeling layer with reduced adhesiveness is removed. In this case, the peeling layer with reduced adhesiveness is removed by washing with water. As a result, as illustrated in FIG. 12B, a part of the peeling layer is left. The peeling layer left at this time is denoted by a peeling layer 643a.

Then as illustrated in FIG. 13A, the insulating layer 642 is etched as the peeling layer 643a as a mask to form an insulating layer 651. At this time, dry etching is employed to etch the insulating layer 642. Then, the insulating layer 641 is etched by using the insulating layer 651 as a mask to form an insulating layer 652. The light-transmitting layer 624b is etched to form a light-transmitting layer 653. As an etchant at this time, a mixed solution of ammonium hydrogen fluoride and ammonium fluoride is used to etch the light-transmitting layer 624b. Further, the peeling layer 623b is etched to form a peeling layer 654. As an etchant at this time, a hydrofluoric acid solution is used to etch the peeling layer 654 by wet etching. A part of the conductive layer 632 is exposed. Through the above steps, an opening portion 663 is formed.

Then, a conductive layer 655 is formed over the peeling layer 643a and in the opening portion 663. The conductive layer 655 is formed using a conductive material having a light-transmitting property. In this case, ITO having a thickness of 50 to 150 nm is formed as the conductive layer 655 by a sputtering method. Then, the peeling layer 643a and the conductive layer 655 are selectively irradiated with a laser beam 656 to reduce the adhesiveness in a part of the peeling layer. As the laser beam 656, an excimer laser (wavelength: 308 nm) is used for laser irradiation. Then, the peeling layer with reduced adhesiveness and the conductive layer 655 formed thereover are removed by washing with water. In this manner, the pixel electrode is formed as illustrated in FIG. 13B. At this time, the peeling layer 661 is partially left.

The pixel electrode 664 is formed over the peeling layer 661. In addition, the peeling layer 661 has thin enough to transmit visible light, and thus may be stacked with the pixel electrode 664. The pixel electrode 664 is connected to the conductive layer 632 in the opening portion 663 penetrating the insulating layers 652, 642. The pixel electrode 664 can be formed, having a thickness of 50 to 100 nm.

When the conductive layer 655 is removed, the conductive layer 655 is selectively irradiated with a laser beam such that a slit 665 is provided in the pixel electrode 664. In this embodiment, since a thin film can be processed by selective laser irradiation, a minute process can be easily conducted. Thus, the options of shapes and materials of a thin film to be processed can be made broader. Note that the slit 655 controls alignment of liquid crystals.

In this manner, the TFT 668, the pixel electrode 664 connected to the TFT 668, and a capacitor element 670 are formed over the substrate 600. Similar to those are a TFT 669, a pixel electrode connected to the TFT 669, and a capacitor element 671 illustrated in FIG. 17. The TFTs 668 and 669 are both connected to the wiring 631. A pixel of this liquid crystal panel includes the pixel electrodes 664 and 666. The pixel electrodes 664 and 666 are sub-pixels.

Figure 19:
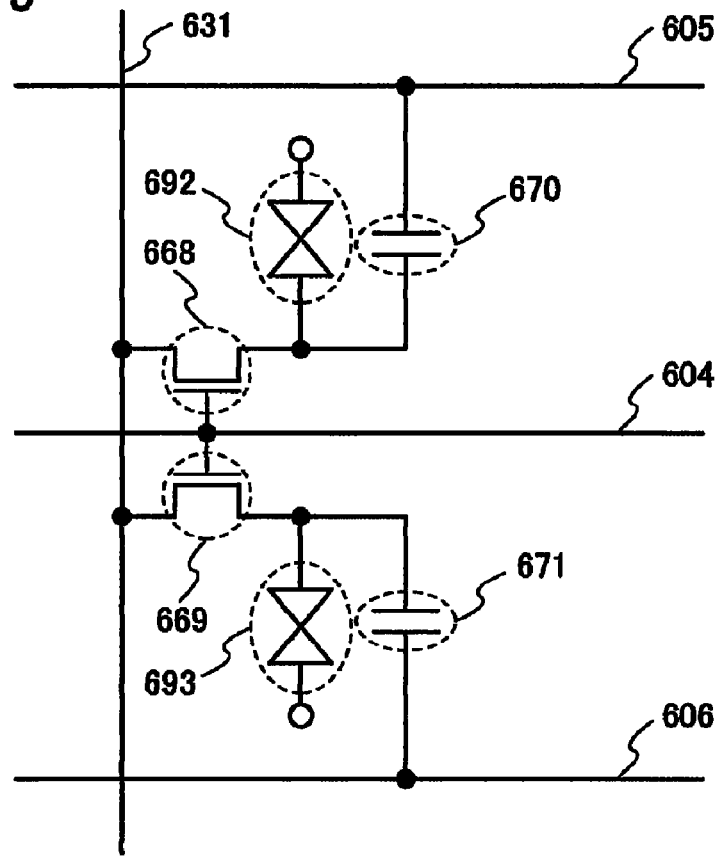
FIG. 19 is a cross-sectional view of an equivalent circuit which can be applied to the present invention.

FIG. 19 illustrates an equivalent circuit of this pixel configuration. Both the TFTs 668 and 669 are connected to the gate wiring 604 and the wiring 631. In this case, the potential of the capacitor wiring 605 is made different from that of the capacitor wiring 606, and thereby an operation of a liquid crystal element 692 can be made different from that of a liquid crystal element 693. Specifically, potentials of the capacitor wirings 604 and 605 is individually controlled, and thereby alignment of liquid crystals is precisely controlled to increase a viewing angle.

Figure 18:
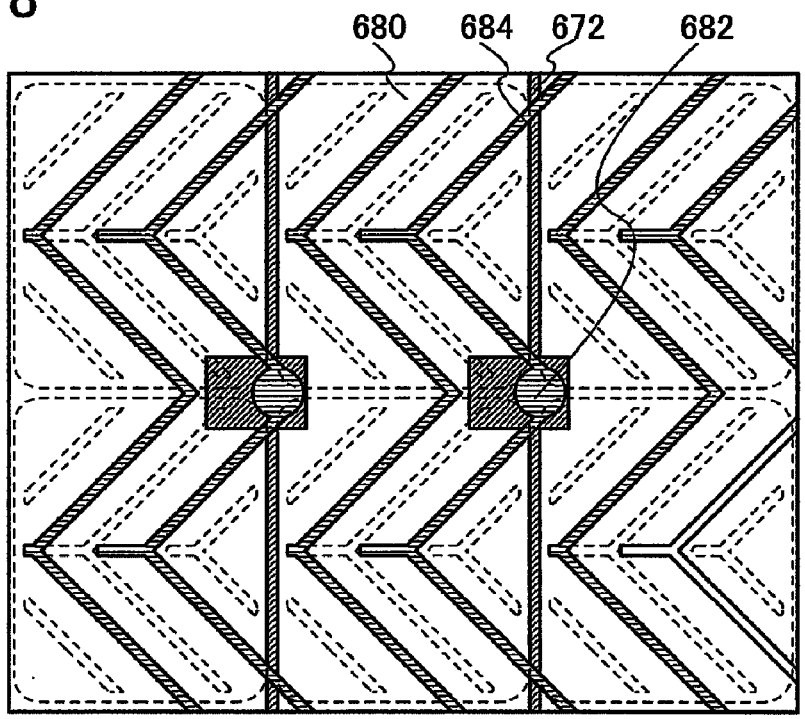
FIG. 18 is a top view illustrating a manufacturing method of a semiconductor device according to an aspect of the present invention.

FIG. 18 illustrates a structure on an opposite substrate side. A light-shielding layer 672 is provided with an opposite electrode 680. The opposite electrode 680 is formed with a transparent conductive film such as indium oxide, indium tin oxide, or zinc oxide. A projection 684 that controls alignment of liquid crystals is formed over the opposite electrode 680. Moreover, a spacer 682 is formed in accordance with the position of the light-shielding layer 672.

Figure 14:
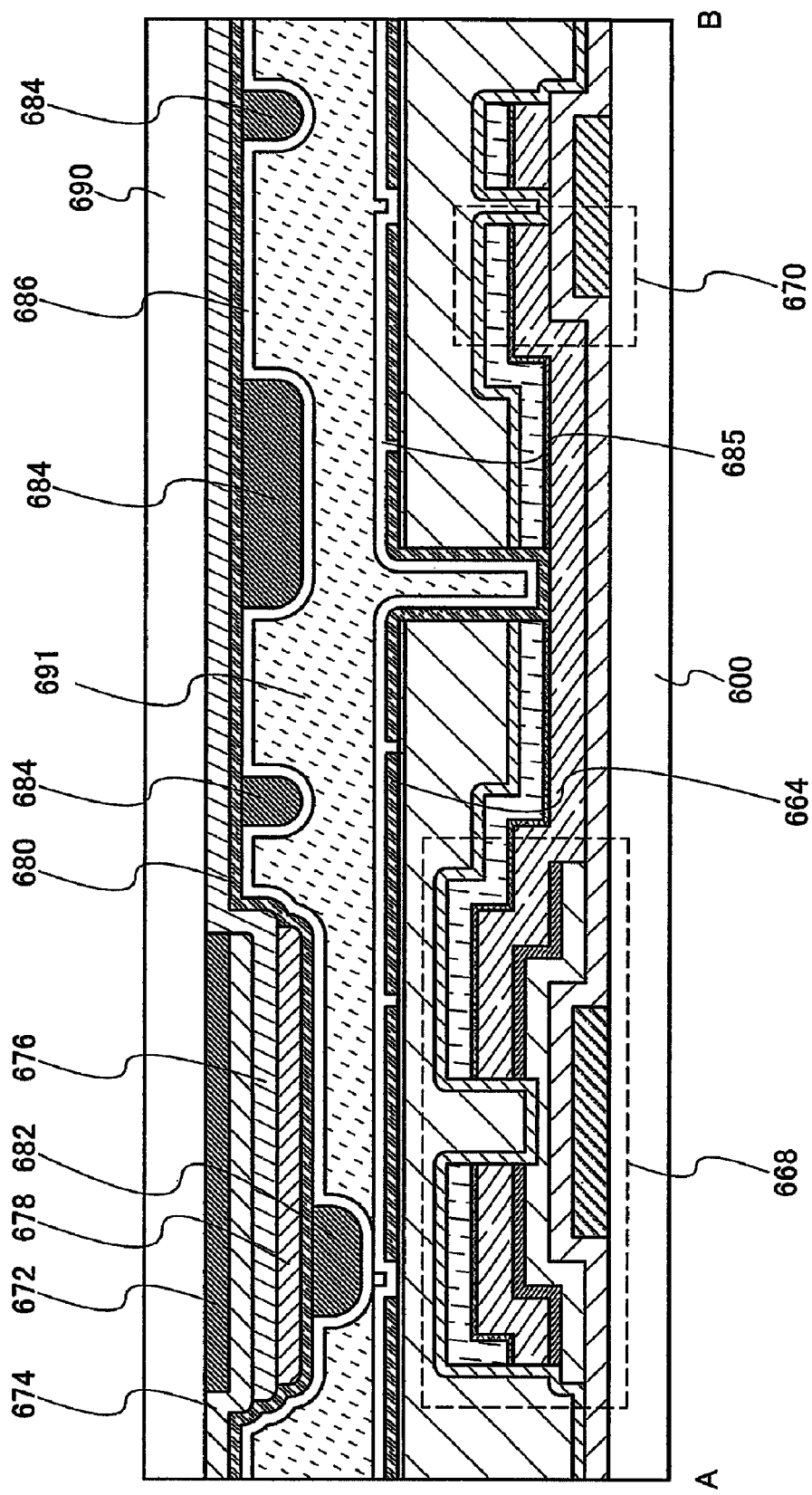
FIG. 14 is a cross-sectional view illustrating a manufacturing method of a semiconductor device according to an aspect of the present invention.

FIG. 14 illustrates a state where the substrate 600, over which the TFT 668, the pixel electrode 664 connected to the TFT 668, and the capacitor element 670 are formed, is stacked with an opposite substrate 690 provided with the opposite electrode 680 and the like, and liquid crystals are injected therebetween. In the position of the opposite substrate 690 where the spacer 682 is formed, the light-shielding layer 672, a first colored layer 674, a second colored layer 676, a third colored layer 678, and the opposite electrode 680 are formed. With this configuration, the height of the projection 684 to control alignment of liquid crystals is made different from that of the spacer 682. An alignment film 685 is formed over the pixel electrode 664, and the opposite electrode 680 is similarly provided with an alignment film 686. A liquid crystal layer 691 is formed between the alignment films 686 and 685.

Figure 20:
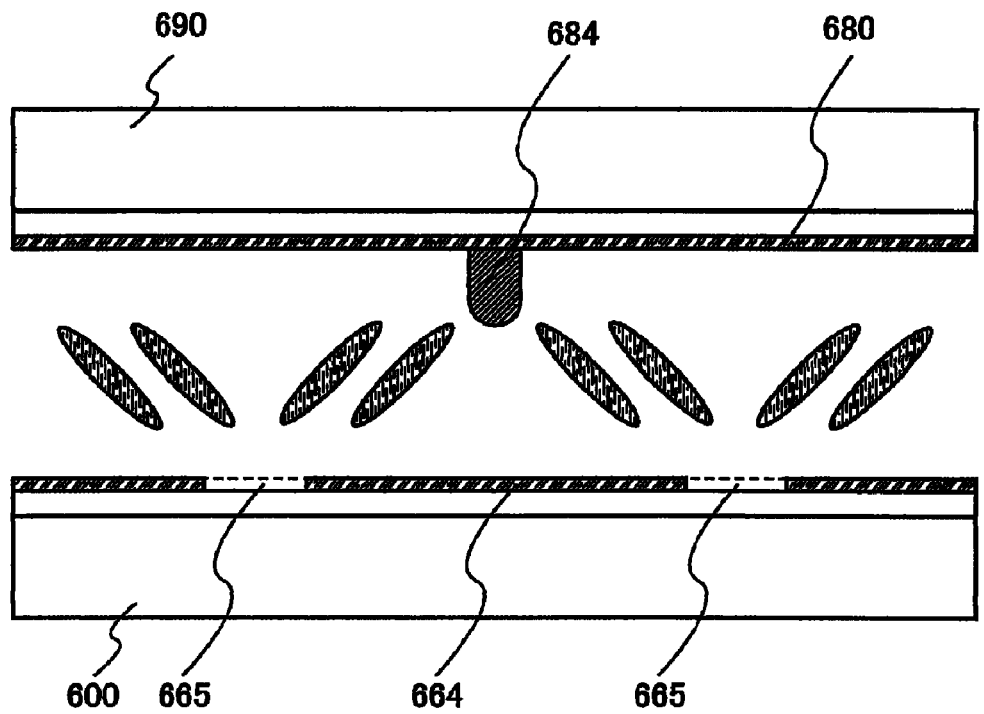
FIG. 20 is a cross-sectional view illustrating a semiconductor device according to an aspect of the present invention.

FIG. 20 illustrates an operation of a liquid crystal panel having such a pixel configuration. When a voltage is applied to the pixel electrode 664 provided with the slit 665, distortion of an electric field (an oblique electric field) is generated in the vicinity of the slit 665. This slit 665 and the projection 684 on the side of the opposite substrate 690 are disposed so as to be alternately engage with each other and an oblique electric field is generated effectively to control alignment of liquid crystals, and thus the direction in which liquid crystals are aligned is made different by location. Specifically, the viewing angle of a liquid crystal panel is increased by multi-domain.

In accordance with the present invention, components such as wirings to constitute a display device can be formed to have desired shapes. Without a complex photolithography process, a liquid crystal display device can be manufactured by a simplified process, and thus the loss of materials can be suppressed and reduction of cost can be achieved. The peeling layer can be selectively irradiated with a laser beam to form a mask and a thin film can be processed by using the mask. Thus, by controlling the size of the laser beam in forming the mask, the mask can be easily processed into a minute shape. Therefore, the options for shapes of a thin film to be processed can be broadened. Accordingly, a high-definition liquid crystal display device can be manufactured with excellent yield.

Embodiment 2

Embodiment 2 will describe an example of manufacturing a liquid crystal display device having a pixel electrode and a thin film transistor formed according to the thin film process described in the above embodiment modes, with reference to the drawings. In this embodiment, a twisted nematic (TN) liquid crystal is shown as another mode of a liquid crystal display device.

FIGS. 21A to 21E, FIGS. 22A to 22D and FIG. 23 illustrate a pixel configuration of a TN type liquid crystal panel. FIGS. 21A to 21E illustrates steps of forming a semiconductor layer, a light-shielding layer, a gate wiring and a capacitor wiring.

Figure 21A:
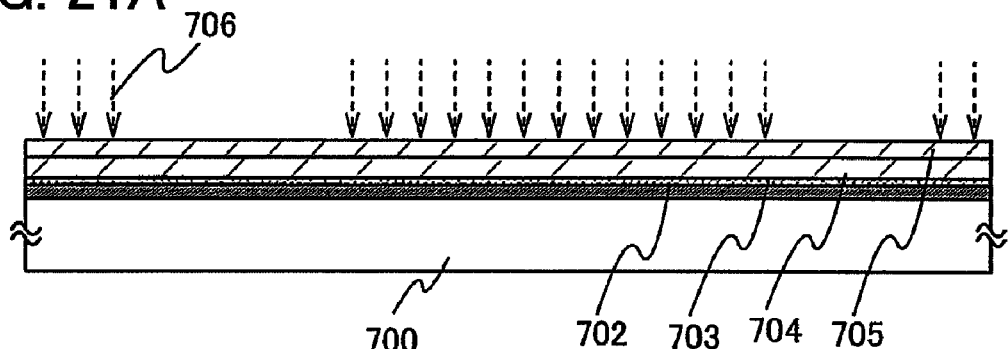
FIGS. 21A to 21E are cross-sectional views illustrating a manufacturing method of a semiconductor device according to an aspect of the present invention.

As illustrated in FIG. 21A, a conductive layer 702 is formed over a substrate 700, a peeling layer 703 is formed over the conductive layer 702, an insulating layer 704 is formed over the peeling layer 703, and a semiconductor layer 705 is formed over the insulating layer 704.

As the substrate 700, the substrate 600 described in Example 1 can be used as appropriate. The conductive layer 702 functions as a light-shielding layer to prevent the semiconductor layer of a thin film transistor to be formed later, from being subjected to light, and thus is formed using a material having a light-shielding property, typically, a molybdenum layer, a titanium layer, a tungsten layer, a chromium layer, a titanium nitride layer or the like having a thickness of 50 to 500 nm. As the conductive layer 702 in this embodiment, a molybdenum layer having a thickness of 100 to 300 nm is formed by a sputtering method.

The insulating layer 704 is provided to prevent impurities from entering the semiconductor layer of the thin film transistor to be formed later, from the substrate 700. As typical examples of the insulating layer 704, silicon oxide, silicon nitride, silicon oxynitride, aluminum nitride and the like are given. In this embodiment, a silicon oxynitride layer having a thickness of 50 to 200 nm is formed as the base layer 101.

As the semiconductor layer 705, the materials and the manufacturing method of the semiconductor layer 611 described in Embodiment 1 can be used as appropriate. In this embodiment, an amorphous silicon layer having a thickness of 50 to 100 nm is formed by a plasma CVD method, and then irradiated with an excimer laser beam to be crystallized, so that a crystalline silicon layer is formed.

Then, the peeling layer 703 and the conductive layer 702 are irradiated with the laser beam 706 from the semiconductor layer 705 side. In this embodiment, since a wavelength of visible light passes through the semiconductor layer 705 and the insulating layer 704 and is absorbed by the peeling layer 703 and the conductive layer 702, an excimer laser beam (wavelength: 308 nm) is used. At this time, the energy density of the laser beam is 150 to 300 mJ/cm$^2$, preferably 200 to 250 mJ/cm$^2$, the number of shots is 1 to 5, and the scanning speed is 50 to 200 mm/sec for the laser irradiation. Thus, the adhesiveness of the peeling layer can be reduced to weaken the light-transmitting layer. Then, the peeling layer with reduced adhesiveness, the insulating layer formed over the peeling layer and the semiconductor layer are removed. At this time, the peeling layer with reduced adhesiveness is removed by washing with water.

Figure 21B:
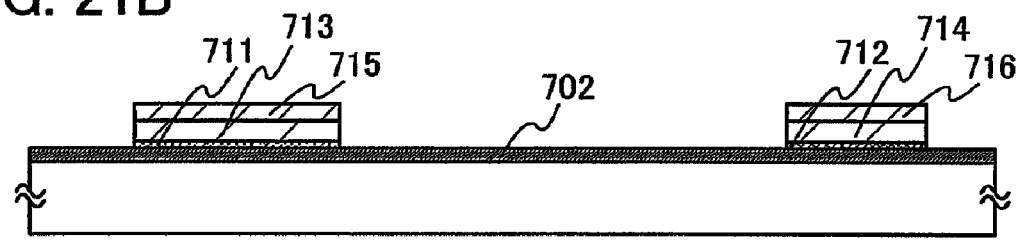
Figure 21C:
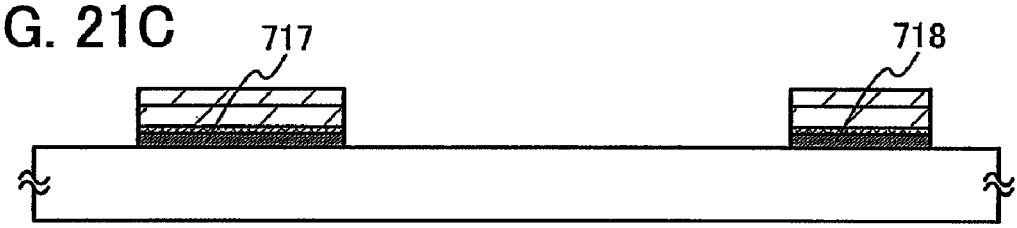

As a result, as illustrated in FIG. 21B, a stacked layer of the peeling layer 711, the insulating layer 713 and the semiconductor layer 715 and a stacked layer of the peeling layer 712, the insulating layer 714 and the semiconductor layer 716 are left. Then, the conductive layer 702 is etched using the stacked layers as masks. A mixed acid solution in which phosphoric acid, acetic acid, nitric acid, and pure water were mixed at the ratio by volume % of 85:5:5:5 is used to etch the conductive layer 702 by wet etching. Thus, as illustrated in FIG. 21C, conductive layers 717, 718 which are separated from each other are formed.

Then, a mask is formed over a semiconductor layer 716 by a droplet discharge method and phosphorus is added to the semiconductor layer 716, so that conductivity is added to the semiconductor layer 716 which functions as a capacitor electrode later.

Figure 21D:
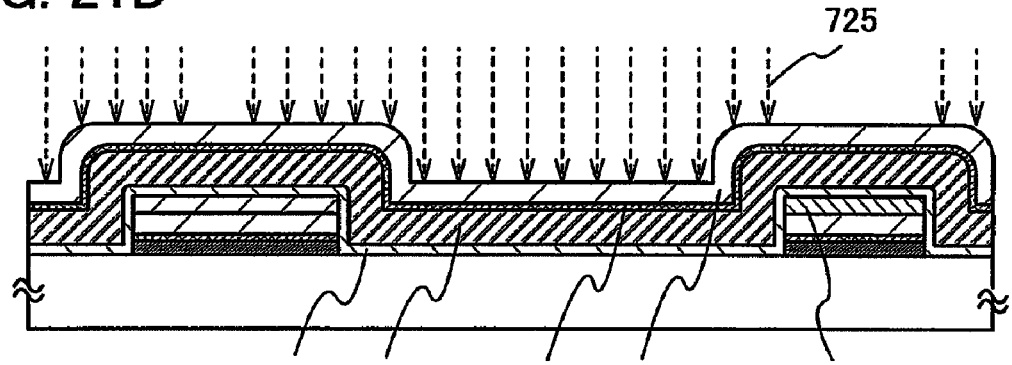

Then as illustrated in FIG. 21D, an insulating layer 721 is formed to cover exposed portions of the substrate 700, the conductive layers 717, 718, the peeling layers 711, 712, the insulating layers 713, 714, and the semiconductor layers 715, 716; a conductive layer 722 is formed over the insulating layer 721; a peeling layer 723 is formed over the conductive layer 722; and a light-transmitting layer 724 is formed over the peeling layer 723.

The insulating layer 721 serves as a gate insulating layer of the thin film transistor. Thus, the insulating layer 721 can be formed similar to the insulating layer 610 in Embodiment 1. As the insulating layer 721, a silicon oxide layer containing nitrogen having a thickness of 50 to 150 nm is formed by a plasma CVD method.

The conductive layer 722 is a conductive layer which forms a gate electrode of the thin film transistor, a gate wiring and a capacitor wiring. Thus, the conductive layer 722 can be formed similar to the conductive layer 601 in Embodiment 1. The conductive layer 722 is formed of a molybdenum layer having a thickness of 300 to 500 nm by a sputtering method in this embodiment.

The peeling layer 723 can be formed similar to the peeling layer 602 in Embodiment 1. At this time, the surface of the conductive layer 722 is subjected to nitrous oxide plasma to form a molybdenum oxide layer having a thickness of 1 to 10 nm as the peeling layer 723.

The light-transmitting layer 724 can be formed in a similar manner to the light-transmitting layer 603 in Example 1. As the light-transmitting layer 724, a silicon nitride oxide layer having tensile stress is formed. The thickness of the light-transmitting layer 724 is 20 to 40 nm.

Figure 21E:
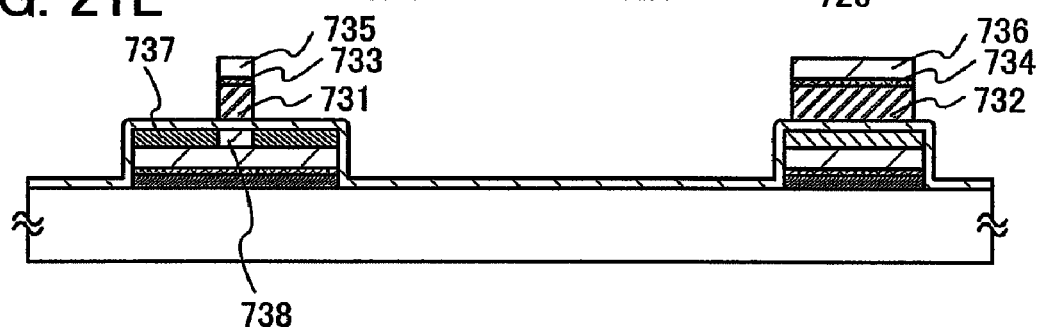

Then, a laser beam 725 is emitted. At this time, the light-transmitting layer 724, the conductive layer 722 and the peeling layer 723 are irradiated with a laser beam to selectively reduce the adhesiveness of the peeling layer. Then, the peeling layer with reduced adhesiveness and the light-transmitting layer formed thereover are selectively removed. The conductive layer 722 is etched by using the peeling layer and the light-transmitting layer formed thereover as a mask. In this manner, as illustrated in FIG. 21E, the conductive layers 731, 732, the peeling layer 733, 734 and the light-transmitting layers 735, 736 are left.

The peeling layers 733, 734 are irradiated with a laser beam to reduce the adhesiveness of the peeling layers, and the peeling layers and the light-transmitting layers formed thereover are removed, so that only the conductive layers 731, 732 are left over the insulating layer 721. Note that the conductive layer 731 functions as a gate electrode and/or a gate wiring, and the conductive layer 732 functions as a capacitor wiring. In this embodiment, the conductive layer 731 is referred to as a gate wiring 731 for description, but the conductive layer 731 also has a function of gate electrode. In addition, a capacitor wiring 732 is formed using the same layer as the gate wiring 731. The capacitor wiring 732 forms one electrode of a storage capacitor to hold voltage applied to a pixel.

Then, phosphorus, boron or the like is added to the semiconductor layer 715 to form source and drain regions 737 and a channel forming region 738.

FIGS. 22A to 22D illustrate steps of a pixel electrode. FIGS. 22A to 22D illustrate cross-sectional structures taken along the sectioning line A-B. Description will be made with reference to these drawings.

Figure 22A:
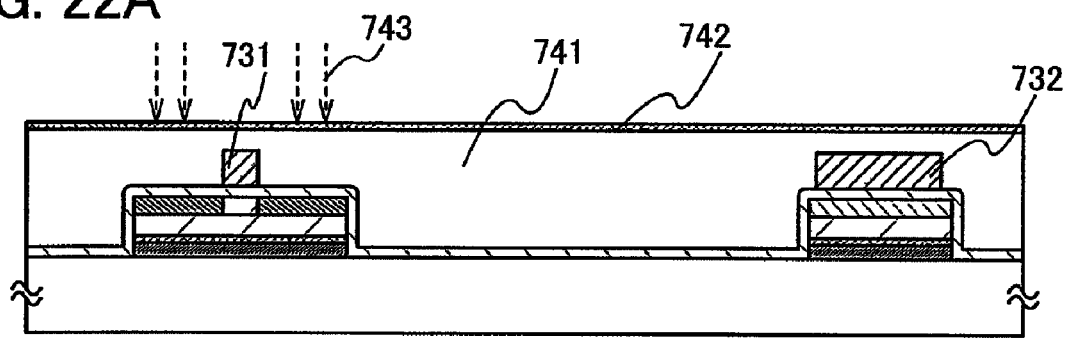
FIGS. 22A to 22D are cross-sectional views illustrating a manufacturing method of a semiconductor device according to an aspect of the present invention.

As illustrated in FIG. 22A, an insulating layer 741 is formed over the conductive layer 731, the conductive layer 732 and the insulating layer 721. The insulating layer 741 is preferably formed from a stacked layer of an insulating film of silicon nitride or silicon nitride oxide and an insulating layer to planarize the surface. In this embodiment, as in Embodiment 1, by a plasma CVD method, silicon nitride or silicon nitride oxide having a thickness of 50 to 200 nm is formed and a polyimide layer having a thickness of 200 to 1000 nm is formed thereover.

Figure 22B:
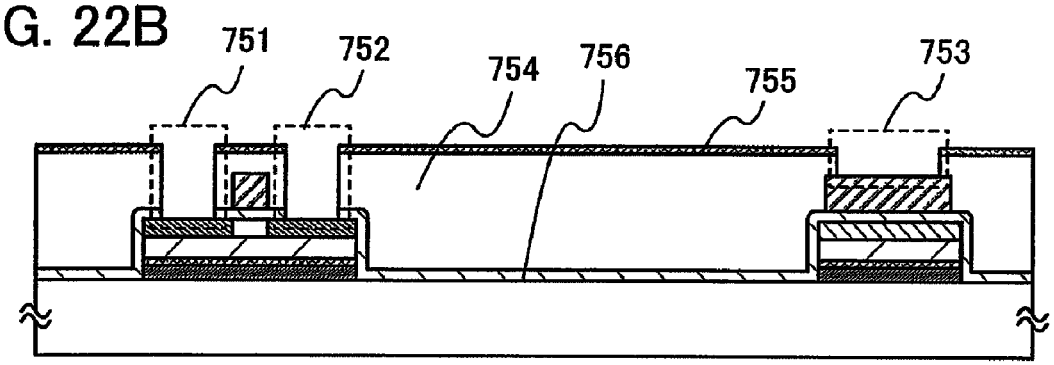

A peeling layer 742 is formed over the insulating layer 741. The peeling layer 742 can be formed in a similar way to the peeling layer 602 in Embodiment 1. Then, a part of the peeling layer 742 is irradiated with a laser beam 743 to reduce the adhesiveness of the part of the peeling layer, and then the peeling layer in the part with reduced adhesiveness is removed. As illustrated in FIG. 22B, the peeling layer which is left at this time is denoted by a peeling layer 755.

Then, the insulating layer 741 is etched by using the peeling layer 755 as a mask to form an insulating layer 754. Through the step, an opening 753 is formed. By using the insulating layer 754 as a mask, the insulating layer 721 is etched to form an insulating layer 756 and expose a part of the semiconductor layer 715. Through the step, opening portions 751, 752 are formed.

An etchant having high etching selectivity between the peeling layer 755 and the insulating layer 741 is used, and thus a light-transmitting layer is not formed over the peeling layer 755. However, when the etching selectivity between the peeling layer 755 and the insulating layer 741 is low, a light-transmitting layer may be provided over the peeling layer 755.

Figure 22C:
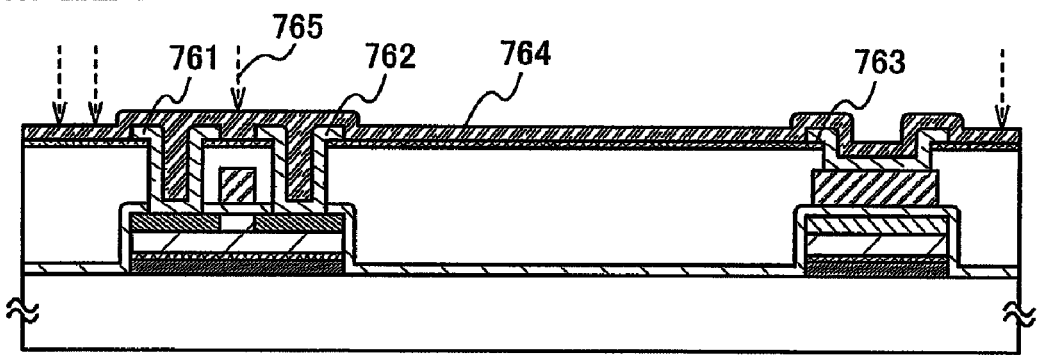

Then, as illustrated in FIG. 22C, conductive layers 761 to 763 are formed over the peeling layer 755 and the opening portions 751 to 753. As the conductive layers 761 to 763, a composition containing silver particles is discharged and heated to form the conductive layers 761 to 763.

Figure 22D:
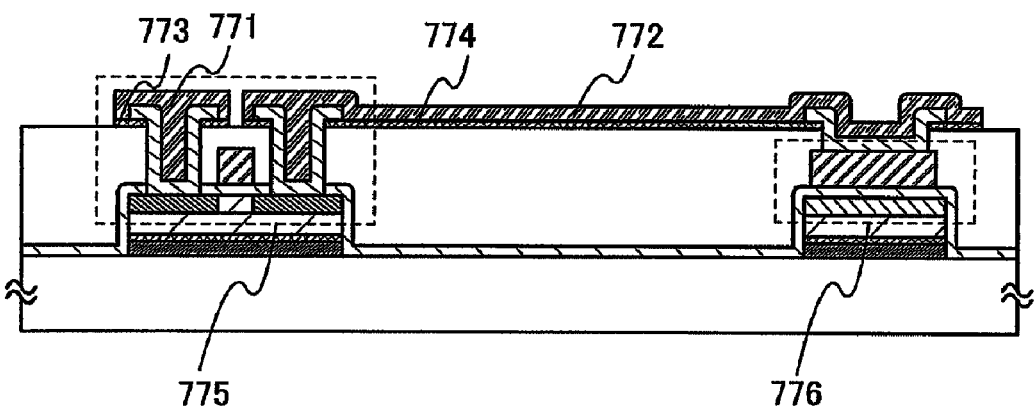
Figure 23:
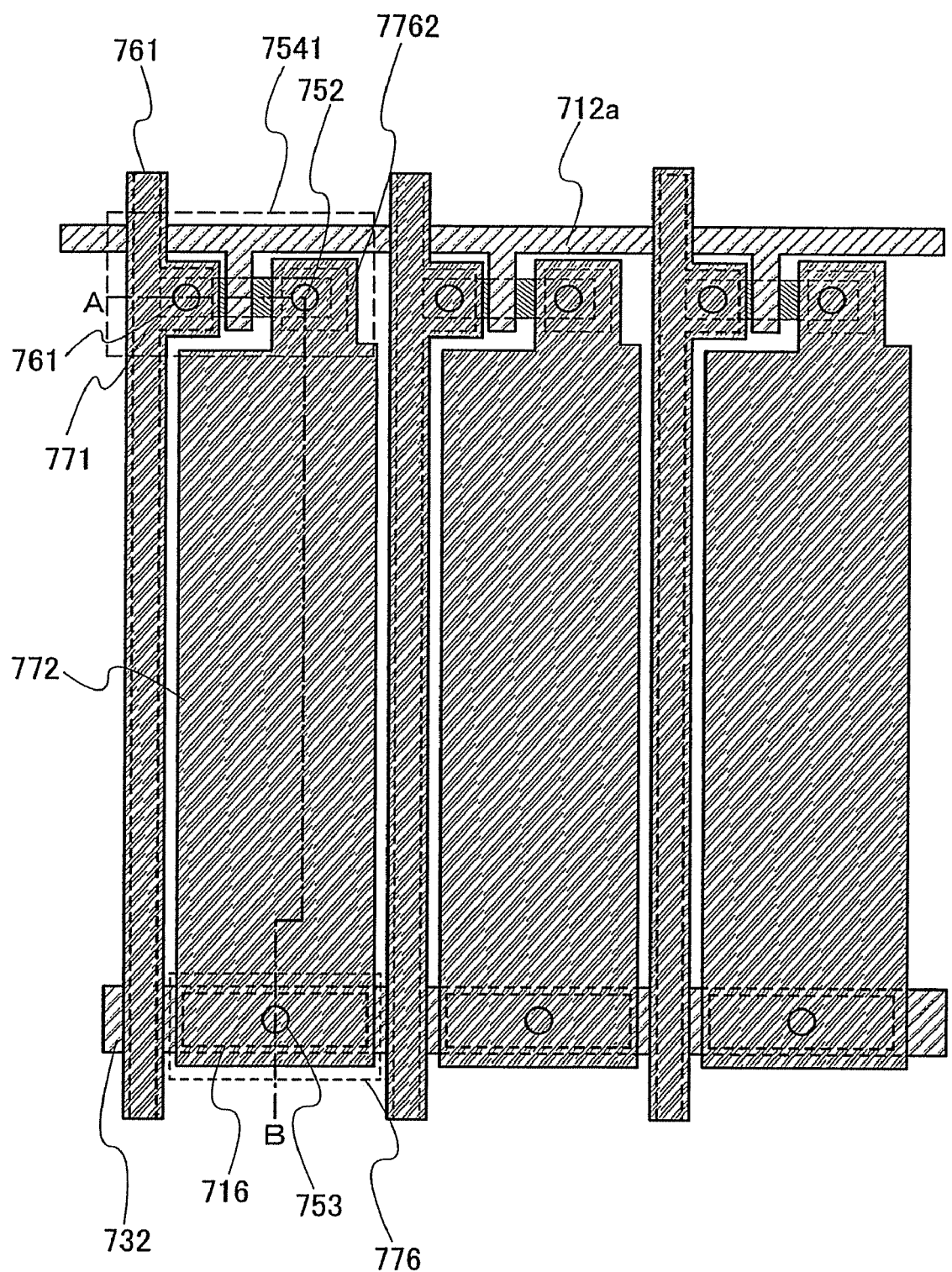
FIG. 23 is a top view illustrating a manufacturing method of a semiconductor device according to an aspect of the present invention.

A conductive layer 764 is formed over the conductive layers 761 to 763 and the peeling layer 755. In this embodiment, ITO having a thickness of 50 to 150 nm is formed as the conductive layer 764 by a sputtering method. Then, the conductive layer 764 is selectively irradiated with a laser beam 765 to selectively reduce the adhesiveness of the peeling layer 755, and the peeling layer with reduced adhesiveness and the conductive layer 764 are selectively removed. As the laser beam 765, an excimer laser is adopted. In this manner, as illustrated in FIG. 22D, a pixel electrode 772 is formed. At the same time as the pixel electrode 772, a conductive layer 771 covering the conductive layer 761 can be formed. Note that since the conductive layer 761 serves as a source wiring, the conductive layer 771 is formed over the conductive layer 761, so that the resistance of the source wiring can be reduced.

As in Embodiment 1, an opposite substrate provided with at least one of a light-shielding layer, a colored layer and an opposite electrode is attached to the substrate 700 by a sealing material. The space surrounded by the substrate 700, the opposite substrate and the sealing material is filled with a liquid crystal material. In this manner, a liquid crystal display device can be manufactured.

In accordance with the present invention, components such as a semiconductor layer, a wiring and the like which constitute a display device can be formed to have desired shapes. In this embodiment, without using a photolithography process, separate semiconductor layers can be formed and a light-shielding layer to prevent external light from entering the semiconductor layers can also be formed. In other words, without a complex photolithography process, a liquid crystal display device can be manufactured by a simplified process, and thus the loss of materials can be suppressed and reduction of cost can be achieved. The peeling layer can be selectively irradiated with a laser beam to form a mask and a thin film can be processed by using the mask. Thus, by controlling the size of the baser beam in forming the mask, the mask can be processed into a minute shape. Therefore, the options for shapes of a thin film to be processed can be increased. Accordingly, a high-definition liquid crystal display device can be manufactured with high yield.

Embodiment 3

Figure 29A:
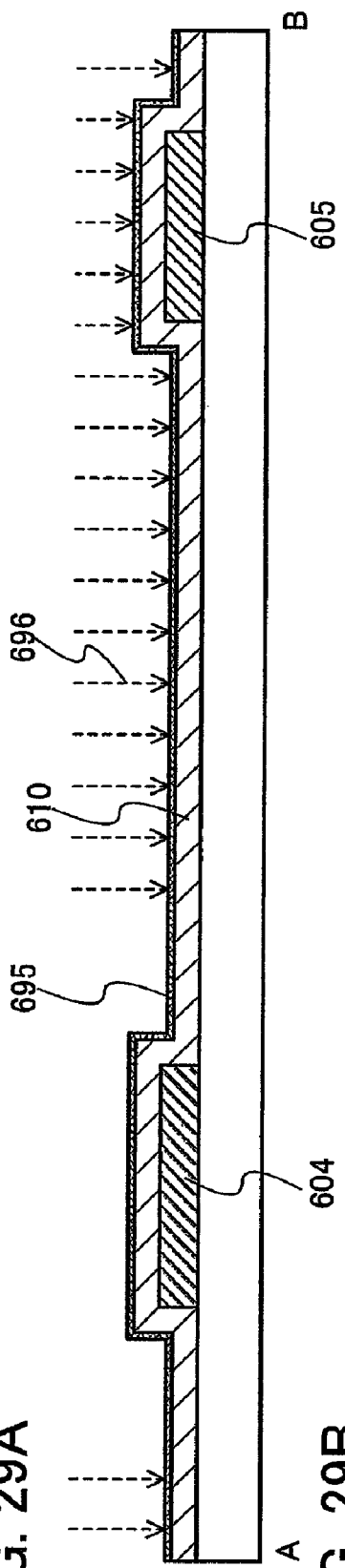
FIGS. 29A to 29C are cross-sectional views illustrating a manufacturing method of a semiconductor device according to an aspect of the present invention.
Figure 29B:
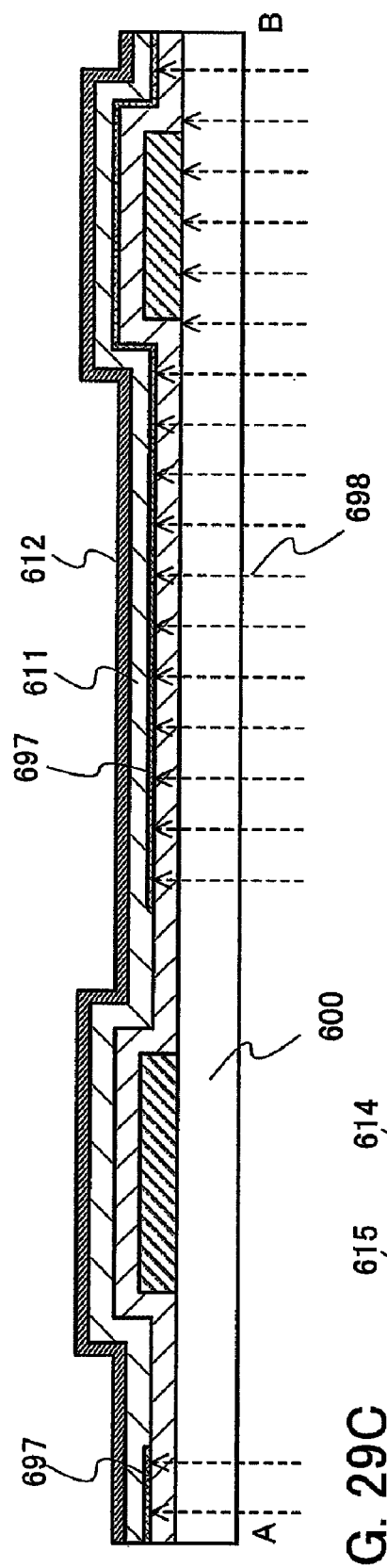

A formation method of a semiconductor layer which can be applied to Embodiment 1 is described with reference to FIGS. 29A to 29C.

Through similar steps similar to those of Embodiment 1, conductive layers 604, 605 are formed as illustrated in FIG. 21C. Then, the insulating layer 610 serving as a gate insulating layer is formed over the conductive layers 604, 605 as in Embodiment 1. A peeling layer 695 is formed over the insulating layer 610. As the peeling layer 695, the peeling layer 103 described in Embodiment Mode 1 can be used as appropriate. At this time, as the peeling layer 695, a molybdenum oxide layer having a thickness of 1 to 10 nm is formed by a reactive sputtering method in which a tungsten target is sputtered by oxygen plasma.

Then, the peeling layer 695 is selectively irradiated with a laser beam 696. At this time, a region except for a region in which separate semiconductor layers are formed later is irradiated with the laser beam 696.

As the laser beam 696, an excimer laser beam (wavelength 308 nm) is adopted.

As a result, the adhesiveness of the peeling layer 695 which is irradiated with the laser beam is reduced. The peeling layer with reduced adhesiveness is washed by water to form a peeling layer 697 serving as a mask as illustrated in FIG. 29B.

Then, the semiconductor layer 611 and the n-type semiconductor layer 612 are formed over the peeling layer 697 serving as a mask and an exposed portion of the insulating layer 610.

Then, the peeling layer 697 serving as a mask is irradiated with a laser beam 698 from the substrate 600 side. In FIG. 29B, the peeling layer 697 is selectively irradiated with the laser beam 698, but not limited to this example. For example, the peeling layer 697 may be irradiated with a laser beam having a wavelength which is not absorbed by the semiconductor layer 611 and the n-type semiconductor layer 612 but is selectively absorbed by the peeling layer 697, from the substrate 600 side as the laser beam 698. In this case, the peeling layer 697 absorbs the laser beam. As a result, the adhesiveness of the peeling layer 697 is reduced. Then, an adhesive member is attached to the surface of the n-type semiconductor layer 612 by pressing, so that the peeling layer 697 with reduced adhesiveness, the semiconductor layer and the n-type semiconductor layer are removed by using the adhesive member.

Figure 29C:
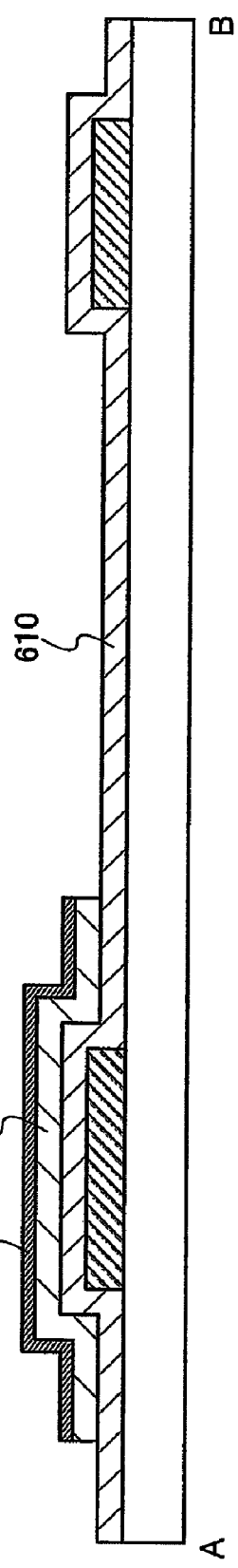

In this manner, as illustrated in FIG. 29C, the separate semiconductor layer 614 and n-type semiconductor layer 615 can be formed.

After this, a thin film transistor can be formed in a similar process of Embodiment 1.

Embodiment 4

Figure 24A:
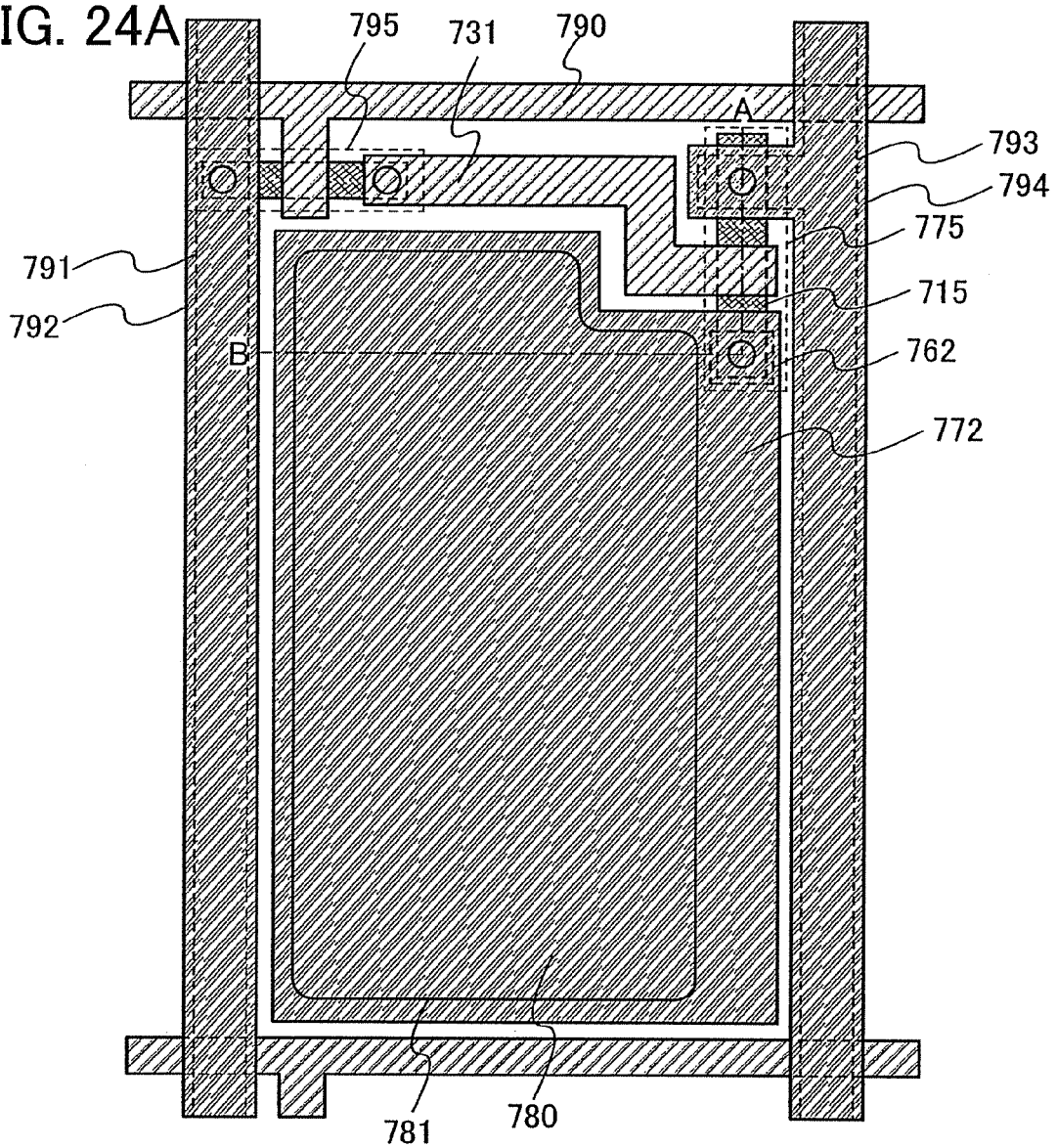
FIGS. 24A and 24B are a top view and a cross-sectional view illustrating a semiconductor device according to an aspect of the present invention.
Figure 24B:
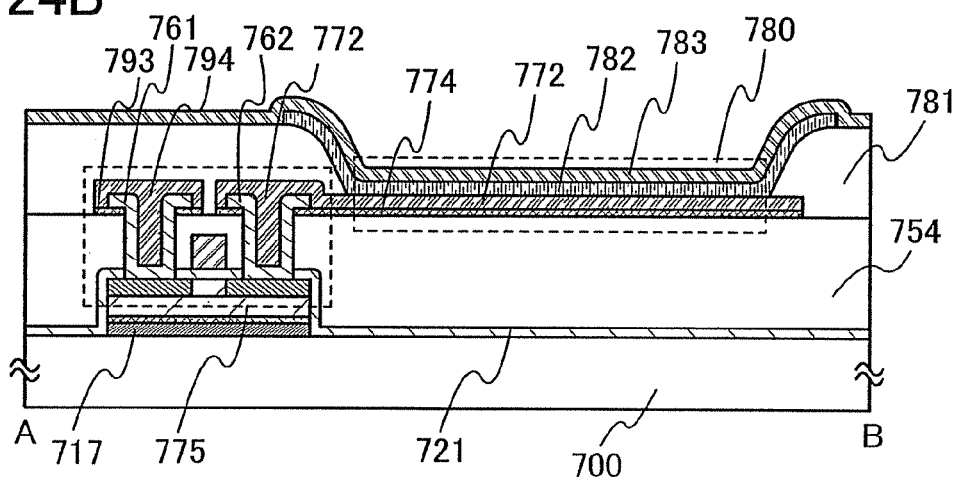

Embodiment 4 will describe one mode of a light-emitting device including a thin film transistor and a pixel electrode formed by a thin film process described in the above embodiment modes, with reference to FIGS. 24A and 24B. FIG. 24A is a top view illustrating one pixel in a pixel portion of a light-emitting device, and FIG. 24B is a cross-sectional view taken along the line A-B in FIG. 24A.

In the pixel portion of the light-emitting device, a plurality of pixels illustrated in FIG. 24A are provided. In each pixel, a light-emitting element 780 and a thin film transistor which is connected to the light-emitting element 780 and controls current supply (hereinafter, referred to as a driving thin film transistor 775) are provided. One of source and drain regions of the driving thin film transistor 775 is connected to power supply lines 793, 794 and the other is connected to a first electrode 772. In addition, a gate electrode of the driving thin film transistor 775 is connected to one of source and drain regions of a switching thin film transistor 795. The other of the source and drain regions of the switching thin film transistor 795 is connected to source wirings 791, 792. A gate wiring 790 of the switching thin film transistor 795 intersects with the source wirings 791, 792. The source wirings 791, 792 form a stacked structure, and the power supply lines 793, 794 also forms a stacked structure. The source wiring 792 and the power supply line 794 are formed from the same layer as the first electrode 772.

In FIG. 24B, the driving thin film transistor 775 is provided to drive the light-emitting element 780. The driving thin film transistor 775 can be formed by a process described in Embodiment 2. The driving thin film transistor 775 includes the conductive layer 717 which functions as a light-shielding layer, between the substrate 700 and the semiconductor layer. When the light-emitting element emits light toward the substrate 700, external light enters the semiconductor layer of the driving thin film transistor 775 from the substrate 700 side, and carriers are produced in the semiconductor layer, which may lead to occurrence of off current when the thin film transistor 775 is turned off. However, the conductive layer 717 functioning as a light-shielding layer is provided between the semiconductor layer and the substrate 700, defective operation of the thin film transistor due to external line can be prevented.

The light-emitting element 708 includes an electroluminescent (EL) layer 782 between the first electrode 772 and a second electrode 783. The light-emitting element 780 is separated from an adjacent light-emitting element by a partition layer 781.

Further, the thin film transistor 775 illustrated in FIG. 24B is a top gate type in which a gate electrode is provided on an opposite side of the substrate with a semiconductor layer as a center. However, the structure of the thin film transistor 775 is not particularly limited, for example, a bottom gate type may also be used. In a case of a bottom gate type, a structure in which a protective film is formed over the semiconductor layer which forms a channel (a channel protected type) may be used, or a structure in which a part of a semiconductor layer which forms a channel is concave (a channel etched type) as in Embodiment 1 may also be used.

An edge portion of the partition layer 781 preferably has a shape in which the radius of curvature is continuously changed. The partition layer 781 is formed using siloxane, acrylic, polyimide, silicon oxide or the like. Further, the partition layer 781 may be formed using one or both of an inorganic material and an organic material.

In FIG. 24B, only the insulating layer 754 is formed between the thin film transistor 775 and the light-emitting element 780; however, a second insulating layer may be provided in addition to the insulating layer 754. The second insulating layer may have a multilayer structure or a single layer structure, similar to the insulating layer 754. As the second insulating layer, a similar material to the insulating layer 754 can be formed. The second insulating layer may be formed using both an inorganic insulating layer and an organic insulating layer, or one of an inorganic insulating layer and an organic insulating layer.

When both the first electrode 772 and the second electrode 783 have light-transmitting properties in the light-emitting element 780, light emission can be extracted through both the first electrode 772 and the second electrode 783. When only the second electrode 783 is formed using a light-transmitting material, light emission can be extracted through only the second electrode 783. In this case, it is preferable to form the first electrode 772 using a highly reflective material or provide a film formed using a highly reflective material (reflective film) below the first electrode 772. When only the first electrode 772 is formed using a light-transmitting material, light emission can be extracted through only the first electrode 772. In this case, it is preferable to form the second electrode 783 using a highly reflective material or provide a reflective film above the second electrode 783.

In the light-emitting element 780, the EL layer 782 may have such a stacked structure as to operate the light-emitting element 780 when a voltage is applied so that a potential of the second electrode 783 becomes higher than that of the first electrode 772, or the EL layer 782 may have such a stacked structure as to operate the light-emitting element 780 when a voltage is applied so that a potential of the second electrode 783 becomes lower than that of the first electrode 772. It is preferable that in the former case, the thin film transistor 775 is an n-channel thin film transistor, and in the latter case, the thin film transistor 775 is a p-channel thin film transistor.

In addition, the conductive layer 771 and the first electrode 772 are formed in a similar manner to those of Embodiment 2, and thus the peeling layers 773, 774 are left between the conductive layer 771, the first electrode 772 and the insulating layer 754.

Here, a structure of the light-emitting element 780 is described with reference to FIGS. 25A to 25D.

Figure 25A:
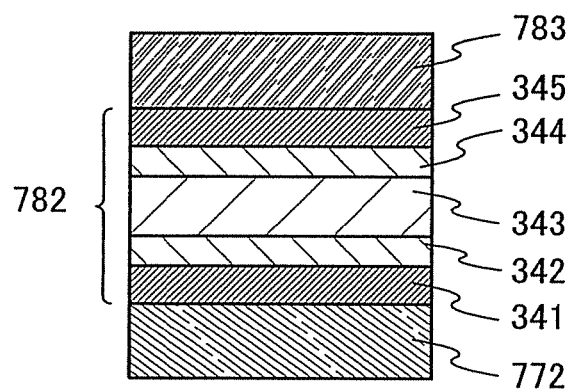
FIGS. 25A to 25D illustrate cross-sectional structures of light-emitting elements which can be applied to the present invention.

When a layer which uses an organic compound and which has a function of emitting light (hereinafter, this layer is referred to as a light-emitting layer 343) is used for the EL layer 782, the light-emitting element 780 functions as an organic EL (Electro Luminescence) element. FIG. 25A illustrates a structure of an organic EL element.

As the first electrode 772, IWO, IWZO, ITiO, ITTiO, ITO, IZO, ITSO or the like can be used. In addition, titanium (Ti), gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride, tungsten nitride, or molybdenum nitride) or the like can be used.

The EL layer 782 may be structured as a single layer, or a stacked layer in which a plurality of layers are stacked. In other words, there are no particular limitations on a structure of the EL layer, and a layer formed of a substance with a high electron-transporting property, a substance with a high hole-transporting property, a substance with a high electron-injecting property, a substance with a high hole-injecting property, a bipolar substance (a substance with high electron-transporting and hole-transporting properties), or the like may be as appropriate combined with the light-emitting layer. For example, a hole-injecting layer, a hole-transporting layer, a hole-blocking layer, a light-emitting layer, an electron-transporting layer, an electron-injecting layer, and/or the like may as appropriate be combined. Specific materials to form each layer will be given below. Note that, as one mode, the EL layer where a first layer 341, a second layer 342, a light-emitting layer 343, a fourth layer 344, and a fifth layer 345 are stacked is explained with reference to FIG. 16.

A first layer 341 is a layer that contains a substance with a high hole-injecting property. As the substance with a high hole-injecting property, molybdenum oxide, vanadium oxide, ruthenium oxide, tungsten oxide, manganese oxide, or the like can be used. In addition, it is also possible to use a phthalocyanine-based compound such as phthalocyanine ($H_2Pc$) or copper phthalocyanine (CuPc), a high molecule compound such as poly(3,4-ethylenedioxythiophene)/poly(styrenesulfonate) (PEDOT/PSS), or the like to form the hole-injecting layer.

Alternatively, as the first layer 341, a composite material of a substance with a high hole-transporting property containing an acceptor substance can be used. Note that, by using the substance with a high hole-transporting property containing an acceptor substance, a material used to form an electrode may be selected regardless of its work function. In other words, in addition to a material with a high work function, a material with a low work function may also be used as the first electrode 772. As the acceptor substance, 7,7,8,8-tetracyano-2,3,5,6-tetrafluoroquinodimethane (abbreviation: $F_4$-TCNQ), chloranil, or the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because their electron-accepting property is high. Among these, molybdenum oxide is especially preferable because it is stable in the air and its hygroscopic property is low so that it can be easily treated.

The second layer 342 is a layer that contains a substance with a high hole-transporting property. As the substance with a high hole-transporting property, for example, an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB) can be used. These materials are mainly materials each having a hole mobility greater than or equal to $1 \times 10^{-6}$ cm$^2$/Vs. However, other materials than these may also be used as long as the hole-transporting properties thereof are higher than the electron-transporting properties. The layer containing a substance with a high hole-transporting property is not limited to a single layer, and two or more layers containing the above materials may also be stacked.

The light-emitting layer 343 is a layer that contains a substance with a high light-emitting property, and can be made of various kinds of materials. For example, a substance with a high light-emitting property is freely combined with a substance with a high carrier-transporting property and favorable film quality (that is, a substance difficult to be crystallized), such as tris(8-quinolinolato)aluminum (abbreviation: Alq), 2-tert-butyl-9,10-di(2-naphthyl)anthracene (abbreviation: t-BuDNA), or 4,4'-bis[N-(1-naphthyl)-N-phenylamino]biphenyl (abbreviation: NPB). Specifically, the substance with a high light-emitting property may be a singlet light emitting material (fluorescent material) such as N,N'-dimethylquinacridone (abbreviation: DMQd), N,N'-diphenylquinacridone (abbreviation: DPQd), coumarin 6, 4-(dicyanomethylene)-2-methyl-6-(p-dimethylaminostyryl)-4H-pyran (abbreviation: DCM1), 4-(dicyanomethylene)-2-methyl-6-[2-(julolidin-9-yl)vinyl]-4H-pyran (abbreviation: DCM2), 9,10-diphenylanthracene, 5,12-diphenyltetracene (abbreviation: DPT), perylene, or rubrene, or a triplet light emitting material (phosphorescent material) such as bis[2-(2'-benzo[4,5-a]thienyl)pyridinato-N,C$^{3'}$]iridium(acetylacetonate) (abbreviation: Ir(btp)$_2$(acac)). However, since Alq and DNA are materials with high light emitting properties, the light-emitting layer 343 may be formed of only one of these materials.

The fourth layer 344 is a layer that contains a substance with a high electron-transporting property. For example, a layer containing a metal complex having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum(III) (abbreviation: BAlq) can be used. Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances described here are mainly substances having an electron mobility greater than or equal to $1 \times 10^{-6}$ cm$^2$/Vs. The electron-transporting layer may be formed of other substances than those described above as long as the substances have higher electron-transporting properties than hole-transporting properties. Moreover, the electron-transporting layer is not limited to a single layer, and two or more layers formed of the substances described above may be stacked.

The fifth layer 345 is a layer that contains a substance with a high electron-injecting property. As the fifth layer 345, an alkali metal, an alkaline earth metal, or a compound thereof such as lithium fluoride, cesium fluoride, or calcium fluoride can be used. For example, a layer formed of a substance having an electron-transporting property containing an alkali metal, an alkaline earth metal, or a compound thereof, e.g., a layer formed of Alq containing magnesium (Mg), can be used. With the use of a layer formed of a substance having an electron-transporting property containing an alkali metal or an alkaline earth metal as the electron-injecting layer, electron injection from the second electrode 783 is performed efficiently, which is preferable.

As a substance for forming the second electrode 783, a metal, an alloy, a conductive compound, a mixture thereof, each of which has a low work function (specifically, less than or equal to 3.8 eV), or the like can be used. As a specific example, an element that belongs to Group 1 or Group 2 of the periodic table, that is, an alkali metal such as lithium (Li) or cesium (Cs), an alkaline earth metal such as magnesium (Mg), calcium (Ca), or strontium (Sr), an alloy containing these (such as an MgAg alloy or an AlLi alloy), a rare-earth metal such as europium (Eu) or ytterbium (Yb), an alloy containing these, and the like can be given. However, the fifth layer 345 is provided between the second electrode 783 and the fourth layer 344, and thereby, regardless of the degree of the work function, various conductive materials such as Al, Ag, ITO, ITSO, IZO, or IWZO can be used as the second electrode 783.

As the method for forming the EL layer 782, various methods can be employed regardless of a wet method or a dry method. For example, a vacuum evaporation method, an ink-jet method, a spin-coating method, or the like may be used. In addition, each electrode or each layer may also be formed by a different film formation method.

The light-emitting element of the present invention which has the above-described structure emits light when current flows due to the potential difference generated between the first electrode 772 and the second electrode 783, and holes and electrons are recombined in the light-emitting layer 343 that contains a substance with a high light-emitting property. In other words, a light-emitting region is formed in the light-emitting layer 343.

Light is extracted outside through one or both the first electrode 772 and the second electrode 783. Note that, since the first electrode 772 is formed using a composite material having a high light-transmitting property, a structure in which light is extracted outside through the first electrode is preferably adopted. In a case where only the first electrode 772 has a light-transmitting property, the light is extracted from a substrate side through the first electrode 772. Alternatively, in a case where each of the first electrode 772 and the second electrode 783 has a light-transmitting property, light is extracted from both the substrate side and the side opposite to the substrate through the first electrode 772 and the second electrode 783.

A structure of layers provided between the first electrode 772 and the second electrode 783 is not limited to the above structure. A structure other than the above may also be employed as long as the light-emitting region, in which holes and electrons are recombined, is provided apart from the first electrode 772 and the second electrode 783 so as to prevent quenching of light caused by the light-emitting region and metal coming close to each other.

In other words, there are no particular limitations on a stacked structure of the EL layer 782, and a layer formed of a substance having a high electron-transporting property, a substance having a high hole-transporting property, a substance having a high electron-injecting property, a substance having a high hole-injecting property, a bipolar substance (a substance having a high electron-transporting property and a high hole-transporting property), a hole blocking material, or the like may freely be combined with a light-emitting layer.

When a layer using an inorganic compound and functioning to emit light (hereinafter referred to as a light-emitting layer 349) is formed in the EL layer 782, the light-emitting element 1205 functions as an inorganic EL element. Inorganic EL elements are classified according to their element structures into a dispersed inorganic EL element and a thin-film inorganic EL element. They are different in that the former includes a layer including a light-emitting substance, in which particles of a light-emitting material are dispersed in a binder and the latter includes a layer including a light-emitting substance, which is formed of a thin film of a light-emitting material; however, they are common in that they require electrons accelerated by a high electric field. Note that a mechanism for obtainable light emission includes a donor-acceptor recombination light emission which utilizes a donor level and an acceptor level and a localized light emission which utilizes inner-shell electron transition of metal ions. In general, the dispersed inorganic EL element often performs the donor-acceptor recombination light emission and the thin-film inorganic EL element often performs the localized light emission. A structure of an inorganic EL element is described below.

A light-emitting material which can be used in this embodiment includes a base material and an impurity element serving as a light-emitting center. Light emission of various colors can be obtained by changing impurity elements to be contained. As a method for producing a light-emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a combined method of one of these methods and high-temperature baking, or a freeze-drying method can be used.

The solid phase method is a method by which a base material and an impurity element or a compound containing an impurity element are weighed, mixed in a mortar, and reacted by heating and baking in an electric furnace to make the impurity element contained in the base material. The baking temperature is preferably in the range of 700 to 1500° C. This is because solid phase reaction does not proceed when the temperature is too low and the base material is decomposed when the temperature is too high. Note that the baking may be performed in powder form, but the baking is preferably performed in pellet form. The method requires baking at a relatively high temperature; however, it is a simple method. Therefore, the method provides high productivity and is suitable for mass production.

The liquid phase method (coprecipitation method) is a method by which a base material or a compound containing a base material is reacted in a solution with an impurity element or a compound containing an impurity element and the reactant is baked after being dried. Particles of the light-emitting material are uniformly distributed, a particle size is small, and the reaction proceeds even at a low baking temperature.

As the base material used for a light-emitting material of an inorganic EL element, a sulfide, an oxide, or a nitride can be used. As a sulfide, zinc sulfide, cadmium sulfide, calcium sulfide, yttrium sulfide, gallium sulfide, strontium sulfide, barium sulfide, or the like can be used, for example. As an oxide, zinc oxide, yttrium oxide, or the like can be used, for example. As a nitride, aluminum nitride, gallium nitride, indium nitride, or the like can be used, for example. Further, zinc selenide, zinc telluride, or the like can also be used. It may be a ternary mixed crystal such as calcium gallium sulfide, strontium gallium sulfide, or barium gallium sulfide.

As the light-emitting center of localized light emission, manganese (Mn), copper (Cu), samarium (Sm), terbium (Th), erbium (Er), thulium (Tm), europium (Eu), cerium (Ce), praseodymium (Pr), or the like can be used. Note that a halogen element such as fluorine (F) or chlorine (Cl) may be added as a charge compensation.

On the other hand, as the light-emitting center of donor-acceptor recombination light emission, a light-emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In a case of synthesizing the light-emitting material of donor-acceptor recombination light emission by a solid phase method, a base material, a first impurity element or a compound containing a first impurity element, and a second impurity element or a compound containing a second impurity element are separately weighed, mixed in a mortar, and then heated and baked in an electric furnace. As the base material, the above-mentioned base material can be used. As the first impurity element or the compound containing the first impurity element, fluorine (F), chlorine (Cl), aluminum sulfide, or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably in the range of 700 to 1500° C. This is because solid phase reaction does not proceed when the temperature is too low and the base material is decomposed when the temperature is too high. Note that the baking may be performed in powder form, but the baking is preferably performed in pellet form.

As the impurity element in the case of utilizing solid phase reaction, a compound including the first impurity element and the second impurity element may be used. In this case, the impurity element is easily diffused and the solid phase reaction easily proceeds, so that a uniform light-emitting material can be obtained. Furthermore, a high-purity light-emitting material can be obtained because an unnecessary impurity element is not mixed. As the compound including the first impurity element and the second impurity element, copper chloride (CuCl), silver chloride (AgCl), or the like can be used, for example.

Note that the concentration of the impurity element to the base material may be in the range of 0.01 to 10 atomic %, preferably 0.05 to 5 atomic %.

Figure 25B:
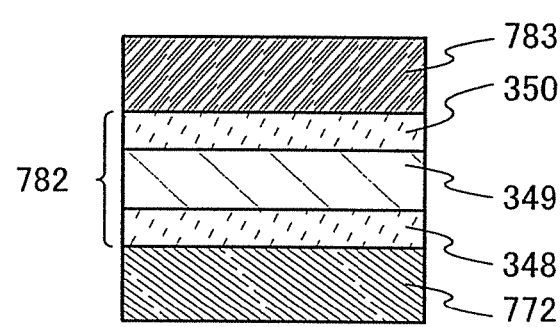

FIG. 25B illustrates a cross section of an inorganic EL element in which the EL layer 782 includes a first insulating layer 348, a light-emitting layer 349, and a second insulating layer 350.

In the case of the thin-film inorganic EL element, the light emitting layer 349 is a layer containing the above-mentioned light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

The first insulating layer 348 and the second insulating layer 350 are not particularly limited, but they preferably have high withstand voltage and dense film quality. Furthermore, the first insulating layer 348 and the second insulating layer 350 preferably have a high dielectric constant. For example, a film of silicon oxide, yttrium oxide, titanium oxide, aluminum oxide, hafnium oxide, tantalum oxide, barium titanate, strontium titanate, lead titanate, silicon nitride, zirconium oxide, or the like, a mixed film thereof, or a stacked film of two or more kinds can be used. The first insulating layer 348 and the second insulating layer 350 can be formed by sputtering, evaporation, CVD, or the like. Although the thickness is not particularly limited, it is preferably in the range of 10 to 1000 nm. Note that the light-emitting element of this embodiment does not necessarily require hot electrons; therefore, it can be formed into a thin film and has an advantage of reduction in drive voltage. The light-emitting element preferably has a thickness of 500 nm or less, more preferably, 100 nm or less.

Although not illustrated, a buffer layer may be provided between the light-emitting layer 349 and the insulating layers 348, 350 or between the light-emitting layer 349 and the first electrode 772. This buffer layer facilitates carrier injection and functions to suppress mixture of both layers. Although a material of the buffer layer is not particularly limited, zinc sulfide, selenium sulfide, tellurium sulfide, cadmium sulfide, strontium sulfide, barium sulfide, copper sulfide, lithium fluoride, calcium fluoride, barium fluoride, magnesium fluoride, or the like which can be a base material of the light-emitting layer, can be used.

Figure 25C:
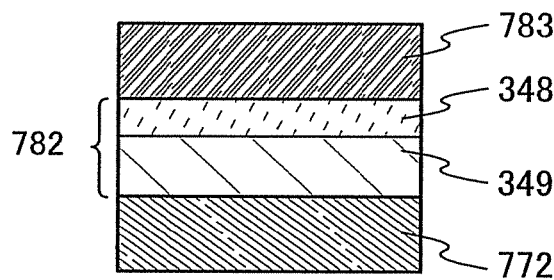

Furthermore, as illustrated in FIG. 25C, the EL layer 782 may include the light-emitting layer 349 and the first insulating layer 348. In this case, FIG. 25C illustrates a mode in which the first insulating layer 348 is provided between the second electrode 783 and the light-emitting layer 349. Note that the first insulating layer 348 may be provided between the first electrode 772 and the light-emitting layer 349.

Moreover, the EL layer 782 may include only the light-emitting layer 349. That is, the light-emitting element 1205 may be formed with the first electrode 772, the EL layer 782, and the second electrode 783.

In the case of the dispersed inorganic EL element, a particulate light-emitting material is dispersed in a binder to form a film-like layer including a light-emitting substance. In a case where particles each having a desired size cannot be sufficiently obtained by a production method of a light-emitting material, the material may be processed into particles by crushing in a mortar or the like. The binder is a substance to fix a particulate light-emitting material in a dispersed manner and holding the material in shape as the layer including a light-emitting substance. The light-emitting material is uniformly dispersed and fixed in the layer including a light-emitting substance by the binder.

In the case of the dispersed inorganic EL element, the layer including a light-emitting substance can be formed by a droplet discharge method which can selectively form the layer including a light-emitting substance, a printing method (such as screen printing or off-set printing), a coating method such as a spin-coating method, a dipping method, a dispenser method, or the like. The thickness is not particularly limited, but it is preferably in the range of 10 to 1000 nm. In addition, in the layer including a light-emitting substance, which contains the light-emitting material and the binder, the proportion of the light-emitting material is preferably in the range of 50 to 80 wt %.

Figure 25D:
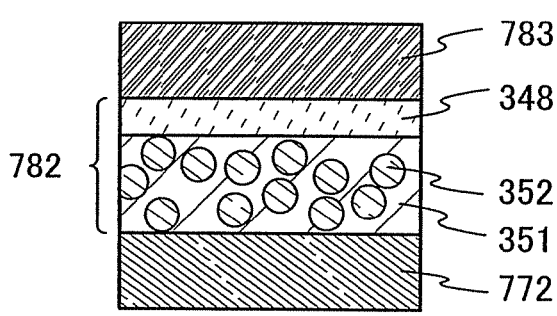

An element in FIG. 25D includes the first electrode 772, the EL layer 782, and the second electrode 783, and the EL layer 782 is formed with a light-emitting layer in which a light-emitting material 352 is dispersed in a binder 351, and an insulating layer 348. Note that in the structure illustrated in FIG. 25D, the insulating layer 348 is in contact with the second electrode 783. However, the insulating layer 348 may be in contact with the first electrode 772. Alternatively, the element may include respective insulating layers in contact with the first electrode 772 and the second electrode 783. Alternatively, the element does not necessarily include an insulating layer in contact with the first electrode 772 or the second electrode 783.

As the binder which can be used in this embodiment, an insulating material such as an organic material or an inorganic material, or a mixed material of an organic material and an inorganic material can be used. As an organic material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant high-molecular compound such as aromatic polyamide or polybenzimidazole, or a siloxane resin may be used. Note that the siloxane resin corresponds to a resin including a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin like polyvinyl alcohol or polyvinylbutyral, a phenol resin, a novolac resin, an acrylic resin, a melamine resin, a urethane resin, or an oxazole resin (polybenzoxazole) may be used. A photocurable resin or the like can also be used. A dielectric constant can be adjusted by appropriately mixing high dielectric constant fine particles of barium titanate ($BaTiO_3$), strontium titanate ($SrTiO_3$), or the like in the above resin.

As an inorganic material included in the binder, a material selected from substances containing inorganic materials can be used, such as silicon oxide, silicon nitride, silicon containing oxygen and nitrogen, aluminum nitride, aluminum containing oxygen and nitrogen, aluminum oxide, titanium oxide, titanium barium, titanium strontium, lead titanate, potassium niobate, lead niobate, tantalum oxide, barium tantalate, lithium tantalate, yttrium oxide, zirconium oxide, or zinc sulfide or another inorganic substance. A dielectric constant of the layer including a light-emitting substance, which includes the light-emitting material and the binder, can be controlled by making an organic material contain a high dielectric constant inorganic material (by addition or the like), so that a dielectric constant can be increased.

In a producing process, a light-emitting material is dispersed in a solution including a binder. As a solvent of the solution including the binder that can be used in this embodiment, a solvent in which a binder material is soluble and which can produce a solution having a viscosity suitable for a method for forming the light-emitting layer (various wet processes) and a desired thickness, may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

The inorganic EL light-emitting element, which can provide light emission by voltage application between a pair of electrodes sandwiching the layer including a light-emitting substance, can be operated by either DC drive or AC drive.

Here, an organic EL element is formed as the light-emitting element. As for a light-emitting element expressing a red color, an ITO layer containing silicon oxide with a thickness of 125 nm is formed as the first electrode 772 which functions as a first pixel electrode. As the EL layer 782, a DNTPD layer with a thickness of 50 nm, a NPB layer with a thickness of 10 nm, a layer of NPB doped with bis[2,3-bis(4-fluorophenyl) quinoquixalinato]iridium(acetylacetonate) (abbr.: $Ir(Fdpq)_2$ (acac)) with a thickness of 30 nm, an $Alq_3$ layer with a thickness of 30 nm, and a LiF layer with a thickness of 1 nm are stacked. As the second electrode 783 which functions as a second pixel electrode, an Al layer with a thickness of 200 nm is formed.

As for a light-emitting element expressing a green color, an ITO layer containing silicon oxide with a thickness of 125 nm is formed as the first electrode 772 which functions as the first pixel electrode. As the EL layer 782, a DNTPD layer with a thickness of 50 nm, a NPB layer with a thickness of 10 nm, a layer of $Alq_3$ doped with coumarin 545T (C545T) with a thickness of 40 nm, an $Alq_3$ layer with a thickness of 30 nm, and a LiF layer with a thickness of 1 nm are stacked. As the second electrode 783 which functions as the second pixel electrode, an Al layer with a thickness of 200 nm is formed.

Further, as for a light-emitting element expressing a blue color, an ITO layer containing silicon oxide with a thickness of 125 nm is formed as the first electrode 772 which functions as the first pixel electrode. As the EL layer 782, a DNTPD layer with a thickness of 50 nm, an NPB layer with a thickness of 10 nm, a layer of 9-[4-(N-carbazolyl)]phenyl-10-phenylanthracene (abbr.: CzPA) doped with 2,5,8,11-tetra(tert-butyl)perylene (abbr.: TBP) with a thickness of 30 nm, an $Alq_3$ layer with a thickness of 30 nm, and a LiF layer with a thickness of 1 nm are stacked. As the second electrode 783 which functions as the second pixel electrode, an Al layer with a thickness of 200 nm is formed.

Next, a protective film is preferably formed over the second electrode 783.

Then, a wiring board, typically an FPC (Flexible Printed Circuit) is attached to a connection terminal portion of scan lines or signal lines with a connection conductive layer interposed therebetween. Through the above steps, a light-emitting display device can be formed.

Note that a protective circuit for prevention of electrostatic discharge damage, typically a diode or the like, may be provided between a connection terminal and a source wiring (gate wiring) or in the pixel portion.

In accordance with the present invention, components such as wirings and the like which constitute a display device can be formed to have desired shapes. In addition, without a complex photolithography process, a light-emitting display device can be manufactured by a simplified process, and thus the loss of materials can be suppressed and reduction of cost can be achieved. A peeling layer can be selectively irradiated with a laser beam to form a mask and a thin film can be processed by using the mask. Thus, by controlling the size of the baser beam in forming the mask, the mask can be processed into a minute shape. Therefore, the options for shapes of a thin film to be processed can be increased. Accordingly, a high-definition light-emitting display device can be manufactured with high yield.

Embodiment 5

Figure 26:
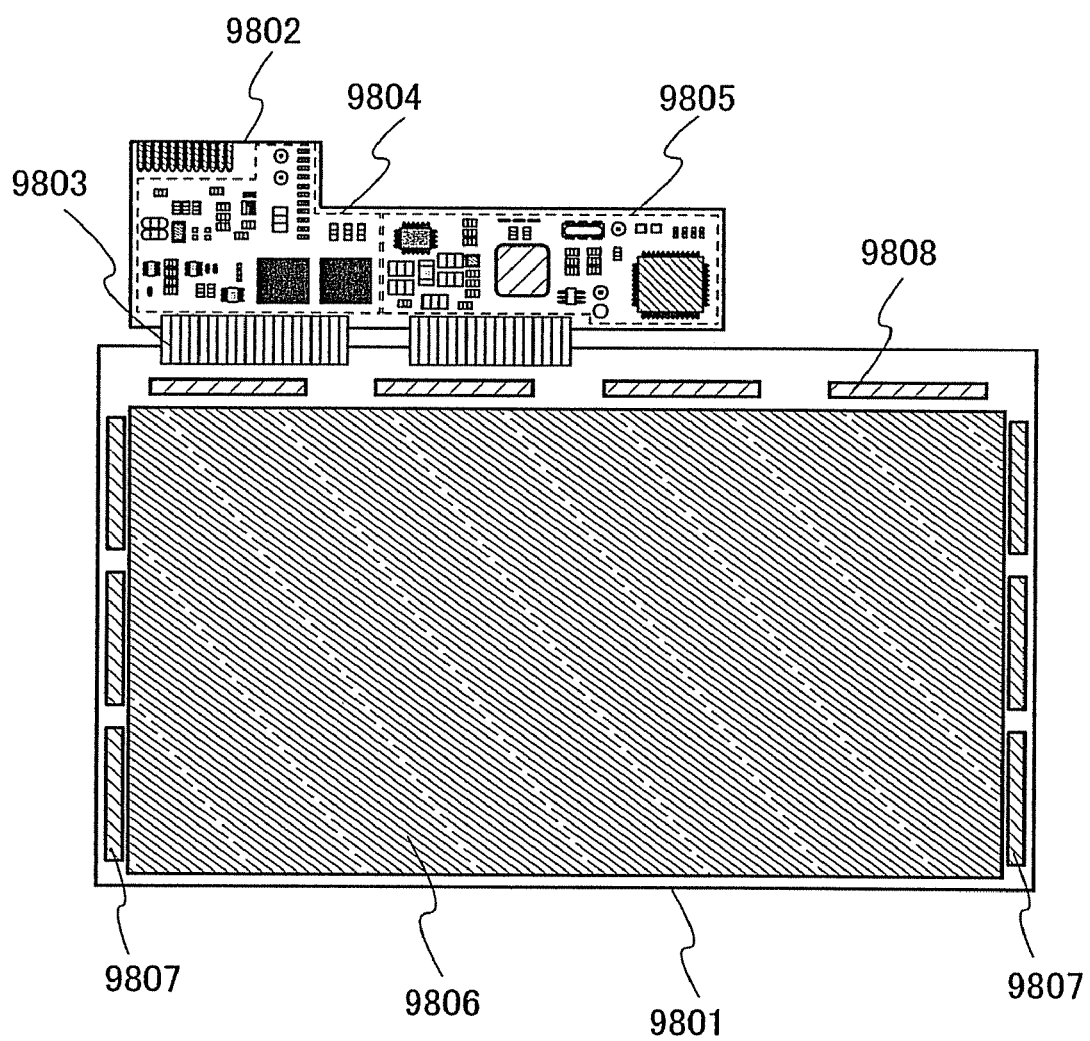
FIG. 26 is a top view illustrating a semiconductor device of the present invention.

Next, a module having the display panel described in the above embodiments is described with reference to FIG. 26. FIG. 26 illustrates a module in which a display panel 9801 and a circuit board 9802 are combined. Over the circuit board 9802, a control circuit 9804, a signal divider circuit 9805, and the like are formed, for example. In addition, the display panel 9801 and the circuit board 9802 are connected to each other by a connection wiring 9803. As the display panel 9801, the liquid-crystal display panel, the light-emitting display panel as described in Embodiments 1 to 4, and further an electrophoretic display panel having an electrophoretic element, and the like can be used as appropriate.

This display panel 9801 includes a pixel portion 9806 in which a light-emitting element is provided in each pixel, a scan line driver circuit 9807, and a signal line driver circuit 9808 which supplies a video signal to a selected pixel. The structure of the pixel portion 9806 is similar to those in Embodiments 1 to 3. The scan line driver circuit 9807 and the signal driver circuit 9808 formed as IC chips are mounted on a substrate by a mounting method using an anisotropic conductive adhesive or an anisotropic conductive film, a COG method, a wire bonding method, a reflow treatment using a solder bump, or the like.

According to this embodiment, the manufacturing cost of a module including a display panel can reduced.

Embodiment 6

Examples of electronic devices which include the semiconductor device described in any of the above embodiments are as follows: a television device (also referred to as simply a television, or a television receiver), a camera such as a digital camera or a digital video camera, a cellular phone device (also referred to as simply a cellular phone or a cell phone), a portable information terminal such as a PDA, a portable game machine, a computer monitor, a computer, an audio reproducing device such as a car audio component, an image reproducing device including a recording medium such as a home-use game machine, and the like. Specific examples of such electronic devices are described with reference to FIGS. 27A to 27F.

Figure 27A:
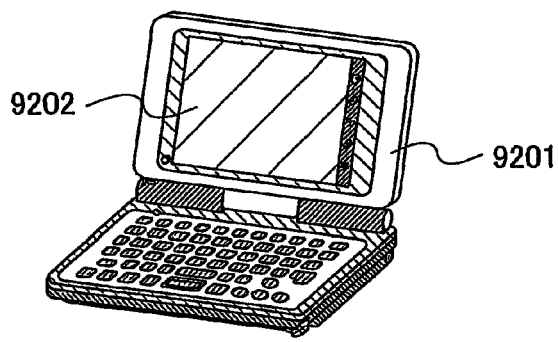
FIGS. 27A to 27F are perspective views of electronic devices using semiconductor devices according to an aspect of the present invention.

A portable information terminal illustrated in FIG. 27A includes a main body 9201, a display portion 9202, and the like. A portable information terminal can be manufactured at low cost by applying any of the above embodiments to the display portion 9202.

Figure 27B:
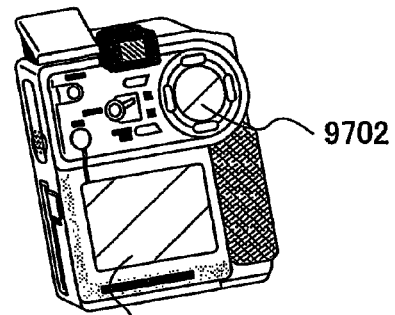

A digital video camera illustrated in FIG. 27B includes a display portion 9701, a display portion 9702, and the like. A digital video camera can be manufactured at low cost by applying any of the above embodiments to the display portion 9701.

Figure 27C:
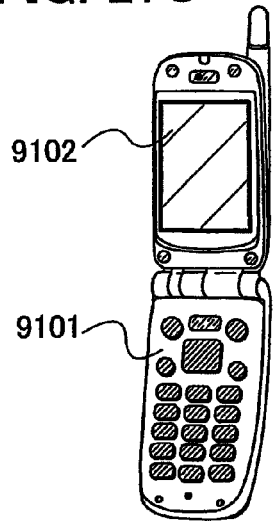

A portable terminal illustrated in FIG. 27C includes a main body 9101, a display portion 9102, and the like. A portable terminal can easily be manufactured at low cost by applying any of the above embodiments to the display portion 9102.

Figure 27D:
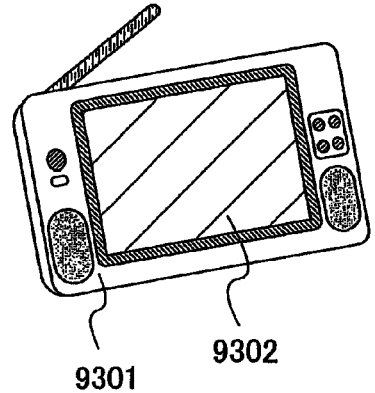

A portable television device illustrated in FIG. 27D includes a main body 9301, a display portion 9302, and the like. A portable television device can be manufactured at low cost by applying any of the above embodiments to the display portion 9302. Such a television device can be applied to a wide range of television devices ranging from a small television device mounted on a portable terminal such as a cellular phone, a medium television device which is portable, to a large (for example, 40-inch or larger) television device.

Figure 27E:
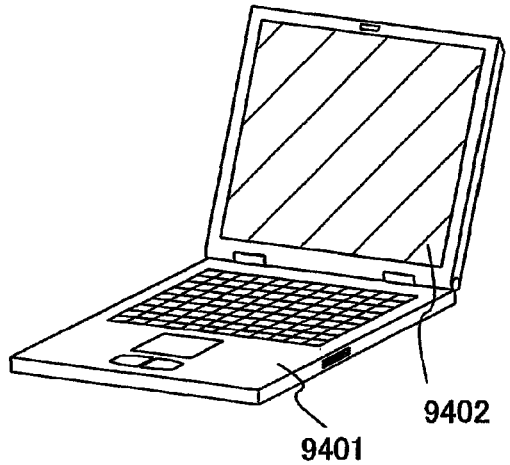

A portable computer illustrated in FIG. 27E includes a main body 9401, a display portion 9402, and the like. A portable computer can be manufactured at low cost by applying any of the above embodiments to the display portion 9402.

Figure 27F:
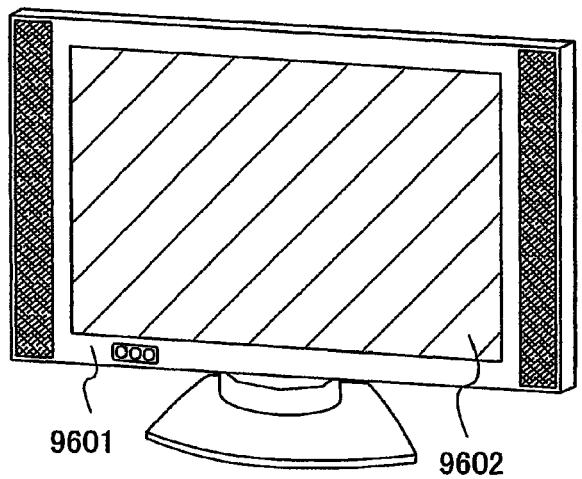

A television device illustrated in FIG. 27F includes a main body 9601, a display portion 9602, and the like. A television device can be manufactured at low cost by applying any of the above embodiments to the display portion 9602.

Here, the structure of the television device is described with reference to FIG. 28.

Figure 28:
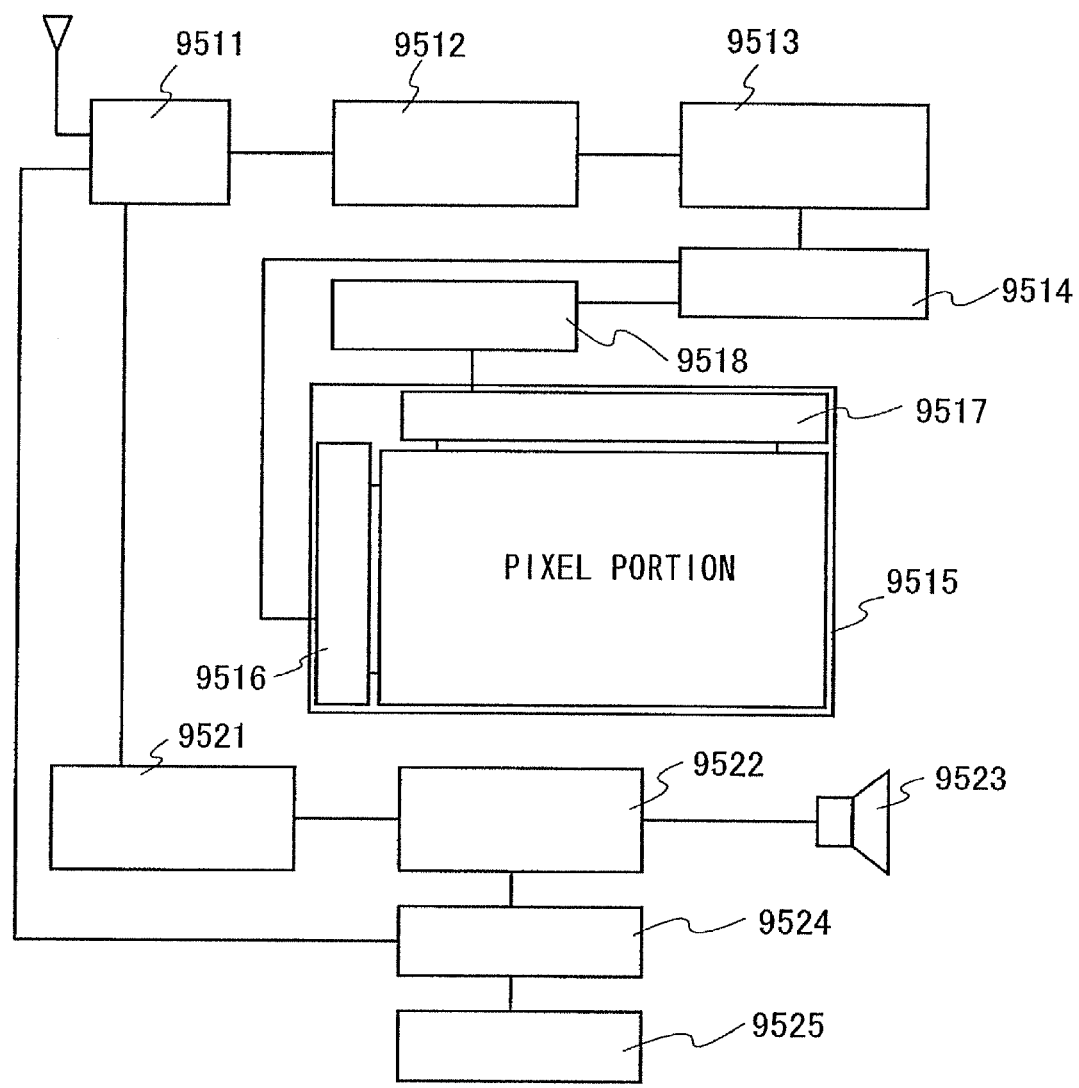
FIG. 28 illustrates an electronic device using a semiconductor device according to an aspect of the present invention.

FIG. 28 is a block diagram which illustrates main components of the television device. A tuner 9511 receives video signals and audio signals. The video signals are processed by a video signal detection circuit 9512, a video signal processing circuit 9513 that converts signals outputted from the video signal detection circuit 9512 into chrominance signals corresponding to each color of red, green, and blue, and a control circuit 9514 that converts the video signals into input specifications of a driver IC. The control circuit 9514 outputs signals to both a scan line driver circuit 9516 and a signal line driver circuit 9517 of a display panel 9515. In the case of digital driving, a signal divider circuit 9518 may be provided on the signal line side to divide an input digital signal into m pieces and supply the divided signals.

Among the signals received by the tuner 9511, the audio signals are transmitted to an audio signal detection circuit 9521, and the output thereof is supplied to a speaker 9523 through an audio signal processing circuit 9522. A control circuit 9524 receives control information on a receiving station (a receiving frequency) or sound volume from an input portion 9525 and transmits the signal to the tuner 9511 or the audio signal processing circuit 9522.

Since this television device includes the display panel 9515, it can achieve a reduction in its power consumption.

Note that the present invention is not limited to a television receiver and is also applicable to various applications such as a monitor of a personal computer, and a display medium having a large area like an information display board at a train station, an airport, or the like, or an advertisement display board on the street.

This application is based on Japanese Patent Application serial no. 2006-282684 filed in Japan Patent Office on Oct. 17, 2006, the entire contents of which are hereby incorporated by reference.

What is claimed is:

1. A method of manufacturing a semiconductor device comprising:
   forming a first layer over a substrate;
   forming a peeling layer over the first layer;
   selectively irradiating the peeling layer with a laser beam so that an adhesiveness of the peeling layer is reduced;
   removing a part of the peeling layer irradiated with the laser beam to expose a part of the first layer; and
   etching the exposed part of the first layer to form a second layer,
   wherein the laser beam has a wavelength which is absorbed by the peeling layer, and which transmits the substrate and the first layer; and
   wherein the peeling layer is irradiated with the laser beam from the substrate side.

2. A method of manufacturing a semiconductor device according to claim 1, wherein the laser beam has a wavelength which is absorbed by at least the peeling layer, and the peeling layer is irradiated with the laser beam from a surface side of the peeling layer.

3. A method of manufacturing a semiconductor device according to claim 1 further comprising forming a light-transmitting layer over the peeling layer,
   wherein a part of the light-transmitting layer in contact with the part of the peeling layer is removed.

4. A method of manufacturing a semiconductor device according to claim 3, wherein the laser beam has a wavelength which is absorbed by at least the peeling layer, and the peeling layer is irradiated with the laser beam from the light-transmitting layer side.

5. A method of manufacturing a semiconductor device comprising:
   forming a first peeling layer over a substrate;
   selectively irradiating a part of the first peeling layer with a first laser beam so that an adhesiveness of the part of the first peeling layer is reduced;
   removing the part of the first peeling layer irradiated with the first laser beam to form a second peeling layer;
   forming a first layer over the second peeling layer and the substrate;
   irradiating the second peeling layer with a second laser beam so that an adhesiveness of the second peeling layer is reduced;
   removing the second peeling layer irradiated with the second laser beam, and the first layer in contact with the second peeling layer to form a second layer.

6. A method of manufacturing a semiconductor device according to claim 5, wherein the first laser beam has a wavelength which is absorbed by at least the first peeling layer, and the first peeling layer is irradiated with the first laser beam from a surface side of the first peeling layer.

7. A method of manufacturing a semiconductor device according to claim 5,
   wherein the second laser beam has a wavelength which is absorbed by at least the second peeling layer and which transmits the first layer, and
   wherein the second peeling layer is irradiated with the second laser beam from a surface side of the second peeling layer.

8. A method of manufacturing a semiconductor device according to claim 5, wherein the first laser beam has a wavelength which is absorbed by the first peeling layer and which transmits the substrate, and
   wherein the first peeling layer is irradiated with the first laser beam from the substrate side.

9. A method of manufacturing a semiconductor device according to claim 5, wherein the second laser beam has a wavelength which is absorbed by the second peeling layer and which transmits the substrate,
   wherein the first layer shields the second laser beam,
   wherein the second peeling layer is irradiated with the second laser beam from the substrate side.

10. A method of manufacturing a semiconductor device comprising:
    forming a first peeling layer over a substrate;
    forming a first light-transmitting layer over the first peeling layer;
    selectively irradiating a part of the first peeling layer with a first laser beam so that an adhesiveness of the part of the first peeling layer is reduced;
    removing the part of the first peeling layer irradiated with the first laser beam and a part of the first light-transmitting layer in contact with the part of the first peeling layer to form a second peeling layer and a second light-transmitting layer;
    forming a first layer over the second peeling layer, the second light-transmitting layer and the substrate;

irradiating the second peeling layer with a second laser beam so that an adhesiveness of the second peeling layer is reduced;

removing the second peeling layer irradiated with the second laser beam, the second light-transmitting layer in contact with the second peeling layer, and the first layer in contact with the second light-transmitting layer to form a second layer.

11. A method of manufacturing a semiconductor device according to claim 10, wherein the first laser beam has a wavelength which is absorbed by at least the first peeling layer, and the first peeling layer is irradiated with the first laser beam from a surface side of the first light-transmitting layer.

12. A method of manufacturing a semiconductor device according to claim 10, wherein the second laser beam has a wavelength which is absorbed by at least the second peeling layer, and which transmits the first layer and the second light-transmitting layer, and the second peeling layer is irradiated with the second laser beam from a surface side of the second light-transmitting layer.

13. A method of manufacturing a semiconductor device according to claim 10, wherein the first laser beam has a wavelength which is absorbed by the first peeling layer and which transmits the substrate, and wherein the first peeling layer is irradiated with the first laser beam from the substrate side.

14. A method of manufacturing a semiconductor device according to claim 10, wherein the second laser beam has a wavelength which is absorbed by the second peeling layer and which transmits the substrate, wherein the first layer shields the second laser beam, wherein the second peeling layer is irradiated with the second laser beam from the substrate side.

* * * * *